US009090778B2

(12) United States Patent
Harvey et al.

(10) Patent No.: US 9,090,778 B2
(45) Date of Patent: Jul. 28, 2015

(54) BLENDED FLUOROPOLYMER COMPOSITIONS AND COATINGS FOR FLEXIBLE SUBSTRATES

(71) Applicant: WHITFORD CORPORATION, Elverson, PA (US)

(72) Inventors: Leonard W. Harvey, Downingtown, PA (US); Helen L. Brain, Merseyside (GB)

(73) Assignee: Whitford Corporation, Elverson, PA (US)

(*) Notice: Subject to any disclaimer, the term of this patent is extended or adjusted under 35 U.S.C. 154(b) by 116 days.

(21) Appl. No.: 13/748,225

(22) Filed: Jan. 23, 2013

(65) Prior Publication Data
US 2013/0137812 A1 May 30, 2013

Related U.S. Application Data

(62) Division of application No. 12/567,446, filed on Sep. 25, 2009, now Pat. No. 8,404,309.

(60) Provisional application No. 61/100,311, filed on Sep. 26, 2008, provisional application No. 61/109,952, filed on Oct. 31, 2008, provisional application No. 61/145,433, filed on Jan. 16, 2009, provisional application No. 61/145,875, filed on Jan. 20, 2009.

(51) Int. Cl.
*C08L 27/18* (2006.01)
*C09D 5/00* (2006.01)
*C09D 127/18* (2006.01)
*H05K 3/28* (2006.01)

(52) U.S. Cl.
CPC . *C09D 5/00* (2013.01); *C08L 27/18* (2013.01); *C09D 127/18* (2013.01); *C08L 2205/02* (2013.01); *C08L 2205/03* (2013.01); *H05K 3/285* (2013.01); *Y10T 428/24612* (2015.01)

(58) Field of Classification Search
CPC combination set(s) only.
See application file for complete search history.

(56) References Cited

U.S. PATENT DOCUMENTS

| 3,573,712 | A | * | 4/1971 | Shirey | 439/322 |
|---|---|---|---|---|---|
| 3,692,759 | A | | 9/1972 | Ocone | |
| 3,803,108 | A | | 4/1974 | Ocone | |
| 4,123,401 | A | | 10/1978 | Berghmans et al. | |
| 4,150,008 | A | | 4/1979 | Vassiliou et al. | |
| 4,252,859 | A | | 2/1981 | Concannon et al. | |
| 4,610,918 | A | | 9/1986 | Effenberger et al. | |
| 4,654,235 | A | | 3/1987 | Effenberger et al. | |
| 4,749,752 | A | | 6/1988 | Youlu et al. | |
| 4,767,646 | A | | 8/1988 | Cordova et al. | |
| 4,904,735 | A | | 2/1990 | Chapman, Jr. et al. | |
| 4,914,158 | A | | 4/1990 | Yoshimura et al. | |
| 4,952,630 | A | | 8/1990 | Morgan et al. | |
| 4,960,431 | A | | 10/1990 | Cordova et al. | |
| 5,240,660 | A | | 8/1993 | Marshall | |
| 5,317,061 | A | | 5/1994 | Chu et al. | |
| 5,397,629 | A | | 3/1995 | Jahn | |
| 5,444,116 | A | | 8/1995 | Amin et al. | |
| 5,468,798 | A | | 11/1995 | Leech | |
| 5,473,018 | A | | 12/1995 | Namura et al. | |
| 5,501,879 | A | | 3/1996 | Murayama | |
| 5,560,978 | A | | 10/1996 | Leech | |
| 5,590,420 | A | | 1/1997 | Gunn | |
| 5,603,999 | A | | 2/1997 | Namura et al. | |
| 5,708,044 | A | | 1/1998 | Branca | |
| 5,752,278 | A | | 5/1998 | Gunn | |
| 5,829,057 | A | | 11/1998 | Gunn | |
| 6,013,719 | A | * | 1/2000 | Lahijani | 524/508 |
| 6,021,523 | A | | 2/2000 | Vero | |
| 6,061,829 | A | | 5/2000 | Gunn | |
| 6,080,474 | A | | 6/2000 | Oakley et al. | |

(Continued)

FOREIGN PATENT DOCUMENTS

EP 0395895 B1 6/1993
EP 0322877 B1 3/1994

(Continued)

OTHER PUBLICATIONS

Applicant's response to the Examination Report dated Jun. 11, 2010 filed on Oct. 15, 2010 in European Application No. 08775953.6.
The British Search Report mailed Sep. 19, 2007 in priority application No. GB0713893.6.
The International Preliminary Report on Patentability mailed Jan. 28, 2010 in parent application No. PCT/GB2008/002414.
The International Search Report and Written Opinion mailed Oct. 24, 2008 in parent application No. PCT/GB2008/002414.
The International Search Report and Written Opinion mailed Nov. 27, 2009 in International Application No. PCT/US2009/058444.

(Continued)

*Primary Examiner* — Nicole M Buie-Hatcher
(74) *Attorney, Agent, or Firm* — Faegre Baker Daniels LLP

(57) ABSTRACT

Blended fluoropolymer compositions that, in one exemplary application, may be applied as a coating to a flexible substrate and, optionally, to a flexible substrate that has been previously coated with a primer or basecoat and/or a midcoat. In one embodiment, the composition is a blend of at least one low molecular weight polytetrafluoroethyelene (LPTFE) and at least one melt-processible fluoropolymer (MPF). In another embodiment, the composition includes a fluoropolymer base component including at least one fluoropolymer such as high molecular weight polytetrafluoroethylene (HPTFE), and additionally includes the LPTFE/MPF blended fluoropolymer composition. After being applied to the flexible substrate, optionally over a primer or basecoat and/or midcoat, and then cured, the present compositions form coatings that demonstrate improved abrasion resistance and/or improved release characteristics and/or increased translucency/transparency and/or improved impermeability. The present compositions may also be used to produce films having a high degree of clarity and impermeability. The present compositions in powder form may be melt or paste extruded to form articles with improved impermeability.

11 Claims, 57 Drawing Sheets

(56) References Cited

U.S. PATENT DOCUMENTS

| | | | |
|---|---|---|---|
| 6,133,359 A | 10/2000 | Bate et al. | |
| 6,143,368 A | 11/2000 | Gunn | |
| 6,255,384 B1 | 7/2001 | McCarthy et al. | |
| 6,403,213 B1 | 6/2002 | Huesmann | |
| 6,436,533 B1 | 8/2002 | Heffner et al. | |
| 6,461,679 B1 | 10/2002 | McMeekin et al. | |
| 6,531,559 B1 | 3/2003 | Smith et al. | |
| 6,548,612 B2 | 4/2003 | Smith et al. | |
| 6,596,207 B1 | 7/2003 | Gunn | |
| 6,649,699 B2 | 11/2003 | Namura | |
| 6,673,125 B2 | 1/2004 | Miller et al. | |
| 6,673,416 B1 | 1/2004 | Nishio | |
| 6,737,165 B1 | 5/2004 | Smith et al. | |
| 6,750,162 B2 | 6/2004 | Underwood et al. | |
| 6,761,964 B2 | 7/2004 | Tannenbaum | |
| 6,800,176 B1 | 10/2004 | Birchenall | |
| 6,800,602 B1 | 10/2004 | Kvita et al. | |
| 6,824,872 B2 | 11/2004 | Coates et al. | |
| 6,846,570 B2 | 1/2005 | Leech et al. | |
| 6,867,261 B2 | 3/2005 | Bladel et al. | |
| 6,872,424 B2 | 3/2005 | Linford et al. | |
| 7,012,109 B2 | 3/2006 | Visca et al. | |
| 7,026,036 B2 | 4/2006 | Leech et al. | |
| 7,030,191 B2 | 4/2006 | Namura | |
| 7,041,021 B2 | 5/2006 | Gibson et al. | |
| 7,160,623 B2 | 1/2007 | Smith et al. | |
| 7,220,483 B2 | 5/2007 | Coates et al. | |
| 7,276,287 B2 | 10/2007 | Smith et al. | |
| 7,291,678 B2 | 11/2007 | Namimatsu | |
| 7,594,962 B2 | 9/2009 | Bujard et al. | |
| 7,625,973 B2 | 12/2009 | Ambrose et al. | |
| 8,227,548 B2 | 7/2012 | Harvey et al. | |
| 8,404,309 B2* | 3/2013 | Harvey et al. | 427/372.2 |
| 2001/0018493 A1 | 8/2001 | Lee et al. | |
| 2001/0048179 A1 | 12/2001 | Stewart et al. | |
| 2004/0109943 A1 | 6/2004 | Matsushima et al. | |
| 2004/0242783 A1 | 12/2004 | Yabu et al. | |
| 2004/0253387 A1 | 12/2004 | Cavero | |
| 2005/0010007 A1* | 1/2005 | Tsuji et al. | 526/250 |
| 2005/0106325 A1 | 5/2005 | Nishio | |
| 2006/0121288 A1* | 6/2006 | Mochizuki et al. | 428/421 |
| 2006/0122333 A1 | 6/2006 | Nishio | |
| 2006/0148971 A1 | 7/2006 | Jing et al. | |
| 2006/0180936 A1 | 8/2006 | Japp et al. | |
| 2006/0189719 A1 | 8/2006 | Ambrose et al. | |
| 2006/0293459 A1 | 12/2006 | Yoshimoto et al. | |
| 2007/0004848 A1 | 1/2007 | Hintzer et al. | |
| 2007/0106026 A1 | 5/2007 | Namura | |
| 2007/0117929 A1 | 5/2007 | Burch et al. | |
| 2007/0117930 A1 | 5/2007 | Venkataraman et al. | |
| 2007/0255012 A1 | 11/2007 | Smith et al. | |
| 2009/0317553 A1 | 12/2009 | Harvey et al. | |
| 2010/0080955 A1 | 4/2010 | Harvey et al. | |

FOREIGN PATENT DOCUMENTS

| | | |
|---|---|---|
| EP | 1746130 A1 | 1/2007 |
| EP | 1839846 A1 | 10/2007 |
| GB | 2434152 A | 7/2007 |
| GB | 2451097 A | 1/2009 |
| JP | 2000-143922 A | 5/2000 |
| JP | 2005-320398 A | 11/2005 |
| JP | 2007070538 A | 3/2007 |
| WO | WO00/58389 A1 | 10/2000 |
| WO | WO2006/045753 A1 | 5/2006 |
| WO | WO2007/050247 A2 | 5/2007 |
| WO | WO2007/061915 A2 | 5/2007 |
| WO | WO 2007056350 A1 * | 5/2007 |
| WO | WO2007/080426 A1 | 7/2007 |
| WO | WO2009/010739 A1 | 1/2009 |
| WO | WO2009/010740 A1 | 1/2009 |
| WO | WO2010/036911 A1 | 4/2010 |
| WO | WO2010/036935 A1 | 4/2010 |
| WO | WO2011/025902 A1 | 3/2011 |
| WO | WO2011/130154 A1 | 10/2011 |

OTHER PUBLICATIONS

The International Search Report and Written Opinion mailed Aug. 3, 3009 in International Application No. PCT/US2009/044516.

The International Search Report and Written Opinion mailed Nov. 27, 2009, in related International Application No. PCT/US2009/058407.

European Examination report issued May 31, 2011 in European Application No. 08775953.6.

International Preliminary Report on Patentability mailed Sep. 9, 2010 in International Patent Application No. PCT/US2009/044516.

Lewis, Sr. R., Hawley's Condensed Chemical Dictionary, 2007, p. 1197.

McKeen, L. Fluorinated Coatings and Finishes Handbook-The Definitive User's Guide and Databook, 2006, William Andrew Publishing/Plastics Design Library, pp. 15-36.

Written Opinion and International Search Report mailed Jul. 13, 2011 from the International Searching Authority in International Application No. PCT/US2011/031909.

International Preliminary Report on Patentability mailed Oct. 16, 2012 in International Application No. PCT/US2011/031909.

Notice of Opposition and Opposition Statement and English Translation of same dated Apr. 11, 2013 relating to European Patent No. EP2342279B1.

Patent Proprietors Response to Notice of Opposition dated Sep. 12, 2013 filed in related European Patent No. EP2342279B1 Received at the EPO on Apr. 11, 2013.

Evidential reference identified on p. 2 of the Opposition Statement noted as A1 A1: Delivery notes and formulation evidence items 1 to 8, Received at the EPO on Apr. 11, 2013.

Evidential reference identified on p. 2 of the Opposition Statement noted as A2 A2: Technical data sheet for 3M Dyneon TF 5050 Received at the EPO on Apr. 11, 2013.

Evidential reference identified on p. 2 of the Opposition Statement noted as A3 A3: Extract from WO 2011/130154, Received at the EPO on Apr. 11, 2013.

Evidential reference identified on p. 2 of the Opposition Statement noted as A4 with an English translation A4: Herr Blädel-Bräunlein's statutory declaration, Received at the EPO on Apr. 11, 2013.

Evidential reference identified on p. 2 of the Opposition Statement noted as A5 A5: Technical data sheet for 3M Dyneon TF 9205, Received at the EPO on Apr. 11, 2013.

Evidential reference identified on p. 2 of the Opposition Statement noted as A6 with an English translation A6: E-mail from 3M in respect of E-15416, Received at the EPO on Apr. 11, 2013.

Evidential reference identified on p. 2 of the Opposition Statement noted as A7 A7: Extract from product information for Dyneon polytetrafluoroethylenes, Received at the EPO on Apr. 11, 2013.

Evidential reference identified on p. 2 of the Opposition Statement noted as A8 A8: Extract from 3M's Internet pages relating to Dyneon LPTFEs, Received at the EPO on Apr. 11, 2013.

Evidential reference identified on p. 2 of the Opposition Statement noted as A9 with an English translation A9: Extract from Kunststoffe Hoechst — Hostaflon, Received at the EPO on Apr. 11, 2013.

Evidential reference identified on p. 2 of the Opposition Statement noted as A11 with an English translation A11: Technical data sheet for 3M Dyneon TF 5070, Received at the EPO on Apr. 11, 2013.

Evidential reference identified on p. 2 of the Opposition Statement noted as A12 A12: Technical data sheet for 3M Dyneon TF 6900, Received at the EPO on Apr. 11, 2013.

Evidential reference identified on p. 2 of the Opposition Statement noted as A13 A13: Technical data sheet for 3M Dyneon TF 6910, Received at the EPO on Apr. 11, 2013.

Evidential reference identified on p. 2 of the Opposition Statement noted as A14 A14: WO 2004/076570 (by post only), Received at the EPO on Apr. 11, 2013.

* cited by examiner

Sample F(33) – HPTFE,PFA,LPTFE Coated Glasscloth

Sample F(46) Control – Standard HPTFE Coated Glasscloth

Naked Light Source used in Figs 60 and 61

BLENDED FLUOROPOLYMER COMPOSITIONS AND COATINGS FOR FLEXIBLE SUBSTRATES

CROSS-REFERENCE TO RELATED APPLICATIONS

This application is a Divisional of U.S. patent application Ser. No. 12/567,446 filed Sep. 25, 2009 and entitled BLENDED FLUOROPOLYMER COMPOSITIONS AND COATINGS FOR FLEXIBLE SUBSTRATES, which application claims the benefit under Title 35, U.S.C. §119(e) of U.S. Provisional Patent Application Ser. No. 61/100,311, entitled BLENDED FLUOROPOLYMER COMPOSITIONS, filed on Sep. 26, 2008; U.S. Provisional Patent Application Ser. No. 61/109,952, entitled BLENDED FLUOROPOLYMER TOPCOATS FOR FLEXIBLE SUBSTRATES, filed on Oct. 31, 2008; U.S. Provisional Patent Application Ser. No. 61/145,433, entitled BLENDED FLUOROPOLYMER COMPOSITIONS, filed on Jan. 16, 2009; and U.S. Provisional Patent Application Ser. No. 61/145,875, entitled BLENDED FLUOROPOLYMER COMPOSITIONS, filed on Jan. 20, 2009, the disclosures of each are expressly incorporated by reference herein in their entirety.

BACKGROUND OF THE INVENTION

1. Field of the Invention

The present invention relates to fluoropolymers and, in particular, relates to fluoropolymer compositions having improved properties, such as coatings of the type that are applied to flexible substrates, such as glasscloth, in which a non-stick surface and/or abrasion resistant surface is desired. In particular, the present invention relates to a fluoropolymer compositions that may be used to form coatings having improved non-stick or release characteristics and/or improved abrasion resistance, and to form films and blended powder compositions.

2. Description of the Related Art

Fluoropolymers are long-chain polymers comprising mainly ethylenic linear repeating units in which some or all of the hydrogen atoms are replaced with fluorine. Examples include polytetrafluoroethylene (PTFE), methylfluoroalkoxy (MFA), fluoro ethylene propylene (FEP), perfluoroalkoxy (PFA), poly(chlorotrifluoroethylene) and poly(vinylfluoride).

Glasscloth is one example of a flexible substrate that may be coated with a fluoropolymer coating. The coating typically includes a high molecular weight polytetrafluoroethylene (HPTFE), either by itself or including small amounts of additional polymers and/or fillers. One coating technique involves feeding a glasscloth web through a dip tank containing a dispersion of the fluoropolymer, and then feeding the coated web upwardly through a drying and sintering oven tower to cure or fix the coating. This process is usually repeated a number of times whereby up to 10 or more coating layers may be applied.

What is needed is improved fluoropolymer compositions for applications such as coatings for flexible substrates, such as glasscloth, that demonstrate improved abrasion resistance and/or release characteristics, and for use in other applications.

SUMMARY OF THE INVENTION

The present invention provides blended fluoropolymer compositions that, in one exemplary application, may be applied as a coating to a flexible substrate and, optionally, to a flexible substrate that has been previously coated with a primer or basecoat and/or a midcoat. In one embodiment, the composition is a blend of at least one low molecular weight polytetrafluoroethyelene (LPTFE) and at least one melt-processible fluoropolymer (MPF). In another embodiment, the composition includes a fluoropolymer base component including at least one fluoropolymer such as high molecular weight polytetrafluoroethylene (HPTFE), and additionally includes the LPTFE/MPF blended fluoropolymer composition. After being applied to the flexible substrate, optionally over a primer or basecoat and/or midcoat, and then cured, the present compositions form coatings that demonstrate improved abrasion resistance and/or improved release characteristics and/or increased translucency/transparency and/or improved impermeability. The present compositions may also be used to produce films having a high degree of clarity and impermeability. The present compositions in powder form may be melt or paste extruded to form articles with improved impermeability.

In one form thereof, the present invention provides a fluoropolymer composition, comprising: at least one high molecular weight polytetrafluoroethylene (HPTFE) having a number average molecular weight ($M_n$) of at least 500,000 and present in an amount of between 1 wt. % and 98 wt. % based on the total solids weight of all fluoropolymers in the composition; at least one low molecular weight polytetrafluoroethylene (LPTFE) having a first melt temperature ($T_m$) of 335° C. or less and present in an amount of between 1 wt. % and 98 wt. % based on the total solids weight of all fluoropolymers in the composition; and at least one melt-processible fluoropolymer (MPF) present in an amount of between 1 wt. % and 98 wt. % based on the total solids weight of all fluoropolymers in the composition.

A coating applied to a substrate may include the fluoropolymer composition. A film may include the fluoropolymer composition. The fluoropolymer composition may be in the form of an aqueous dispersion or may be in the form of a powder.

In another form thereof, the present invention provides a fluoropolymer composition, comprising: a fluoropolymer base component present in an amount of between 70 wt. % and 98 wt. % based on the total solids weight of all fluoropolymers in the composition, the fluoropolymer base component comprising at least one fluoropolymer including high molecular weight polytetrafluoroethylene (HPTFE) having a number average molecular weight ($M_n$) of at least 500,000; and a blended fluoropolymer composition present in an amount of between 2 wt. % and 30 wt. % based on the total solids weight of all fluoropolymers in the composition, the blended fluoropolymer composition comprising: at least one low molecular weight polytetrafluoroethylene (LPTFE) having a first melt temperature ($T_m$) of 335° C. or less, and a mean particle size of 1.0 microns (μm) or less; and at least one melt-processible fluoropolymer (MPF).

In the composition, the at least one fluoropolymer base component may be present in an amount of between 75 wt. % and 96 wt. %, and the blended fluoropolymer composition may be present in an amount of between 4 wt. % and 25 wt. % based on the total solids weight of all fluoropolymers in the composition. In another embodiment, the at least one fluoropolymer base component may be present in an amount of between 82 wt. % and 96 wt. % and the blended fluoropolymer composition may be present in an amount of between 4 wt. % and 18 wt. % based on the total solids weight of all fluoropolymers in the composition.

In the composition, the at least one melt-processible fluoropolymer may comprise perfluoroalkoxy (PFA) present in an amount between 37 wt. % and 65 wt. % based on the total solids weight of the fluoropolymers in the blended fluoropolymer composition. In another embodiment, the perfluoroalkoxy (PFA) may be present in an amount between 50 wt. % and 60 wt. % based on the total solids weight of the fluoropolymers in the blended fluoropolymer composition.

In the composition, the at least one melt-processible fluoropolymer may comprise fluorinated ethylene propylene (FEP) present in an amount between 20 wt. % and 85 wt. % based on the total solids weight of the fluoropolymers in the blended fluoropolymer composition. In another embodiment, the fluorinated ethylene propylene (FEP) may be present in an amount between 50 wt. % and 75 wt. % based on the total solids weight of the fluoropolymers in the blended fluoropolymer composition.

The at least one low molecular weight polytetrafluoroethylene (LPTFE) may have a mean particle size selected from the group consisting of 0.9 microns (μm) or less, 0.75 microns (μm) or less, 0.5 microns (μm) or less, 0.4 microns (μm) or less, 0.3 microns (μm) or less, and 0.2 microns (μm) or less, and/or may have a first melt temperature ($T_m$) selected from the group consisting of 332° C. or less, 330° C. or less, 329° C. or less, 328° C. or less, 327° C. or less, 326° C. or less, and 325° C. or less.

The at least one low molecular weight polytetrafluoroethylene (LPTFE) may be obtained via emulsion polymerization without being subjected to agglomeration, thermal degradation, or irradiation, or may be an LPTFE micropowder obtained via emulsion polymerization or suspension polymerization with or without a subsequent molecular weight reduction step.

In another form thereof, the present invention provides a coated flexible substrate, comprising: a flexible substrate; a coating on said flexible substrate, comprising: at least one fluoropolymer including high molecular weight polytetrafluoroethylene (HPTFE) having a number average molecular weight ($M_n$) of at least 500,000 and present in an amount of between 70 wt. % and 98 wt. % based on the total solids weight of all fluoropolymers in the coating; at least one low molecular weight polytetrafluoroethylene (LPTFE) having a number average molecular weight ($M_n$) of less than 500,000 and present in an amount of between 1 wt. % and 30 wt. % based on the total weight of all fluoropolymers in the coating; and at least one melt-processible fluoropolymer present in an amount of between 1 wt. % and 30 wt. % based on the total weight of all fluoropolymers in the coating.

In the coating, the at least one low molecular weight polytetrafluoroethylene (LPTFE) may be present in an amount of between 5 wt. % and 15 wt. %, and the at least one melt-processible fluoropolymer present in an amount of between 5 wt. % and 15 wt. %, based on the total weight of all fluoropolymers in the coating. The at least one melt-processible fluoropolymer may comprise perfluoroalkoxy (PFA) present in an amount between 37 wt. % and 65 wt. % based on the combined total solids weight of the at least one low molecular weight polytetrafluoroethylene (LPTFE) and the at least one melt-processible fluoropolymer.

The coating may have one or more properties selected from the group consisting of: a surface roughness (Ra) of less than 1.5 microns; and a measured gloss of at least 30% reflectance at 60°.

BRIEF DESCRIPTION OF THE DRAWINGS

The above-mentioned and other features and advantages of this invention, and the manner of attaining them, will become more apparent and the invention itself will be better understood by reference to the following description of an embodiment of the invention taken in conjunction with the accompanying drawings, wherein.

Figure 1:
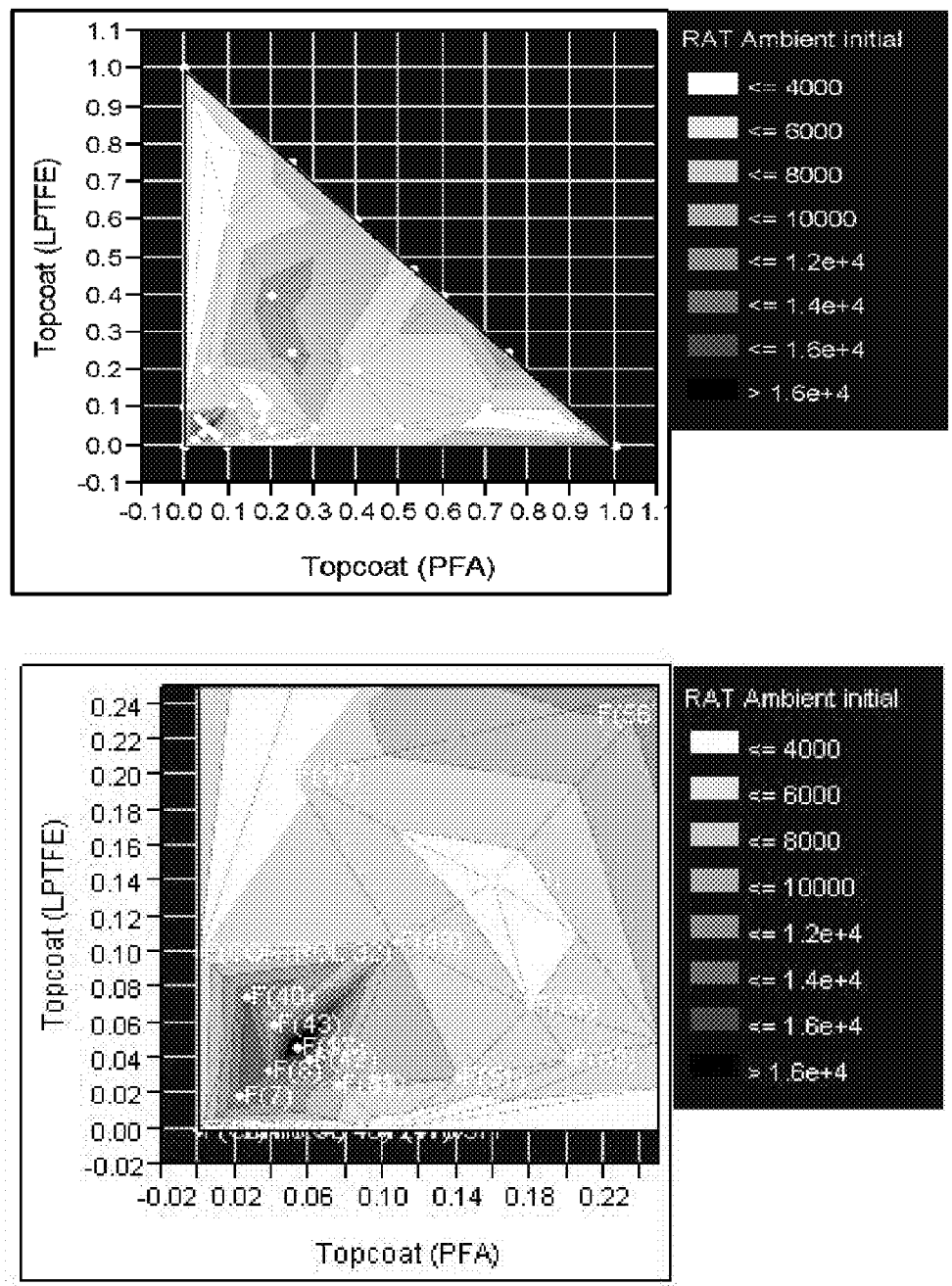
FIG. 1 shows a first contour plot of RAT ambient initial (Example 3) plotted against PFA and LPTFE content for the topcoats in the Examples that include PFA, together with a second plot of the HPTFE-rich area of the first plot.
Figure 2:
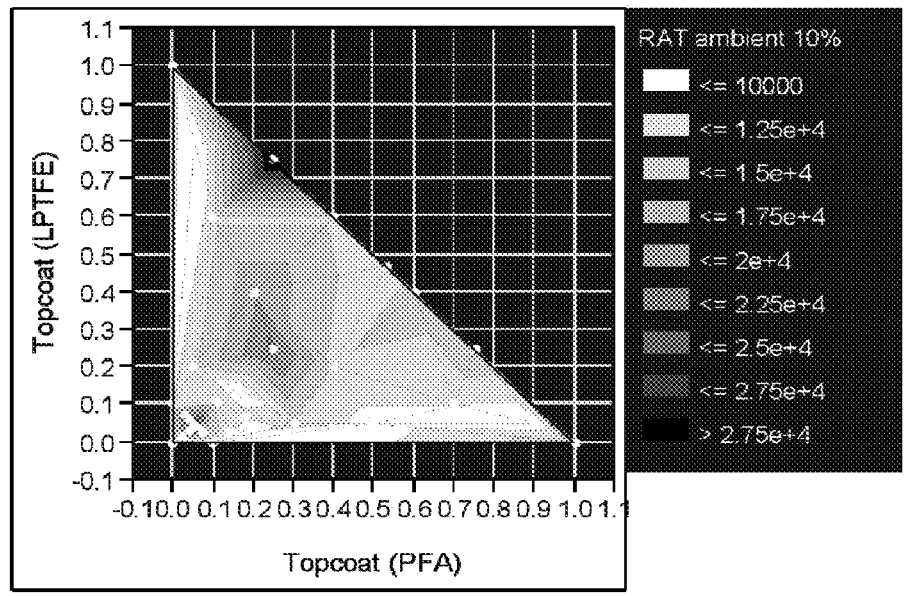
FIG. 2 shows a first contour plot of RAT ambient 10% (Example 3) plotted against PFA and LPTFE content for the topcoats in the Examples that include PFA, together with a second plot of the HPTFE-rich area of the first plot.
Figure 2:
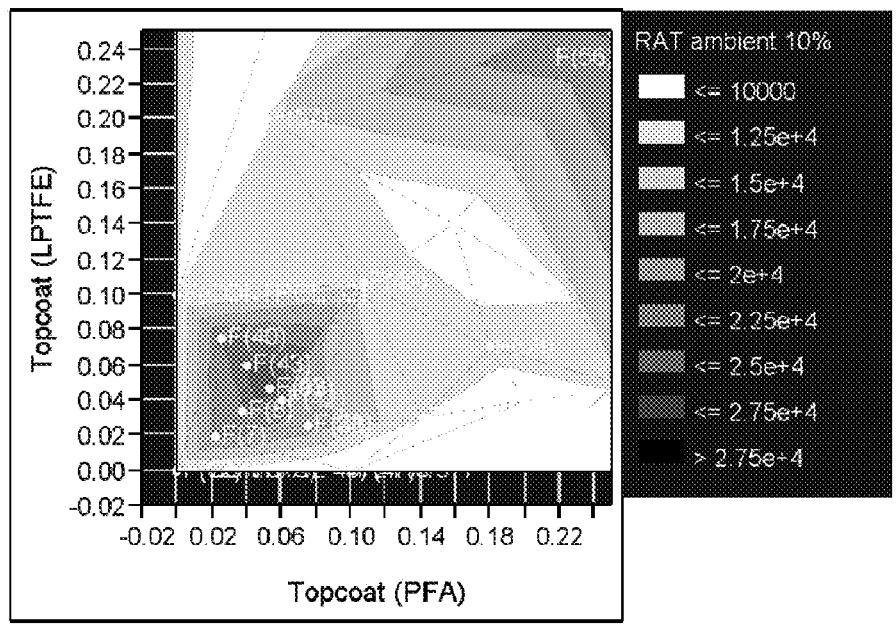
Figure 3:
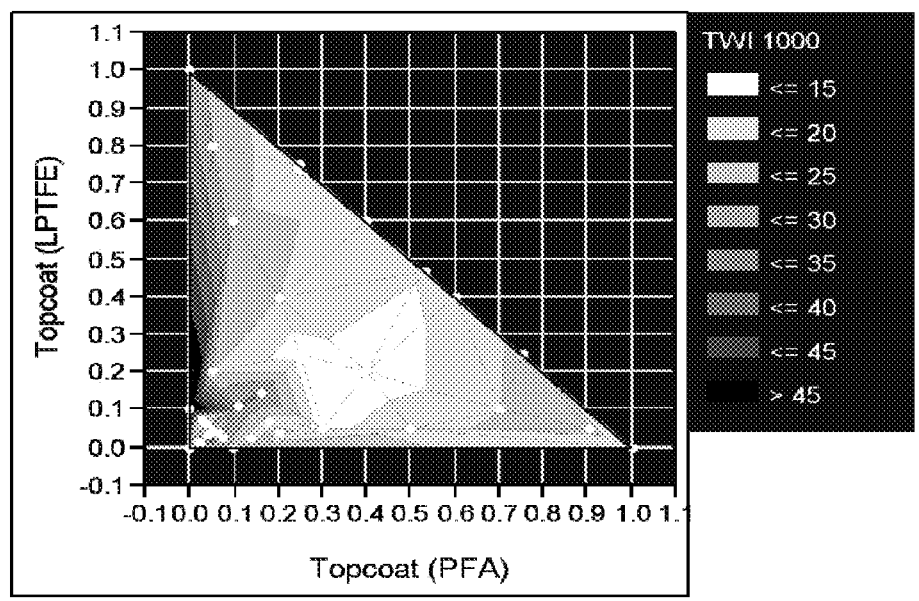
FIG. 3 shows a first contour plot of TWI 1000 (Example 4) plotted against PFA and LPTFE content for the topcoats in the Examples that include PFA, together with a second plot of the HPTFE-rich area of the first plot.
Figure 3:
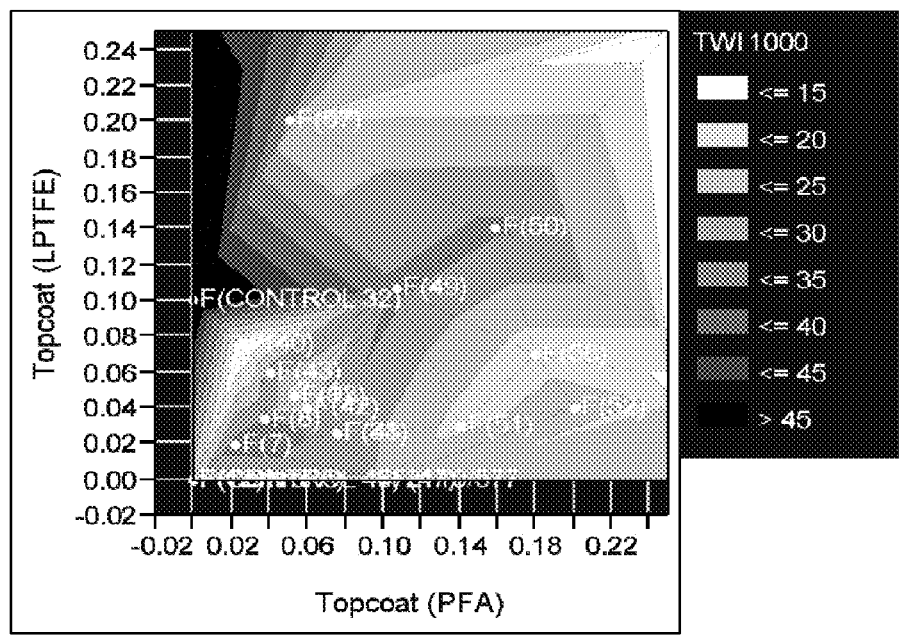
Figure 4:
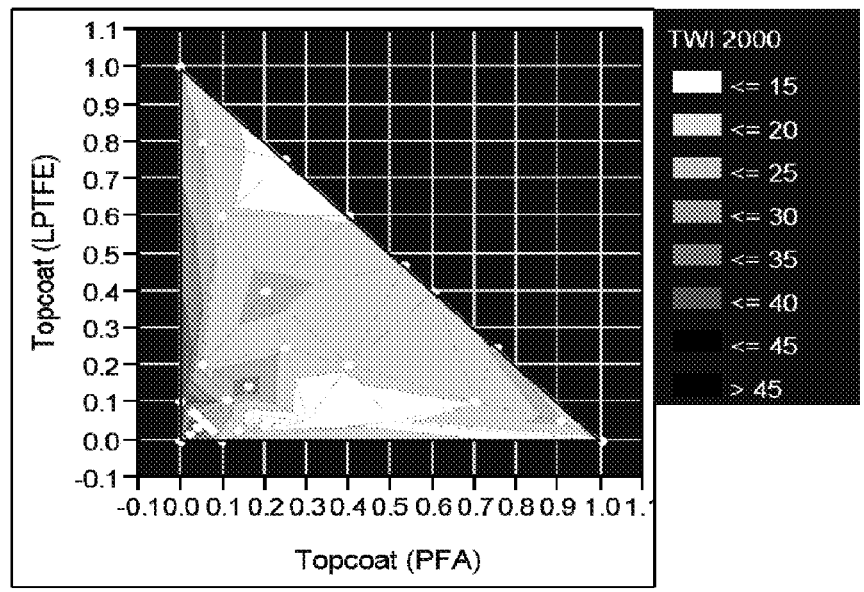
FIG. 4 shows a first contour plot of TWI 2000 (Example 4) plotted against PFA and LPTFE content for the topcoats in the Examples that include PFA, together with a second plot of the HPTFE-rich area of the first plot.
Figure 4:
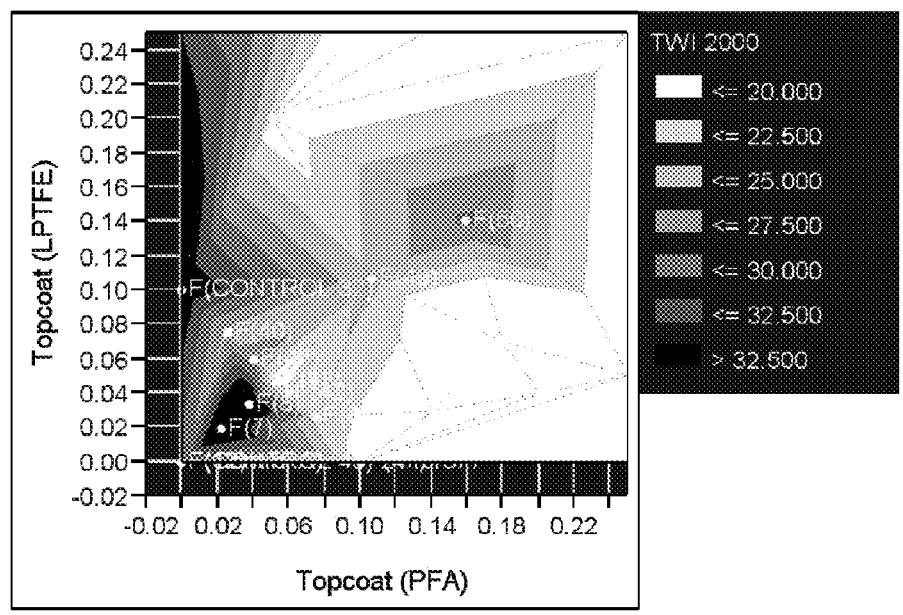
Figure 5:
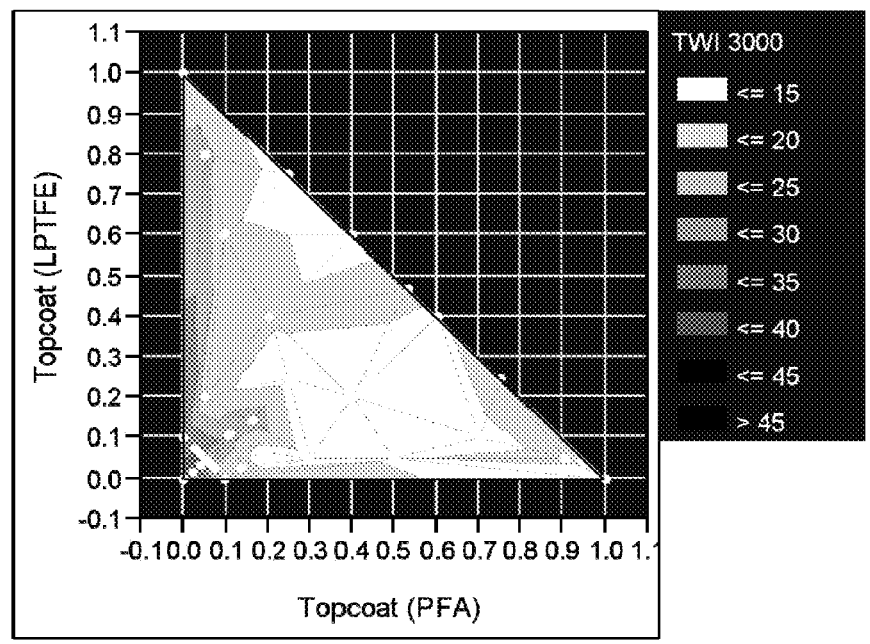
FIG. 5 shows a first contour plot of TWI 3000 (Example 4) plotted against PFA and LPTFE content for the topcoats in the Examples that include PFA, together with a second plot of the HPTFE-rich area of the first plot.
Figure 5:
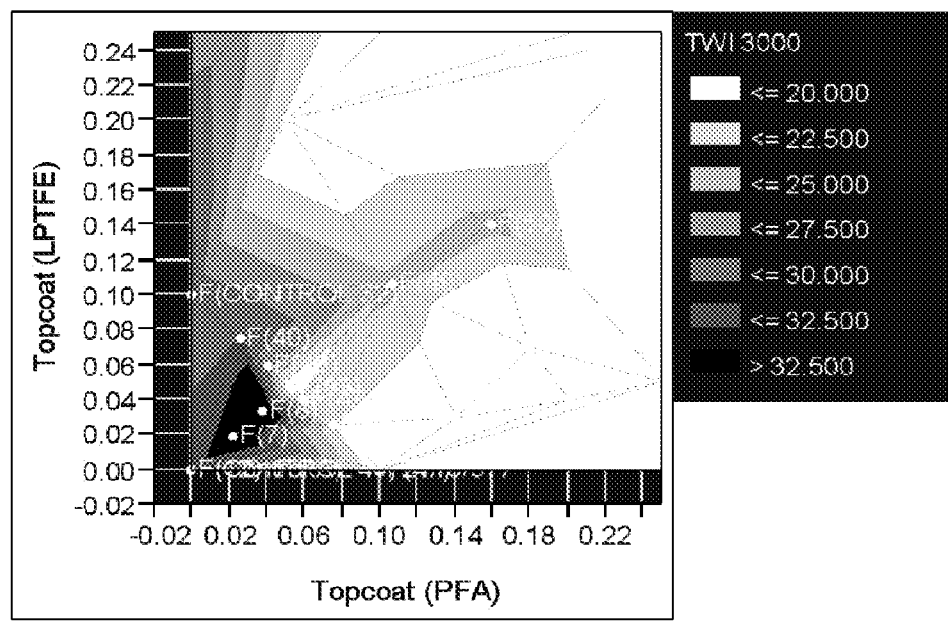
Figure 6:
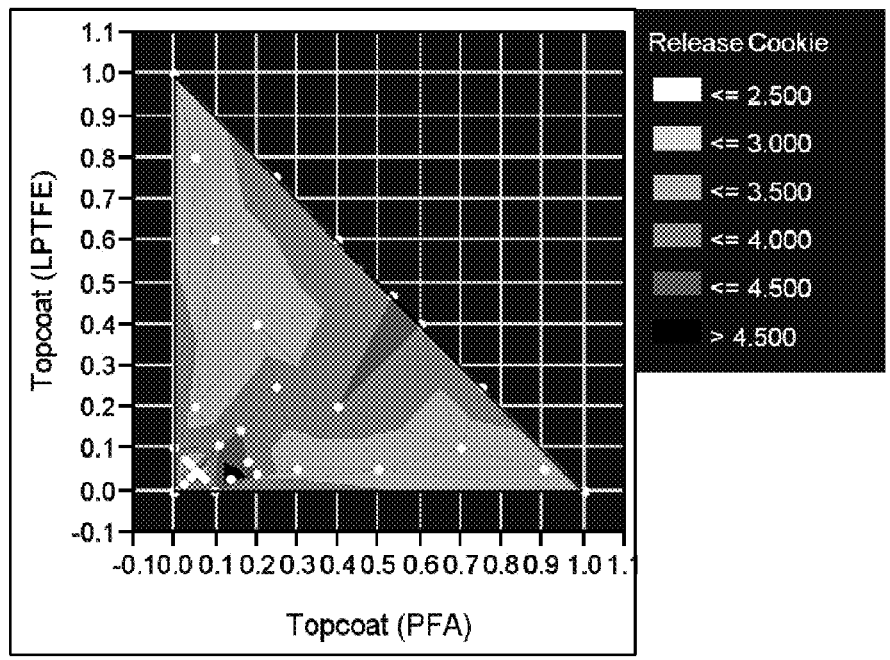
FIG. 6 shows a first contour plot of cookie dough cooking release (Example 5) plotted against PFA and LPTFE content for the topcoats in the Examples that include PFA, together with a second plot of the HPTFE-rich area of the first plot.
Figure 6:
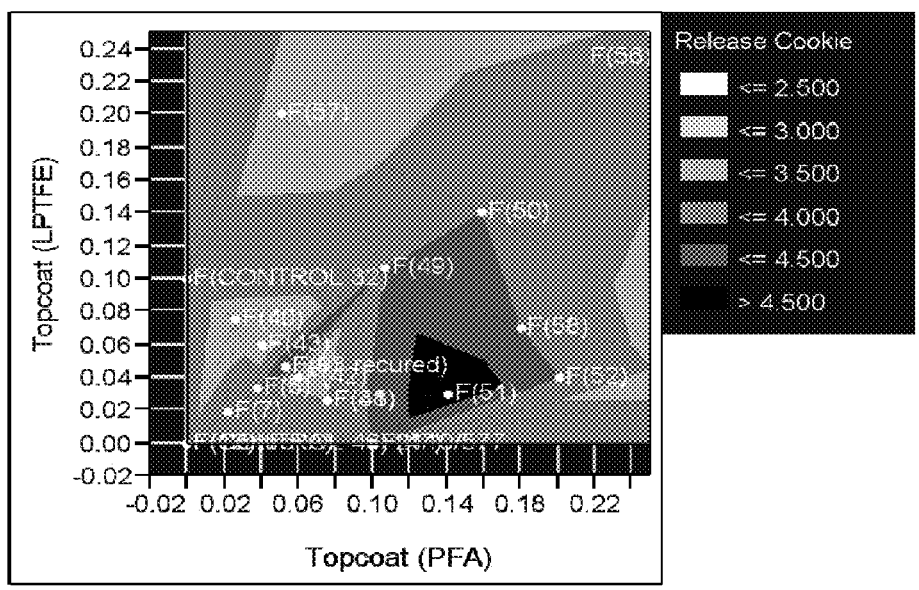
Figure 7:
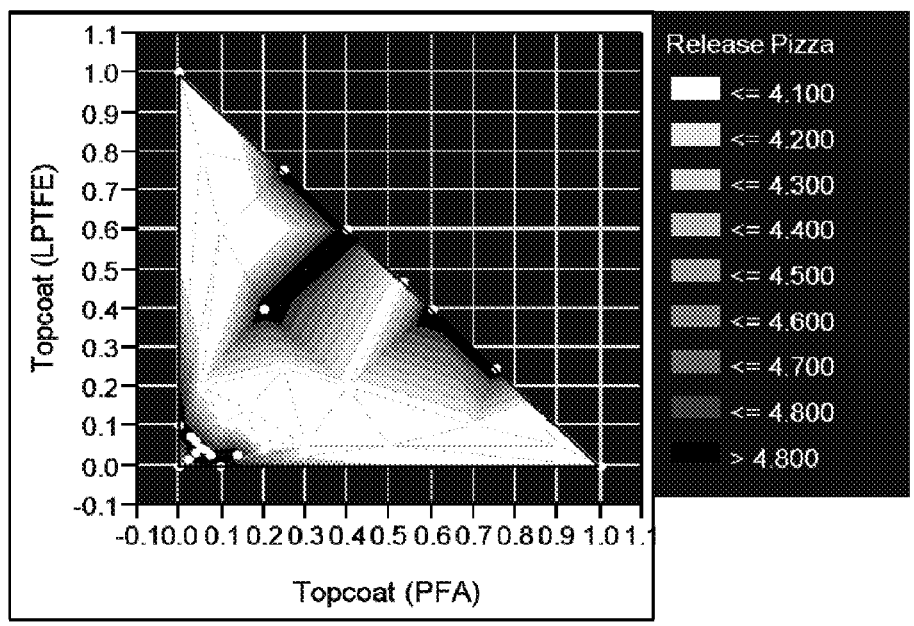
FIG. 7 shows a first contour plot of pizza dough cooking release (Example 5) plotted against PFA and LPTFE content for the topcoats in the Examples that include PFA, together with a second plot of the HPTFE-rich area of the first plot.
Figure 7:
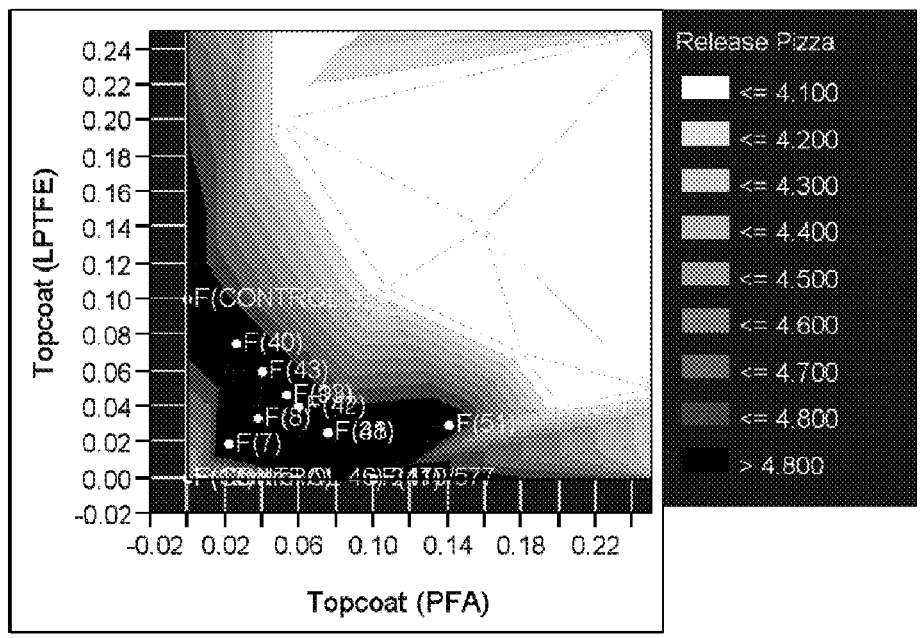
Figure 8:
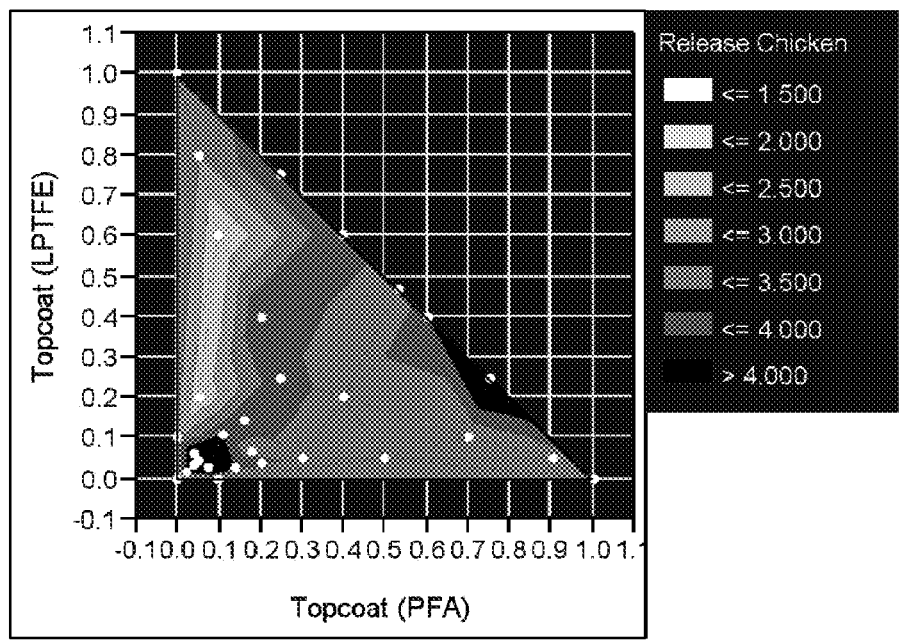
FIG. 8 shows a first contour plot of chicken cooking release (Example 5) plotted against PFA and LPTFE content for the topcoats in the Examples that include PFA, together with a second plot of the HPTFE-rich area of the first plot.
Figure 8:
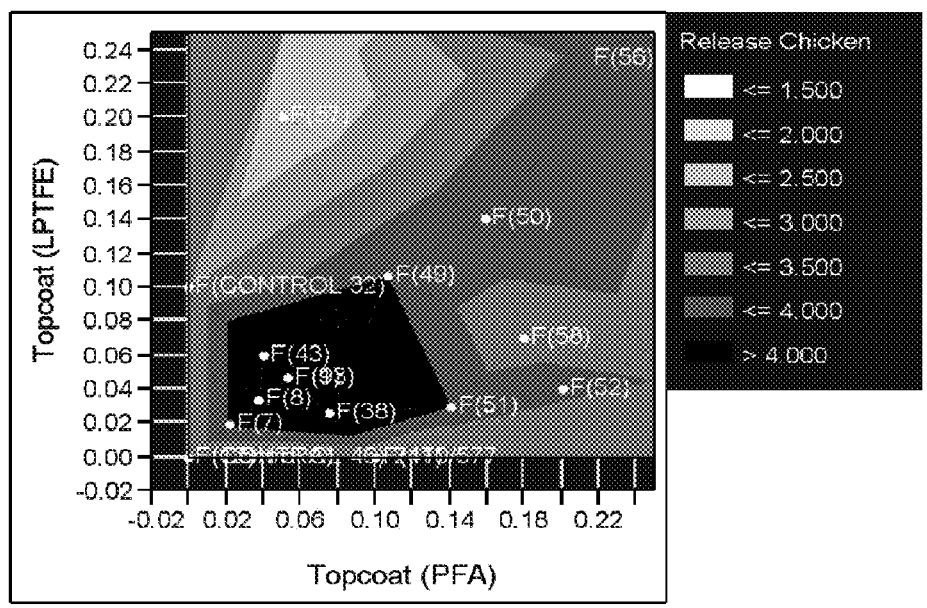
Figure 9:
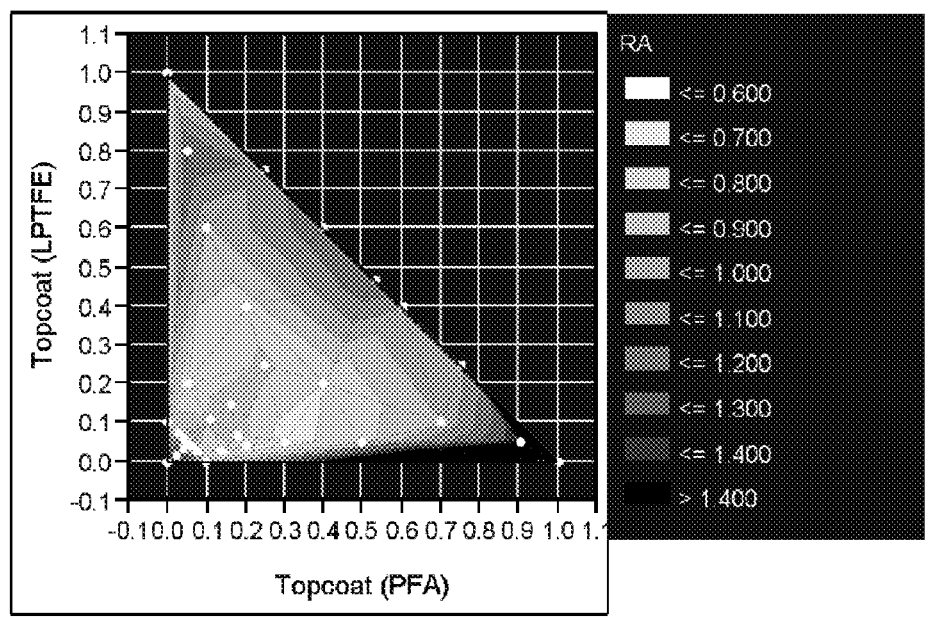
FIG. 9 shows a first contour plot of roughness (Example 2) plotted against PFA and LPTFE content for the topcoats in the Examples that include PFA, together with a second plot of the HPTFE-rich area of the first plot.
Figure 9:
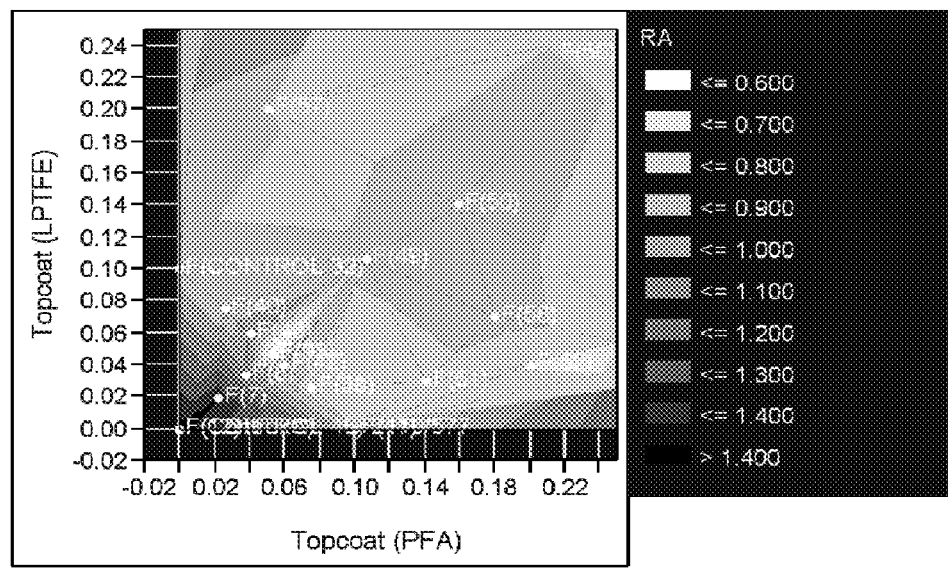
Figure 10:
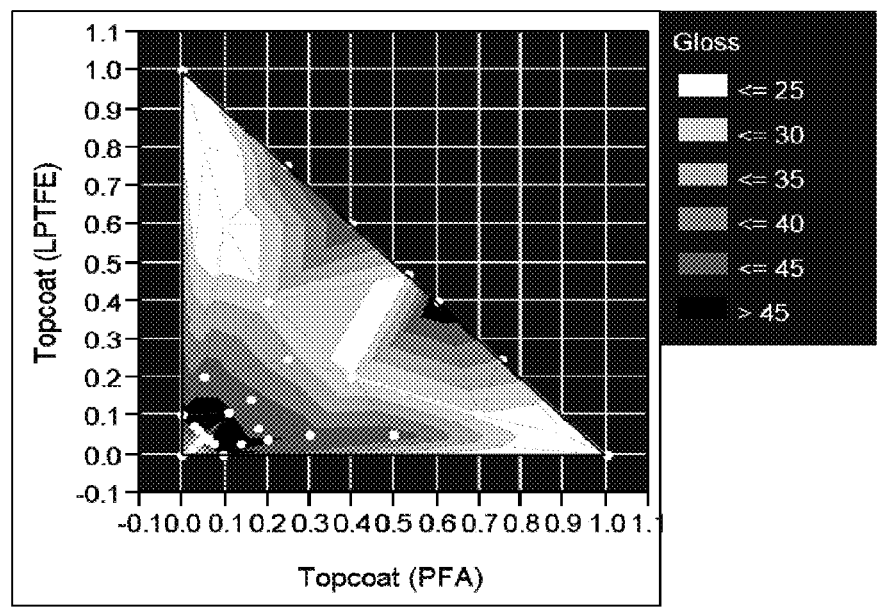
FIG. 10 shows a first contour plot of gloss (Example 2) plotted against PFA and LPTFE content for the topcoats in the Examples that include PFA, together with a second plot of the HPTFE-rich area of the first plot.
Figure 10:
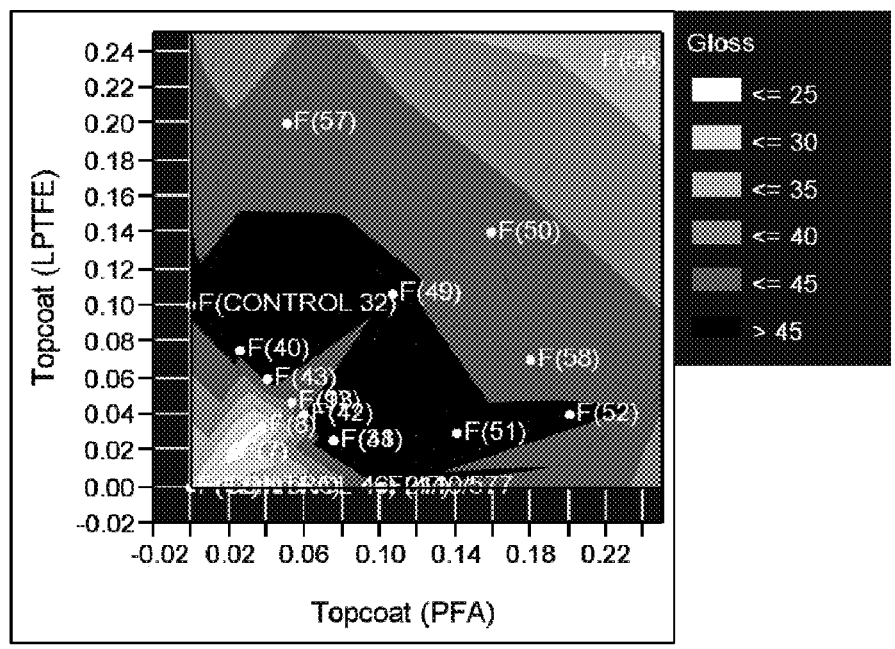
Figure 11:
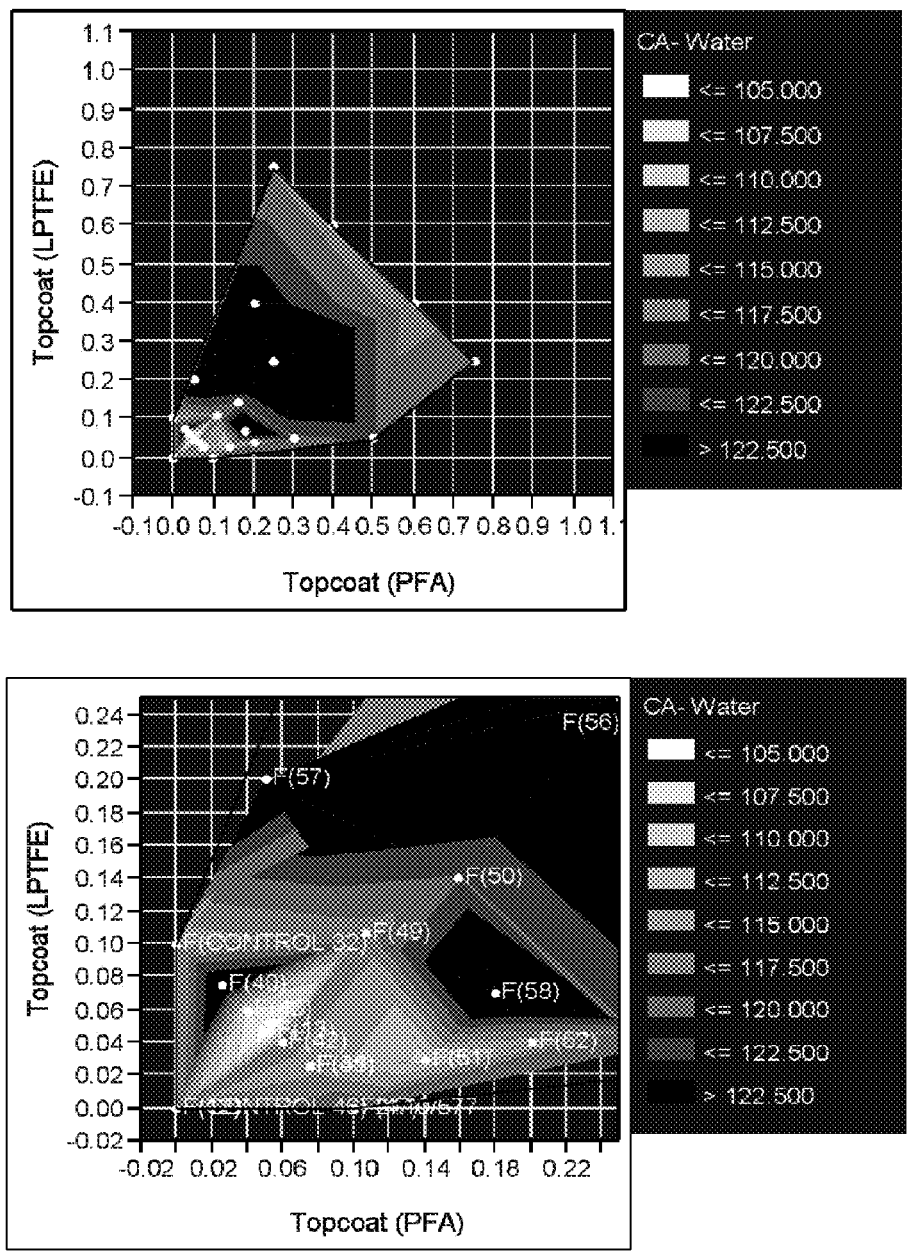
FIG. 11 shows a first contour plot of contact angle (Example 2) plotted against PFA and LPTFE content for the topcoats in the Examples that include PFA, together with a second plot of the HPTFE-rich area of the first plot.
Figure 12:
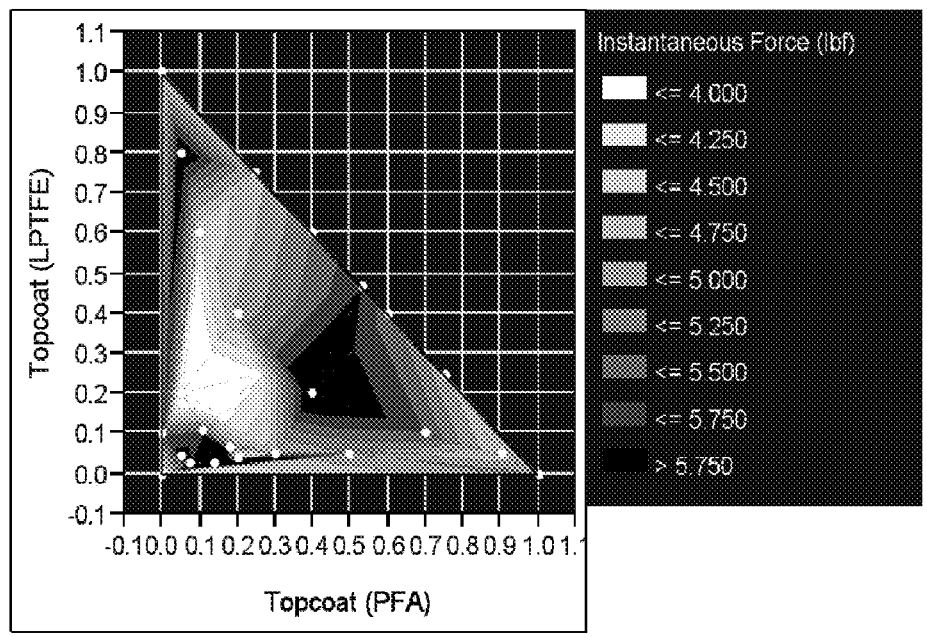
FIG. 12 shows a first contour plot of instantaneous force (Example 8) plotted against PFA and LPTFE content for the topcoats in the Examples that include PFA, together with a second plot of the HPTFE-rich area of the first plot.
Figure 12:
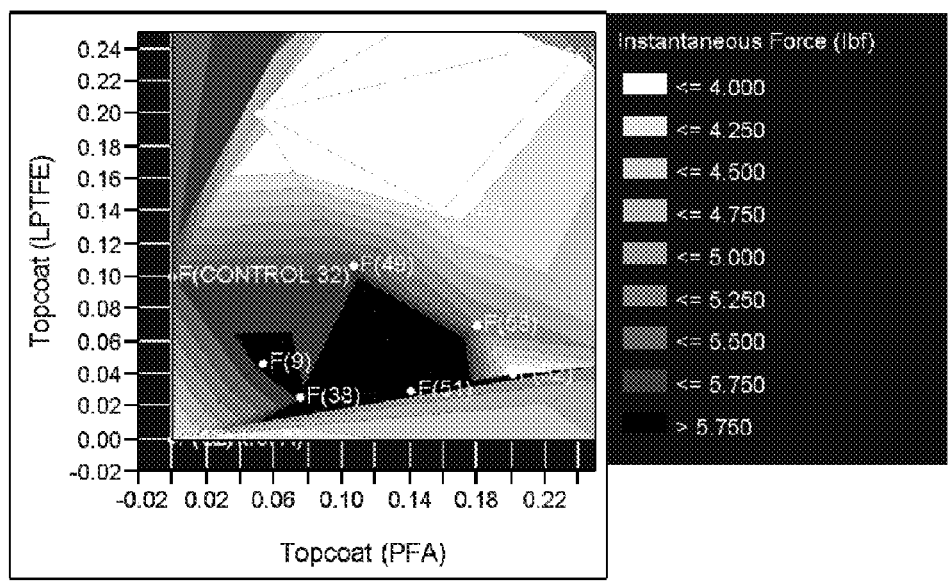
Figure 13:
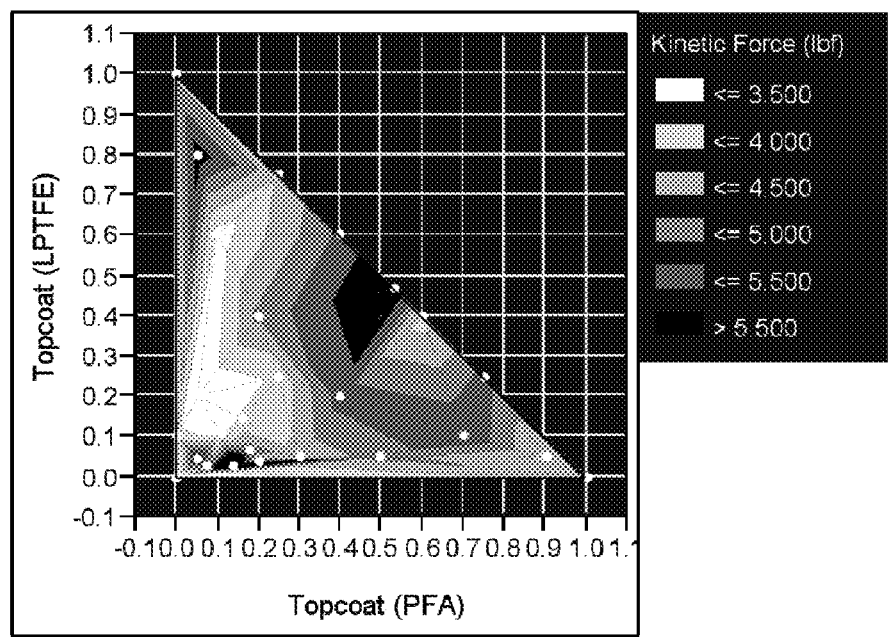
FIG. 13 shows a first contour plot of kinetic force (Example 8) plotted against PFA and LPTFE content for the topcoats in the Examples that include PFA, together with a second plot of the HPTFE-rich area of the first plot.
Figure 13:
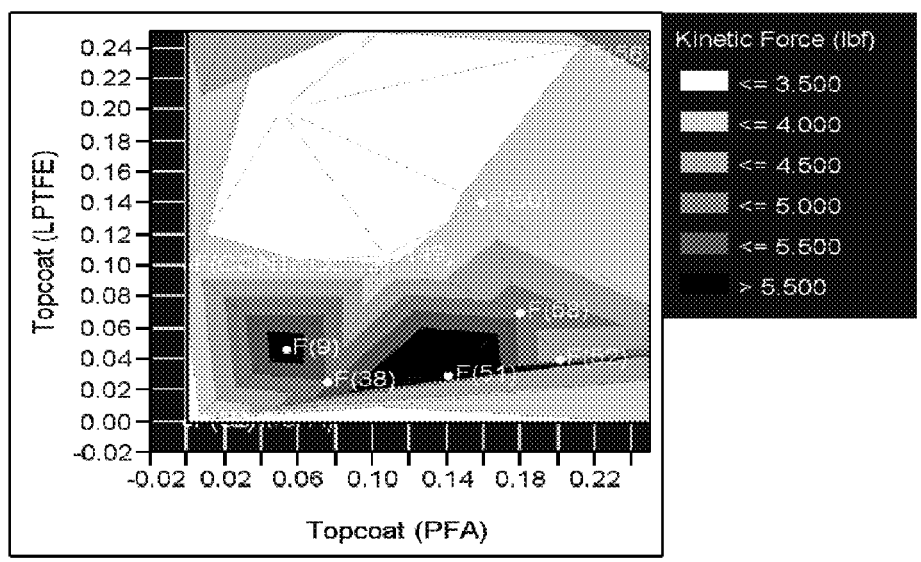
Figure 14:
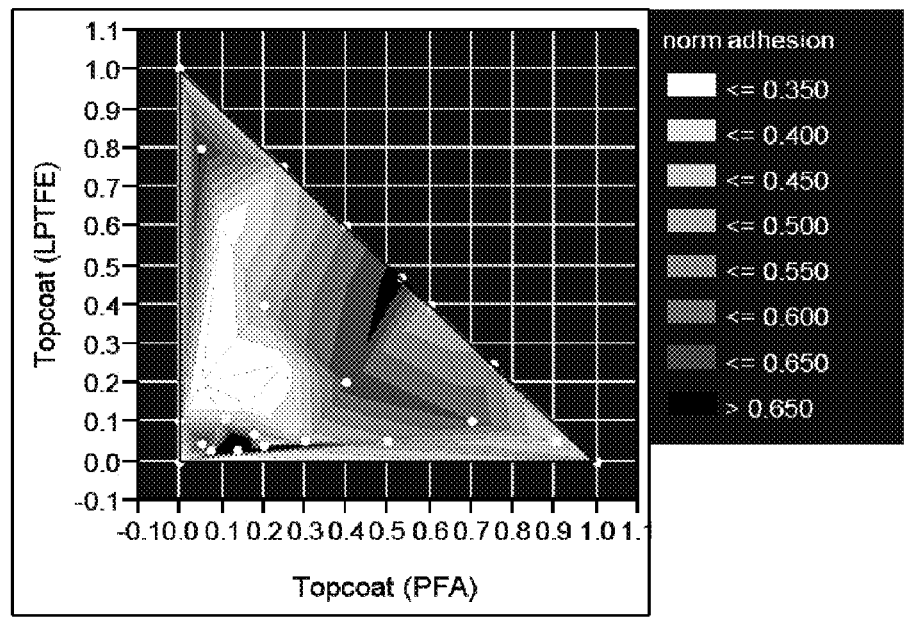
FIG. 14 shows a first contour plot of the normalized results of the adhesion tests (Example 8) plotted against PFA and LPTFE content for the topcoats in the Examples that include PFA, together with a second plot of the HPTFE-rich area of the first plot.
Figure 14:
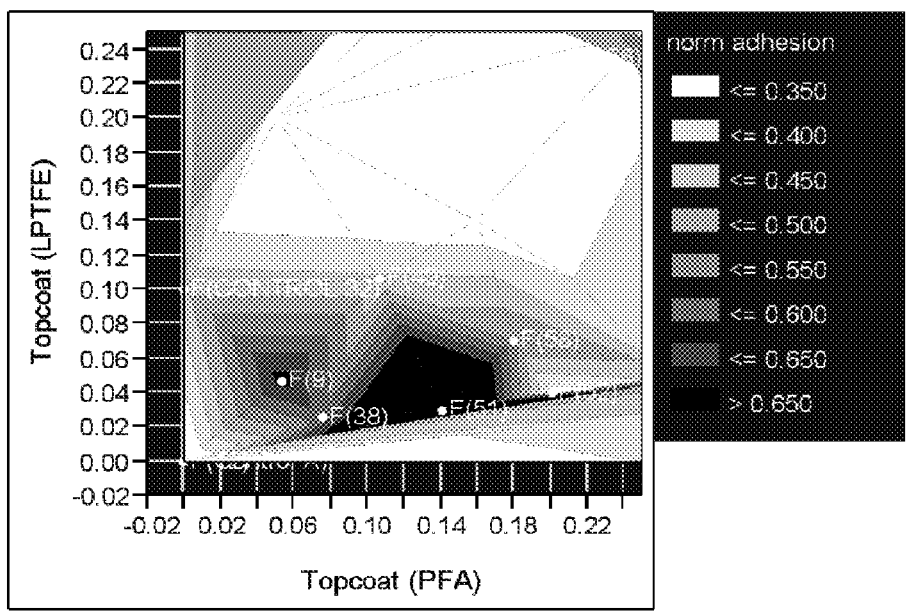

The exemplifications set out herein illustrate embodiments of the invention, and such exemplifications are not to be construed as limiting the scope of the invention in any manner.

DETAILED DESCRIPTION

The present invention provides blended fluoropolymer compositions that, in one exemplary application, may be applied as a coating to a flexible substrate and, optionally, to a flexible substrate that has been previously coated with a primer or basecoat and/or a midcoat. In one embodiment, the composition is a blend of at least one low molecular weight polytetrafluoroethyelene (LPTFE) and at least one melt-processible fluoropolymer (MPF). In another embodiment, the composition includes a fluoropolymer base component including at least one fluoropolymer such as high molecular weight polytetrafluoroethylene (HPTFE), and additionally includes the LPTFE/MPF blended fluoropolymer composition. After being applied to the flexible substrate, optionally over a primer or basecoat and/or midcoat, and then cured, the present compositions form coatings that demonstrate improved abrasion resistance and/or improved release characteristics and/or increased translucency/transparency and/or improved impermeability. The present compositions may also be used to produce films having a high degree of clarity and impermeability. The present compositions in powder form may be melt or paste extruded to form articles with improved impermeability.

Suitable flexible substrates to which the present coating compositions may be applied include glasscloth of the type commonly used in applications such as food conveyer belts for continuous ovens, architectural fabrics of the type used in stadium roofs and radar domes, as well as heat sealing belts, circuit boards, cooking sheets, and tenting fabrics, for example. "Glasscloth" or "glass cloth" is a textile material made of woven fibers such as, for example, linen, glass, or cotton.

Other flexible substrates that may be coated with the present coating compositions include any material including natural or synthetic fibers or filaments, including staple fiber, fiberfill, yarn, thread, textiles, nonwoven fabric, wire cloth, ropes, belting, cordage, and webbing, for example. Exemplary fibrous materials which may be coated with the present coating compositions include natural fibers, such as vegetable, animal, and mineral fibers, including cotton, cotton denim, wool, silk, ceramic fibers, and metal fibers, as well as synthetic fibers, such as knit carbon fabrics, ultra high molecular weight polyethylene (UHMWPE) fibers, poly(ethylene terephthlalate) (PET) fibers, para-aramid fibers, including poly-paraphenylene terephtalamide or Kevlar®, and meta-aramid fibers, such as Nomex®, each available from E.I. du Pont de Nemours and Company, polyphenylene sulfide fibers, such as Ryton®, available from Chevron Phillips Chemical Co., polypropylene fibers, polyacrylic fibers, polyacrylonitrile (PAN) fibers, such as Zoltek®, available from Zoltek Corporation, polyamide fibers (nylon), and nylon-polyester fibers, such as Dacron®, available from Invista North America.

The flexible substrate may optionally be coated with a primer (or basecoat) and/or a midcoat prior to application of the present coating compositions. The primer and midcoat may be any type of fluoropolymer-based coating, and commercially available coatings based on high molecular weight PTFE are widely available. The particular compositions of the primer and/or midcoat may vary widely, and are not thought to be critical with respect to the improved properties demonstrated by the coatings disclosed herein.

In particular, in one embodiment, the present coating composition is applied over an underlying coating, or undercoat. The undercoat may be a basecoat, which is the coating applied directly to an underlying substrate (sometimes referred to as a primer), optionally together with one or more midcoats. In these embodiments, the present coating may be referred to herein as either an "overcoat" or a "topcoat" and these terms are generally interchangeable. In other embodiments, the present coating composition may be applied directly to a substrate to form a coating in direct contact with the substrate whereby the coating is not applied over any undercoats. In further embodiments, the present coating system may itself also be an undercoat.

In another application, free-standing films having high optical clarity and excellent impermeability may be cast from the present compositions. For example, films may be produced from the present compositions by casting the compositions onto a suitable surface from which they are removed after drying and curing.

In a still further application, powders having the compositions discussed herein may be prepared, which may then be dispersed in solution, or may extruded such as by paste or melt extrusion, for example, to produce articles with enhanced impermeability.

In a first embodiment described herein, the present composition generally includes a blended fluoropolymer composition of at least one low molecular weight PTFE (LPTFE) and at least one melt processable fluoropolymer (MPF).

In a second embodiment described herein, the present composition generally includes at least one fluoropolymer base component and a blended fluoropolymer composition. The fluoropolymer base component is typically a high molecular weight PTFE (HPTFE). The blended fluoropolymer composition includes at least one low molecular weight PTFE (LPTFE) and at least one melt processable fluoropolymer (MPF).

I. First Embodiment

In a first embodiment, the composition is a blend of at least one low molecular weight PTFE (LPTFE) and at least one melt-processable fluoropolymer (MPF). Suitable fluoropolymer components and blends are discussed below, and are also discussed in U.S. patent application Ser. No. 12/468,580, entitled "Blended Fluoropolymer Compositions", filed on May 19, 2009, assigned to the assignee of the present invention, the disclosure of which is expressly incorporated by reference herein.

A. Low Molecular Weight Polytetrafluoroethylene (LPTFE).

The first fluoropolymer of the present blended fluoropolymer composition may be a liquid dispersion of polytetrafluoroethylene (PTFE) and, in particular, may be a liquid dispersion of a PTFE having a low molecular weight (LPTFE) and/or optionally other properties as discussed in detail below.

The liquid dispersion of LPTFE in most embodiments will be an aqueous dispersion, though the LPTFE may be dispersed in other solvents and/or LPTFE originally in an aqueous phase may be phase transferred into another solvent, such as organic solvents including hexane, acetone, or an alcohol.

The LPTFE, when produced as described above, will typically have a mean particle size of 1.0 microns (μm) or less, 0.9 microns (μm) or less, 0.75 microns (μm) or less, 0.5 microns (μm) or less, 0.4 microns (μm) or less, 0.3 microns (μm) or less, or 0.2 microns (μm) or less, as measured by a suitable manner such as by laser light diffraction by ISO 13320. In some embodiments, the LPTFE may have a mean particle size as low as 30, 50, 100, or 150 nm, or as large as 200, 250, or 350 nm, for example.

The number average molecular weight ($M_n$) of the LPTFE will typically be less than 500,000 and, in most embodiments, may be as low as 10,000 or greater, 20,000 or greater, or 25,000 or greater, or may be as high as 200,000 or less, 100,000 or less, or 70,000 or less, 60,000 or less, or 50,000 or less, for example.

An alternative manner of characterizing the molecular weight of the LPTFE is by its first melt temperature ($T_m$), as determined by a suitable method such as differential scanning calorimetry (DSC), which first melt temperature ($T_m$) for LPTFE may be either equal to or less than 335° C. In other embodiments, the first melt temperature of the LPTFE may be either equal to or less than 332° C., either equal to or less than 330° C., either equal to or less than 329° C., either equal to or less than 328° C., either equal to or less than 327° C., either equal to or less than 326° C., or either equal to or less than 325° C.

The LPTFE may be provided in the form of an aqueous dispersion which is stabilized, unstabilized, or minimally stabilized. As used herein, "unstabilized" or "minimally stabilized" refers to an aqueous dispersion that includes less than 1.0 wt. % of a traditional surfactant, such as non-ionic surfactant or an anionic surfactant, based on the weight of the LPTFE aqueous dispersion. In some embodiments, the LPTFE dispersion may be provided in the form of an aqueous dispersion having less than 1.0 wt. % surfactant, less than 0.8 wt. % surfactant, less than 0.6 wt. % surfactant, or even less than 0.5 wt. % surfactant. In other embodiments, the LPTFE dispersion may be provided in the form of an aqueous dispersion that is "stabilized", typically having 1-12 wt. % surfactant. However, the nature of the stabilization package employed is not a critical feature of this invention.

Also, as discussed below, the LPTFE may be provided in the form of a solid micropowder.

The LPTFE will typically be in the form of a low molecular weight PTFE homopolymer. However, in other embodiments, the LPTFE may include a small amount of modifying co-monomer, in which case the PTFE is a co-polymer known in the art as "modified PTFE" or "trace modified PTFE". Examples of the modifying co-monomer include perfluoropropylvinylether (PPVE), other modifiers, such as hexafluoropropylene (HFP), chlorotrifluoroethylene (CTFE), perfluorobutylethylene (PFBE), or other perfluoroalkylvinylethers, such as perfluoromethylvinylether (PMVE) or perfluoroethylvinylether (PEVE). The modifying co-monomer will typically be present in an amount less than 1% by weight, for example, with respect to the PTFE.

Suitable LPTFE dispersions include SFN-D, available from Chenguang R.I.C.I, Chengdu, 610036 P.R. China, as well as TE3877N, available from DuPont. Other exemplary LPTFE micropowders include Dyneon TF-9207, available from Dyneon LLC, LDW-410, available from Daikin Industries, Inc., and MP-25, MP-55, MP-8T and UF BTA, each available from Laurel Products.

These fluoropolymers have characteristics set forth in Table 1 below:

TABLE 1

| Characteristics of exemplary low molecular weight polytetrafluoroethylenes (LPTFE) | | | | | |
|---|---|---|---|---|---|
| LPTFE | Solids content (wt. %) | Molecular weight (Mn) (estimated) | Mean particle size (μm) | Surfactant (wt. %, based on weight of LPTFE) (type) | First melt temperature (DSC) (° C.) |
| SFN-D | 50 | 10,000-20,000 | 0.19 | 5% | 324.5-326 |
| TE3877N | 60 | 65,000-70,000 | 0.2 | 6% (non-ionic) | 327.6 |

TABLE 1-continued

Characteristics of exemplary low molecular weight polytetrafluoroethylenes (LPTFE)

| LPTFE | Solids content (wt. %) | Molecular weight (Mn) (estimated) | Mean particle size (µm) | Surfactant (wt. %, based on weight of LPTFE) (type) | First melt temperature (DSC) (° C.) |
|---|---|---|---|---|---|
| LDW-410 | 40 | 80,000-90,000 | 0.2 | 5% | 329.4 |
| TF-9207 | 100 | 65,000-70,000 | 13.27 | N/A | 327.6 |
| MP-8T | 100 | ca. 25,000 | 1.32 | N/A | 323.1 |
| MP-10 | 100 | 100,000 | 0.84 | N/A | 330 |
| MP-55 | 100 | 40,000-50,000 | 11.06 | N/A | 324.3 |
| MP-25 | 100 | ca. 130,000 | 0.28 | N/A | 332 |
| UF-8TA | 100 | ca. 95,000 | 1.22 | N/A | 331.5 |

Exemplary types of LPTFE that may be used in the present invention are discussed below.

i. LPTFE Produced by Dispersion Polymerization or Emulsion Polymerization and which is Thereafter not Agglomerated, Irradiated, or Thermally Degraded.

In some embodiments of the present invention, the LPTFE is produced by a polymerization process that is well known in the art as dispersion polymerization or emulsion polymerization. These polymerization processes may be conducted with chain transfer agents, which reduce the average molecular weight of the fluoropolymers produced, and/or via other methods whereby the polymerization process is controlled to form a liquid dispersion of directly polymerized particles of PTFE having low molecular weight (LPTFE).

In these embodiments, the LPTFE, after being produced by dispersion polymerization or emulsion polymerization, is thereafter not agglomerated, irradiated, or thermally degraded. In particular, the LPTFE has not been subjected to any agglomeration steps during its manufacture, and therefore retains a small mean particle size. Further, the LPTFE has not been subjected to thermal degradation to reduce its molecular weight. Still further, the LPTFE has also not been subjected to irradiation, such as by high energy electron beam, to reduce its molecular weight. In these embodiments, the LPTFE dispersions will not demonstrate a spectrum and/or will be below a detection limit when subjected to electron paramagnetic resonance (EPR) or electron spin resonance (ESR) spectroscopy, as opposed to irradiated PTFE, which will demonstrate such a spectra and/or will otherwise have detectable free radicals.

These types of LPTFE dispersions are provided as aqueous dispersions that are obtained via a controlled dispersion or emulsion polymerization process to produce directly polymerized LPTFE that is not thereafter subjected to agglomeration, thermal degradation, or irradiation. These types of LPTFE dispersions will be appreciated by those of ordinary skill in the art to be distinct from other PTFE materials that are commercially available.

First, these types of LPTFE dispersions are distinct from PTFE that is produced by the polymerization process well known in the art as granular or suspension polymerization, which yields PTFE known in the art as granular PTFE resin or granular PTFE molding powder. Granular PTFE resins will typically have a high molecular weight, such as a number average molecular weight ($M_n$) of at least 1,000,000 or more and a first melt temperature ($T_m$) greater than the 335° C., typically much greater than 335° C. Granular PTFE resin is typically provided in solid, powder form including particles having a mean particle size of several microns, typically from 10 to 700 microns (µm). These resins may also be provided as fine cut resins having a mean particle size of 20 to 40 microns (µm), for example.

Additionally, these types of LPTFE dispersions may be distinct from lower molecular weight materials prepared from high molecular weight granular PTFE resins that have been degraded by irradiation or thermal degradation to form low molecular weight materials known as granular PTFE micropowders, which typically have a particle size ranging between 0.2 and 20 microns (µm). Examples of granular PTFE micropowders include Zonyl® MP1200, MP1300, and MP1400 resins, available from DuPont (Zonyl® is a registered trademark of E.I. du Pont de Nemours & Co.).

Second, these types of LPTFE dispersions are also distinct from high molecular weight PTFE dispersions made from dispersion or emulsion polymerization conducted without chain transfer agents to thereby polymerize a high molecular weight PTFE having a number average molecular weight ($M_n$) of at least 1,000,000 or more, and a first melt temperature ($T_m$) greater than the 335° C., typically much greater than 335° C. These high molecular weight PTFE dispersions are typically stabilized with a traditional surfactant present in an amount greater than 1.0 wt. %, typically much greater than 1.0 wt. %.

Additionally, these types of LPTFE dispersions are also distinct from high molecular weight PTFE dispersions that are produced via dispersion or emulsion polymerization and thereafter coagulated or agglomerated.

Still further, these types of LPTFE dispersions are distinct from high molecular weight PTFE dispersions that are produced via dispersion or emulsion polymerization and thereafter coagulated or agglomerated, and then are subjected to thermal degradation or irradiation to form low molecular weight PTFE powders, known in the art as PTFE micropowders, which are provided as solid powders having a particle size between 0.2 and 20 microns (µm), such as for use in extrusion and other applications. Examples of PTFE micropowders include Zonyl® MP1000, MP1100, MP1500 and MP1600 resins, available from DuPont (Zonyl® is a registered trademark of E.I. du Pont de Nemours & Co.). However, as discussed below, these types of LPTFE micropowders may also be used in the present invention.

Third, these types of LPTFE dispersions are distinct from LPTFE micropowders that are polymerized via dispersion or emulsion polymerization in the presence of chain transfer agents, and then are agglomerated to form PTFE micropowders having an average particle size of between 0.2 and 20 microns (µm), for example.

ii. LPTFE Micropowders.

In a second embodiment of the present invention, the LPTFE may be in the form of an LPTFE micropowder.

A first type of LPTFE micropowders are derived from high molecular weight PTFE dispersions that are produced via dispersion or emulsion polymerization and thereafter coagulated or agglomerated, and then subjected to thermal degradation or irradiation to form low molecular weight PTFE powders, known in the art as PTFE micropowders and referred to herein as LPTFE micropowders, which are typically provided as solid powders having a particle size typically between 0.2 and 20 microns (µm).

Examples of these types of LPTFE micropowders include Zonyl® MP1000, MP1100, MP1500 and MP1600 resins, available from DuPont (Zonyl® is a registered trademark of E.I. du Pont de Nemours & Co.); and MP-25, MP-55, and UF 8TA, each available from Laurel Products.

A second type of LPTFE micropowders are derived from high molecular weight granular PTFE resins that have been degraded by irradiation or thermal degradation to form low molecular weight materials known as granular PTFE micropowders, which typically have a particle size ranging typically between 2 and 20 microns (μm).

Examples of these types of LPTFE micropowders include Zonyl® MP1200, MP1300, and MP1400 resins, available from DuPont (Zonyl® is a registered trademark of E.I. du Pont de Nemours & Co.) and MP-8T and MP-10, available from Laurel Products.

A third type of these types LPTFE micropowders are polymerized via dispersion or emulsion or suspension polymerization in the presence of chain transfer agents, and then may be agglomerated to form LPTFE micropowders having an average particle size of typically between 0.2 and 20 microns (μm), for example.

B. Melt Processible Fluoropolymers (MPF).

The second fluoropolymer of the blended fluoropolymer composition may be a liquid dispersion of one or more melt processible fluoropolymers (MPF), such as perfluoroalkoxy (PFA) (copolymers of tetrafluoroethylene (TFE) and perfluoroalkylvinyl ethers), including methylfluoroalkoxy (MFA) (a copolymer of tetrafluoroethylene (TFE) and perfluoromethylvinyl ether (PMVE)) and ethylfluoroalkoxy (EFA) (a copolymer of tetrafluoroethylene (TFE) and perfluoroethylvinyl ether (PEVE)); and fluorinated ethylene propylene (FEP), for example.

The MPF may be produced by a polymerization process that is well known in the art as dispersion polymerization or emulsion polymerization. These polymerization processes may be conducted with chain transfer agents, which reduce the average molecular weight of the fluoropolymers produced, and/or via other methods whereby the polymerization process is controlled to form a liquid dispersion of directly polymerized particles of MPF.

In most embodiments, the MPF, after being produced by dispersion polymerization or emulsion polymerization, is thereafter not agglomerated, irradiated, or thermally degraded. In particular, the MPF will not have been subjected to any agglomeration steps during its manufacture, and therefore retains a small mean particle size as described below.

The liquid dispersion of MPF in most embodiments will be an aqueous dispersion, though the MPF may be dispersed in other solvents and/or MPF originally in an aqueous phase may be phase transferred into another solvent, such as organic solvents including hexane, acetone, or an alcohol.

The MPF, when produced as described above, will typically have a mean particle size of 1.0 microns (μm) or less, 0.9 microns (μm) or less, 0.75 microns (μm) or less, 0.5 microns (μm) or less, 0.4 microns (μm) or less, 0.3 microns (μm) or less, or 0.2 microns (μm) or less. In particular, the MPF may have a mean particle size as low as 30, 50, 100, or 150 nm, or as large as 200, 250, or 350 nm, for example.

In other embodiments, MPF powders could also be used.

The MPF may be provided in the form of an aqueous dispersion which is stabilized, unstabilized, or minimally stabilized. As used herein, "unstabilized" or "minimally stabilized" refers to an aqueous dispersion that includes less than 1.0 wt. % of a traditional surfactant, such as non-ionic surfactant or an anionic surfactant, based on the weight of the MPF aqueous dispersion. In some embodiments, the MPF dispersion may be provided in the form of an aqueous dispersion having less than 1.0 wt. % surfactant, less than 0.8 wt. % surfactant, less than 0.6 wt. % surfactant, or even less than 0.5 wt. % surfactant. In other embodiments, the MPF dispersion may be provided in the form of an aqueous dispersion that is "stabilized", typically having 1-12 wt. % surfactant.

Typically, the melt flow rate (MFR) of the MPF will be greater than 0.5 g/10 min and, in one embodiment, may be about 2 g/10 min or higher, as determined by ASTM D1238.

Also, the MPF will typically have a co-monomer content, i.e., a content of one or more monomers other than tetrafluoroethylene (TFE), of about 3.0 wt. % or greater, such as 4.0 wt. % or greater, 4.5 wt. % or greater, 5.0 wt. % or greater, 5.5 wt. % or greater, or 6.0 wt. % or greater.

Suitable MPF dispersions include TE7224 (PFA), available from DuPont, 6900Z (PFA), available from Dyneon LLC, TE9568 (FEP), available from DuPont, Neoflon ND-110 (FEP), available from Daikin, and Hyflon XPH 6202-1 (MFA), available from Solvay. These MPF dispersions have characteristics set forth in Table 2 below:

TABLE 2

Characteristics of exemplary melt processible fluoropolymers (MPF)

| MPF (type) | Solids content (wt. %) | Mean particle size (μm) | Melt flow rate (MFR) (g/10 min) | First melt temperature (DSC) (° C.) |
|---|---|---|---|---|
| DuPont TE7224 (PFA) | 58.6 | 0.26 | 2.4 | 313.0 (shoulder 321.2) |
| Dyneon 6900Z (PFA) | 49.4 | 0.31 | 19.4 | 310.25 |
| DuPont TE9568 (FEP) | 55.6 | 0.17 | 11.9 | 257.84 |
| Daikin Neoflon ND-110 (FEP) | 56.5 | 0.16 | — | 232.83 |
| Solvay Hyflon XPH 6202-1 (MFA) | 27.2 | 0.28 | 4.5 | 306.31 (shoulder 287.29) |

C. LPTFE/MPF Blend Compositions.

To form the blended fluoropolymer composition compositions of the present invention, a LPTFE liquid dispersion and a MPF liquid dispersion are blended together. When liquid dispersions are used, the dispersions may have varying solids contents, and one of ordinary skill in the art will recognize that the wet weights of the liquid LPTFE and MPF dispersions may be selected based on the solids contents of the dispersions and the desired relative weight percent ratio of the LPTFE and MPF that is desired in the resulting blended compositions.

Notably, when the LPTFE and the MPF are provided in the form of liquid dispersions having the small mean particle sizes set forth above, upon blending of the dispersions particles of the LPTFE and MPF are brought into contact with each other at the submicron level, prior to later processing steps in which the dispersions are dried or melted, for example. As discussed above, the LPTFE and MPF are, in one embodiment, not agglomerated prior to blending, such that the submicron interaction of the LPTFE and MPF is thought to facilitate the formation of a specific crystalline form of the dried or cured fluoropolymer blend that is believed to be important to achieving the beneficial results obtained with the present blended compositions. Although blending of the components in the liquid state is desirable in many applications, for other applications, powder blends are also desirable, as demonstrated in the present Examples by the effectiveness of micropowders when employed as the LPTFE component.

The relative ratios, fractions, or weight percents of the LPTFE and MPF in the blended fluoropolymer compositions described below are based on the total solids weight of the LPTFE and MPF fluoropolymers, excluding other fluoropolymers other than LPTFE and MPF as well as non-fluororopolymer components that may be present, such as water or other solvents, surfactants, pigments, fillers, and other compositions.

The LPTFE may comprise as little as 5 wt. %, 10 wt. %, or 15 wt. %, or as much as 85 wt. %, 90 wt. %, or 95 wt. % by weight of the blended fluoropolymer composition. In one embodiment, the LPTFE may comprise between 40 wt. % and 60 wt. % of the blended composition, such as 50 wt. % of the blended fluoropolymer composition. The MPF may comprise as much as 85 wt. %, 90 wt. %, or 95 wt. %, or as little as 5 wt. %, 10 wt. %, or 15 wt. % by weight of the blended fluoropolymer composition. In one embodiment, the MPF may comprise between 40 wt. % and 60 wt. % of the blended fluoropolymer composition, such as 50 wt. % of the blended composition.

Blends of LPTFE and MFA may include, in one embodiment, from 35 wt. % to 90 wt. % MFA and from 10 wt. % to 65 wt. % LPTFE. In another embodiment, such blends may include from 35 wt. % to 76 wt. % MFA and from 24 wt. % to 65 wt. % LPTFE. In another embodiment, such blends may include from 56 wt. % to 76 wt. % MFA and from 24 wt. % to 44 wt. % LPTFE. In another embodiment, such blends may include from 63 wt. % to 70 wt. % MFA and from 30 wt. % to 37 wt. % LPTFE. In a further embodiment, such blends may include 67 wt. % MFA and 33 wt. % LPTFE.

Blends of LPTFE and FEP may include, in one embodiment, from 25 wt. % to 90 wt. % FEP and from 10 wt. % to 75 wt. % LPTFE. In another embodiment, such blends may include from 35 wt. % to 90 wt. % FEP and from 10 wt. % to 65 wt. % LPTFE. In another embodiment, such blends may include either from 35 wt. % to 55 wt. % FEP and from 45 wt. % to 65 wt. % LPTFE, or from 60 wt. % to 90 wt. % FEP and from 10 wt. % to 40 wt. % LPTFE. In another embodiment, such blends may include either from 40 wt. % to 50 wt. % FEP and from 50 wt. % to 60 wt. % LPTFE, or from 75 wt. % to 85 wt. % FEP and from 15 wt. % to 25 wt. % LPTFE. In a further embodiment, such blends may include either 50 wt. % FEP and 50 wt. % LPTFE, or 75 wt. % FEP and 25 wt. % LPTFE.

Blends of LPTFE and PFA may include, in one embodiment, from 37 wt. % to 80 wt. % PFA and from 20 wt. % to 63 wt. % LPTFE. In another embodiment, such blends may include from 37 wt. % to 65 wt. % PFA and from 35 wt. % to 63 wt. % LPTFE. In another embodiment, such blends may include from 43 wt. % to 63 wt. % PFA and from 37 wt. % to 57 wt. % LPTFE. In another embodiment, such blends may include from 50 wt. % to 60 wt. % PFA and from 40 wt. % to 50 wt. % LPTFE. In a further embodiment, such blends may include 53 wt. % PFA and 47 wt. % LPTFE.

When aqueous dispersions are used, the dispersions may have varying solids contents. The wet weights of the aqueous dispersions of the first and second fluoropolymers to be blended are selected based on the solids contents of the dispersions and the desired relative weight percents of the fluoropolymers. Powders of the fluoropolymers may also be blended and then, if desired, dispersed.

The coating compositions described herein may also include suitable additives, such as surfactants, fillers, reinforcement additives, and pigments, if desired.

The coating compositions can be prepared by any standard formulation technique such as simple addition and low shear mixing. The coating compositions may be applied over a primer and/or midcoat by any known technique, and are then cured to provide a coated flexible substrate with a coating having improvements in abrasion resistance and release characteristics. The particular compositions of the primer and/or midcoat may vary widely, and are not thought to be critical with respect to the improved properties demonstrated by the coatings disclosed herein. However, as has been observed in connection with Example 7 below, improved resistance to oil and grease ingress may be obtained when no primer or midcoat is used under the present coating.

The coatings may be applied to a dry film thickness (DFT) of between 15 and 80 microns, depending on the application, and may be cured at a temperature above about 400° C. for between 2 and 10 minutes, depending on the applied thickness. Depending on the application and degree of thickness desired, the coatings may be applied in several layers.

II. Second Embodiment

In a second embodiment, the composition includes a fluoropolymer base component, such as a high molecular weight polytetrafluoroethylene (HPTFE), together with an amount of the above-described LPTFE/MPF blended fluoropolymer composition.

A. Fluoropolymer Base Component.

The fluoropolymer base component includes at least one fluoropolymer, such as polytetrafluoroethylene (PTFE), co-polymers of tetrafluoroethlyene and ethylene (ETFE), co-polymers of tetrafluoroethlyene and perfluoro(alkyl vinyl ethers) (PAVE), co-polymers of tetrafluoroethylene and per-fluoro(ethyl vinyl ether) (PEVE), co-polymers of tetrafluoroethylene and perfluoro(propyl vinyl ether) (PPVE), co-polymers of tetrafluoroethlyene and perfluoro(methyl vinyl ether) (PMVE), co-polymers of tetrafluoroethylene and hexafluoropropylene (FEP), co-polymers of tetrafluoroethylene and perfluoroalkoxy (PFA) and polyvinylidene fluoride (PVDF), and co-polymers of tetrafluoroethylene, hexafluoropropylene, and vinylidene difluoride (THV), and other perfluorinated polymers. Fluoroelastomers based on PTFE may also be used.

Typically, the fluoropolymer base component will be one or more perfluorinated fluoropolymers and, in particular, will be one or more traditional high molecular weight PTFE (HPTFE) components.

The number average molecular weight ($M_n$) of the HPTFE is typically at least 500,000, and may be at least 1,000,000, and suitable HPTFE in the form of liquid dispersions and/or powders are available from many commercial sources. Liquid HPTFE dispersions typically include surfactants for stability, though "unstabilized" HPTFE dispersions, typically having less than 1.0 wt. % surfactant, are also available and may also be used. When a powder is used, the powder will typically be dispersed in a liquid to prepare the coating composition.

In some embodiments, the HPTFE may include a small amount of modifying co-monomer, in which case the HPTFE is a co-polymer known in the art as "modified PTFE" or "trace modified PTFE". Examples of the modifying co-monomer include perfluoropropylvinylether (PPVE), other modifiers, such as hexafluoropropylene (HFP), chlorotrifluoroethylene (CTFE), perfluorobutylethylene (PFBE), or other perfluoroalkylvinylethers, such as perfluoromethylvinylether (PMVE) or perfluoroethylvinylether (PEVE). The modifying co-monomer will typically be present in an amount less than 1% by weight, for example, based on the weight of the HPTFE.

B. LPTFE/MPF Blend Compositions.

The LPTFE/MPF blend compositions are those describe above with respect to the first embodiment.

C. HPTFE/LPTFE/MPF Blend Compositions.

To form the present composition, aqueous dispersions of the components of the present coating composition may be blended in any order with slow stirring, for example, or via another low or medium shear method which minimizes the potential for agglomeration, coaglulation, or fibrillation of the fluoropolymer particles. When liquid dispersions are used, the dispersions may have varying solids contents, and one of ordinary skill in the art will recognize that the wet weights of the liquid HPTFE, LPTFE and MPF dispersions may be selected based on the solids contents of the dispersions and the desired relative weight percent ratios of the HPTFE, LPTFE and MPF that are desired in the resulting blended compositions.

In one embodiment, based on the solids content of all fluoropolymer components of the present compositions, the fluoropolymer base component is present in an amount of as little as 1 wt. %, 2 wt. % 4 wt. %, 10 wt. %, 30 wt. %, 35 wt. %, 40 wt. %, 45 wt. %, 55 wt. %, 60 wt. %, or 70 wt. %, or as great as 80 wt. %, 90 wt. %, 95 wt. %, 96 wt. %, or 98 wt. %, or within a range defined between any pair of the foregoing values, with each or both of the components of the blended fluoropolymer composition present in an amount of as little as 1 wt. %, 2 wt. %, 4 wt. %, 5 wt. %, 10 wt. %, or 20 wt. %, or as great as 30 wt. %, 40 wt. %, 45 wt. %, 55 wt. %, 60 wt. %, 65 wt. %, 70 wt. %, 96 wt. %, 98 wt. %, or 99 wt. %, or within a range defined between any pair of the foregoing values.

In particular embodiments, the fluoropolymer base component may be present in the composition in an amount of between 60 and 98 wt. %, between 70 and 98 wt. %, or between 82 and 96 wt. %, for example, based on the total weight of all fluoropolymers in the composition. The LPTFE/MPF blended fluoropolymer may be present in a corresponding amount of between 2 and 40 wt. %, between 2 and 30 wt. %, or between 4 and 18 wt. %, for example, based on the total weight of all fluoropolymers in the composition.

With respect to the amounts of LPTFE and MPF relative to one another, in particular embodiments, the LPTFE may be present in an amount of between 33 wt. % and 66 wt. %, between 40 wt. % and 60 wt. %, between 45 wt. % and 55 wt. %, or present in an amount of 50 wt. %, based on the combined solids content of the LPTFE and MPF components, with the MPF present in a corresponding amount of between 33 wt. % and 66 wt. %, between 40 wt. % and 60 wt. %, between 45 wt. % and 55 wt. %, or present in an amount of 50 wt. %, based on the combined solids content of the LPTFE and MPF components. In other words, the LPTFE/MPF ratio may be between 2:1 and 1:2, between 1.5:1 and 1:1.5, between 1.2:1 and 1:1.2, or may be 1:1 based on the combined solids content of the LPTFE and MPF components.

When aqueous dispersions are used, the dispersions may have varying solids contents. The wet weights of the aqueous dispersions of the first and second fluoropolymers to be blended are selected based on the solids contents of the dispersions and the desired relative weight percents of the fluoropolymers. Powders of the fluoropolymers may also be blended and then dispersed.

The compositions described herein may also include suitable additives, such as surfactants, fillers, reinforcement additives, and pigments, if desired.

The compositions can be prepared by any standard formulation technique such as simple addition and low shear mixing. The compositions may be applied over a primer and/or midcoat or may be overcoated by any known technique, and are then cured to provide a coated flexible substrate with a coating having improvements in abrasion resistance and release characteristics. The particular compositions of the primer and/or midcoat may vary widely, and are not thought to be critical with respect to the improved properties demonstrated by the coatings disclosed herein. However, as has been observed in connection with Example 7 below, improved resistance to oil and grease ingress may be obtained when no primer or midcoat is used under the present coating.

The compositions may be applied to a dry film thickness (DFT) of between 15 and 80 microns, depending on the application, and may be cured at a temperature above about 400° C. for between 2 and 10 minutes, depending on the applied thickness. Depending on the application and degree of thickness desired, the compositions may be applied in several layers.

It has been found that blending of the dispersions facilitates interaction of the LPTFE and MPF, and of the HPTFE, LPTFE and MPF, on a submicron level to facilitate intimate blending such that, when the blended fluoropolymer composition is dried, a crystal structure representing a true alloy of the fluoropolymers is formed, having melt characteristics that differ from those of the individual fluoropolymers. The blended fluoropolymer composition may be used to provide a coating having improved abrasion resistance, gloss, adhesion, and higher contact angles.

III. Physical Properties

Coatings and films prepared from the compositions of the first and second embodiments described above may exhibit one or more of the following properties, together with additional properties, as evidenced by the following Examples.

The present composition, when applied to a flexible substrate, either directly to the flexible substrate or over an underlying coating, or formed into a film, exhibits a contact angle of at least 100°, and may have a contact angle of at least 110°, 120°, 125°, 130°, or 135°, for example, as measured for a water droplet according to the Young Relation. Contact angle may be measured according to ASTM D7334-08 with any suitable commercially available instrument, such as the "Drop Shape Analysis" system (DSA10), available from Kruss GmbH of Hamburg, Germany.

The present composition, when applied to a substrate, either directly to the substrate or over an underlying coating, or formed into a film, exhibits a surface roughness (Ra, arithmetic mean deviation of the roughness profile, measured in microns) of less than 1.5 microns, and may have a surface roughness of less than 1.3 microns, 1.2 microns, or 1.0 microns, for example, as determined according to EN ISO 13565 in Example 2 below.

The present composition, when applied to a flexible substrate, either directly to the flexible substrate or over an underlying coating, or formed into a film, exhibits a measured gloss, in % reflectance, of at least 15, and may have a measured gloss of at least 25, 30, 35, 40, or 45, for example, as measured at 60° with any suitable commercially available instrument, such as a Microgloss 60° glossmeter, available from Byk-Gardner, in accordance with the following standards: BS3900/D5, DIN EN ISO 2813, DIN 67530, EN ISO 7668, ASTM D523, ASTM D1455, ASTM C346, ASTM C584, ASTM D2457, JIS Z 8741, MFT 30064, TAPPI T 480. Units of measurement are expressed as % reflectance.

The present composition, when applied to a flexible substrate, either directly to the flexible substrate or over an underlying coating, or formed into a film, exhibits a light transmission, obtained in accordance with Example 6 below, of at least 60%, and may have a measured light transmission of at least 70%, at least 75%, or at least 80%, for example.

The present composition, when applied to a flexible substrate, either directly to the flexible substrate or over an underlying coating, exhibits adhesion, as obtained in accordance with Example 8 below, of at least 4 lb/f, at least 5 lb/f, at least 6 lb/f, or at least 7 lb/f instantaneous force, and/or at least 4 lb/f, at least 5 lb/f, at least 6 lb/f, or at least 7 lb/f kinetic force, as measured by the peel test described in Example 8 below.

EXAMPLES

The following non-limiting Examples illustrate various features and characteristics of the present invention, which is not to be construed as limited thereto. Throughout the Examples and elsewhere herein, percentages are by weight unless otherwise indicated.

Example 1

Exemplary Compositions and Application to a Flexible Substrate, e.g., Glasscloth In this Example, coatings were made from compositions of blended fluoropolymers in accordance with the first embodiment of present invention, and from high molecular weight PTFE (HPTFE) together with blended fluoropolymers in accordance with the second embodiment of present invention.

In this Example, these compositions were coated onto glasscloth over basecoats and/or midcoats, and the resulting coating systems were tested for abrasion resistance, release properties, and other properties in the remaining Examples.

The formulations of the basecoat and midcoats are set forth in Tables 3A and 3B, respectively, and are expressed as wet weight fractions whereas the topcoat components, set forth in Table 3C, are expressed as dry weight fractions.

TABLE 3A

| | Basecoat formulations | | | | | | | | |
|---|---|---|---|---|---|---|---|---|---|
| Coating # | Grade of glass cloth substrate | PTFE | PFA | FEP | LPTFE | THV | Water | Solids | # of passes |
| F(Control A) | 2116 | 0.5 | 0 | 0 | 0 | 0 | 0.5 | 30 | 2 |
| F(Control B) | 2116 | 0.5 | 0 | 0 | 0 | 0 | 0.5 | 30 | 2 |
| F(1) | 2116 | 0.5 | 0 | 0 | 0 | 0 | 0.5 | 30 | 2 |
| F(2) | 2116 | 0.5 | 0 | 0 | 0 | 0 | 0.5 | 30 | 2 |
| F(3) | 2116 | 0.5 | 0 | 0 | 0 | 0 | 0.5 | 30 | 2 |
| F(4) | 2116 | 0.5 | 0 | 0 | 0 | 0 | 0.5 | 30 | 2 |
| F(5) | 2116 | 0.5 | 0 | 0 | 0 | 0 | 0.5 | 30 | 2 |
| F(6) | 2116 | 0.5 | 0 | 0 | 0 | 0 | 0.5 | 30 | 2 |
| F(7) | 7628 | 0.5 | 0 | 0 | 0 | 0 | 0.5 | 30 | 3 |
| F(8) | 7628 | 0.5 | 0 | 0 | 0 | 0 | 0.5 | 30 | 3 |
| F(9) | 7628 | 0.5 | 0 | 0 | 0 | 0 | 0.5 | 30 | 3 |
| F(10) | 7628 | 0.425 | 0 | 0 | 0 | 0.05 (with 0.025 x-link agent) | 0.5 | 30 | 3 |
| F(11) | 7628 | 0.425 | 0 | 0 | 0 | 0.05 (with 0.025 x-link agent) | 0.5 | 30 | 3 |
| F(Control 12) | 7628 | 0.5 | 0 | 0 | 0 | 0 | 0.5 | 30 | 3 |
| F(13) | 7628 | 0.5 | 0 | 0 | 0 | 0 | 0.5 | 30 | 3 |
| F(13 recured) | 7628 | 0.5 | 0 | 0 | 0 | 0 | 0.5 | 30 | 3 |
| F(14) | 7628 | 0.5 | 0 | 0 | 0 | 0 | 0.5 | 30 | 3 |
| F(14 recured) | 7628 | 0.5 | 0 | 0 | 0 | 0 | 0.5 | 30 | 3 |
| F(15) | 1080 | 0.45 | 0.0265 | 0 | 0.0235 | 0 | 0.5 | 30 | 1 |
| F(16) | 2116 | 0.45 | 0.0265 | 0 | 0.0235 | 0 | 0.5 | 30 | 2 |
| F(CONTROL 17) | 1080 | 0.5 | 0 | 0 | 0 | 0 | 0.5 | 30 | 1 |
| F(CONTROL 18) | 2116 | 0.5 | 0 | 0 | 0 | 0 | 0.5 | 30 | 2 |
| F(CONTROL 19) | 2116 | 0.5 | 0 | 0 | 0 | 0 | 0.5 | 30 | 2 |
| F(CONTROL 20) | 7628 | 0.5 | 0 | 0 | 0 | 0 | 0.5 | 30 | 3 |
| F(21) | 7628 | 0.5 | 0 | 0 | 0 | 0 | 0.5 | 30 | 3 |
| F(21 recure) | 7628 | 0.5 | 0 | 0 | 0 | 0 | 0.5 | 30 | 3 |
| F(22) | 7628 | 0.5 | 0 | 0 | 0 | 0 | 0.5 | 30 | 3 |
| F(22 recure) | 7628 | 0.5 | 0 | 0 | 0 | 0 | 0.5 | 30 | 3 |

TABLE 3A-continued

Basecoat formulations

| Coating # | Grade of glass cloth substrate | PTFE | PFA | FEP | LPTFE | THV | Water | Solids | # of passes |
|---|---|---|---|---|---|---|---|---|---|
| F(23) | 7628 | 0.5 | 0 | 0 | 0 | 0 | 0.5 | 30 | 3 |
| F(23 recure) | 7628 | 0.5 | 0 | 0 | 0 | 0 | 0.5 | 30 | 3 |
| F(24) | 7628 | 0.5 | 0 | 0 | 0 | 0 | 0.5 | 30 | 3 |
| F(24 recure) | 7628 | 0.5 | 0 | 0 | 0 | 0 | 0.5 | 30 | 3 |
| F(25) | 7628 | 0.5 | 0 | 0 | 0 | 0 | 0.5 | 30 | 3 |
| F(25 recure) | 7628 | 0.5 | 0 | 0 | 0 | 0 | 0.5 | 30 | 3 |
| F(26) | 2116 | 0.5 | 0 | 0 | 0 | 0 | 0.5 | 30 | 2 |
| F(27) | 2116 | 0.5 | 0 | 0 | 0 | 0 | 0.5 | 30 | 2 |
| F(28) | 2116 | 0.5 | 0 | 0 | 0 | 0 | 0.5 | 30 | 2 |
| F(29) | 2116 | 0.5 | 0 | 0 | 0 | 0 | 0.5 | 30 | 2 |
| F(30) | 2116 | 0.45 | 0 | 0.025 | 0.025 | 0 | 0.5 | 30 | 2 |
| F(31) | 2116 | 0.45 | 0 | 0.037 | 0.0125 | 0 | 0.5 | 30 | 2 |
| F(Control 32) | 2116 | 0.5 | 0 | 0 | 0 | 0 | 0.5 | 30 | 2 |
| F(33) | 7628 | 0.45 | 0.026 | 0 | 0.0235 | 0 | 0.5 | 30 | 3 |
| F(34) | 2116 | 0.5 | 0 | 0 | 0 | 0 | 0.5 | 30 | 2 |
| F(35) | 2116 | 0.5 | 0 | 0 | 0 | 0 | 0.5 | 30 | 2 |
| F(36) | 2116 | 0.5 | 0 | 0 | 0 | 0 | 0.5 | 30 | 2 |
| F(37) | 2116 | 0.5 | 0 | 0 | 0 | 0 | 0.5 | 30 | 2 |
| F(38) | 2116 | 0.5 | 0 | 0 | 0 | 0 | 0.5 | 30 | 2 |
| F(39) | 2116 | 0.5 | 0 | 0 | 0 | 0 | 0.5 | 30 | 2 |
| F(40) | 2116 | 0.5 | 0 | 0 | 0 | 0 | 0.5 | 30 | 2 |
| F(41) | 2116 | 0.5 | 0 | 0 | 0 | 0 | 0.5 | 30 | 2 |
| F(42) | 2116 | 0.5 | 0 | 0 | 0 | 0 | 0.5 | 30 | 2 |
| F(43) | 2116 | 0.5 | 0 | 0 | 0 | 0 | 0.5 | 30 | 2 |
| F(44) | 2116 | 0.5 | 0 | 0 | 0 | 0 | 0.5 | 30 | 2 |
| F(45) | 2116 | 0.5 | 0 | 0 | 0 | 0 | 0.5 | 30 | 2 |
| F(Control 46) | 7628-577 finish | 0.5 | 0 | 0 | 0 | 0 | 0.5 | 30 | 3 |
| F(47) | 2116 | 0.5 | 0 | 0 | 0 | 0 | 0.5 | 30 | 2 |
| F(48) | 2116 | 0.5 | 0 | 0 | 0 | 0 | 0.5 | 30 | 2 |
| F(49) | 2116 | 1 | 0 | 0 | 0 | 0 | 0.5 | 30 | 2 |
| F(50) | 2116 | 1 | 0 | 0 | 0 | 0 | 0.5 | 30 | 2 |
| F(51) | 2116 | 1 | 0 | 0 | 0 | 0 | 0.5 | 30 | 2 |
| F(52) | 2116 | 1 | 0 | 0 | 0 | 0 | 0.5 | 30 | 2 |
| F(53) | 2116 | 1 | 0 | 0 | 0 | 0 | 0.5 | 30 | 2 |
| F(54) | 2116 | 1 | 0 | 0 | 0 | 0 | 0.5 | 30 | 2 |
| F(55) | 2116 | 1 | 0 | 0 | 0 | 0 | 0.5 | 30 | 2 |
| F(56) | 2116 | 1 | 0 | 0 | 0 | 0 | 0.5 | 30 | 2 |
| F(57) | 2116 | 1 | 0 | 0 | 0 | 0 | 0.5 | 30 | 2 |
| F(58) | 2116 | 1 | 0 | 0 | 0 | 0 | 0.5 | 30 | 2 |
| F(59) | 2116 | 1 | 0 | 0 | 0 | 0 | 0.5 | 30 | 2 |
| F(60) | 2116 | 1 | 0 | 0 | 0 | 0 | 0.5 | 30 | 2 |
| F(61) | 2116 | 1 | 0 | 0 | 0 | 0 | 0.5 | 30 | 2 |
| F(62) | 2116 | 1 | 0 | 0 | 0 | 0 | 0.5 | 30 | 2 |
| F(63) | 2116 | 1 | 0 | 0 | 0 | 0 | 0.5 | 30 | 2 |
| F(64) | 2116 | 1 | 0 | 0 | 0 | 0 | 0.5 | 30 | 2 |
| F(65) | 2116 | 1 | 0 | 0 | 0 | 0 | 0.5 | 30 | 2 |

TABLE 3B

Midcoat formulations

| Coating # | PTFE | PFA | FEP | LPTFE | THV | PAI | PPS | Ceramic | Water | Solids | # of passes |
|---|---|---|---|---|---|---|---|---|---|---|---|
| F(Control A) | 0.92 | 0 | 0 | 0 | 0 | 0 | 0 | 0 | 0.08 | 50 | 2 |
| F(Control B) | 0.92 | 0 | 0 | 0 | 0 | 0 | 0 | 0 | 0.08 | 50 | 2 |
| F(1) | 0.92 | 0 | 0 | 0 | 0 | 0 | 0 | 0 | 0.08 | 50 | 2 |
| F(2) | 0.92 | 0 | 0 | 0 | 0 | 0 | 0 | 0 | 0.08 | 50 | 2 |
| F(3) | 0.92 | 0 | 0 | 0 | 0 | 0 | 0 | 0 | 0.08 | 50 | 2 |
| F(4) | 0.92 | 0 | 0 | 0 | 0 | 0 | 0 | 0 | 0.08 | 50 | 2 |
| F(5) | 0.92 | 0 | 0 | 0 | 0 | 0 | 0 | 0 | 0.08 | 50 | 2 |
| F(6) | 0.92 | 0 | 0 | 0 | 0 | 0 | 0 | 0 | 0.08 | 50 | 2 |
| F(7) | 0.92 | 0 | 0 | 0 | 0 | 0 | 0 | 0 | 0.08 | 50 | 2 |

TABLE 3B-continued

Midcoat formulations

| Coating # | PTFE | PFA | FEP | LPTFE | THV | PAI | PPS | Ceramic | Water | Solids | # of passes |
|---|---|---|---|---|---|---|---|---|---|---|---|
| F(8) | 0.92 | 0 | 0 | 0 | 0 | 0 | 0 | 0 | 0.08 | 50 | 2 |
| F(9) | 0.92 | 0 | 0 | 0 | 0 | 0 | 0 | 0 | 0.08 | 50 | 2 |
| F(10) | 0.4 | 0 | 0 | 0 | 0.1 (with 0.05 x-link agent) | 0.1 | 0.2 | 0.05 | 0.1 | 50 | 2 |
| F(11) | 0.4 | 0 | 0 | 0 | 0.1 (with 0.05 x-link agent) | 0.1 | 0.2 | 0.05 | 0.1 | 50 | 3 |
| F(Control 12) | 0.92 | 0 | 0 | 0 | 0 | 0 | 0 | 0 | 0.08 | 50 | 3 |
| F(13) | 0.92 | 0 | 0 | 0 | 0 | 0 | 0 | 0 | 0.08 | 50 | 3 |
| F(13 recured) | 0.92 | 0 | 0 | 0 | 0 | 0 | 0 | 0 | 0.08 | 50 | 3 |
| F(14) | 0.4 | 0 | 0 | 0 | 0.1 (with 0.05 x-link agent) | 0.1 | 0.2 | 0.05 | 0.1 | 50 | 2 |
| F(14 recured) | 0.4 | 0 | 0 | 0 | 0.1 (with 0.05 x-link agent) | 0.1 | 0.2 | 0.05 | 0.1 | 50 | 2 |
| F(15) | 0.4 | 0 | 0 | 0 | 0.1 (with 0.05 x-link agent) | 0.1 | 0.2 | 0.05 | 0.1 | 50 | 1 |
| F(16) | 0.4 | 0 | 0 | 0 | 0.1 (with 0.05 x-link agent) | 0.1 | 0.2 | 0.05 | 0.1 | 50 | 2 |
| F(Control 17) | 0.92 | 0 | 0 | 0 | 0 | 0 | 0 | 0 | 0.08 | 50 | 1 |
| F(Control 18) | 0.92 | 0 | 0 | 0 | 0 | 0 | 0 | 0 | 0.08 | 50 | 2 |
| F(Control 19) | 0.92 | 0 | 0 | 0 | 0 | 0 | 0 | 0 | 0.08 | 50 | 2 |
| F(Control 20) | 0.8 | 0 | 0 | 0 | 0 | 0 | 0 | 0.1 | 0.1 | 50 | 3 |
| F(21) | 0.8 | 0 | 0 | 0 | 0 | 0 | 0 | 0.1 | 0.1 | 50 | 3 |
| F(21 recure) | 0.8 | 0 | 0 | 0 | 0 | 0 | 0 | 0.1 | 0.1 | 50 | 3 |
| F(22) | 0.8 | 0 | 0 | 0 | 0 | 0 | 0 | 0.1 | 0.1 | 50 | 3 |
| F(22 recure) | 0.8 | 0 | 0 | 0 | 0 | 0 | 0 | 0.1 | 0.1 | 50 | 3 |
| F(23) | 0.8 | 0 | 0 | 0 | 0 | 0 | 0 | 0.1 | 0.1 | 50 | 3 |
| F(23 recure) | 0.8 | 0 | 0 | 0 | 0 | 0 | 0 | 0.1 | 0.1 | 50 | 3 |
| F(24) | 0.8 | 0 | 0 | 0 | 0 | 0 | 0 | 0.1 | 0.1 | 50 | 3 |
| F(24 recure) | 0.8 | 0 | 0 | 0 | 0 | 0 | 0 | 0.1 | 0.1 | 50 | 3 |
| F(25) | 0.8 | 0 | 0 | 0 | 0 | 0 | 0 | 0.1 | 0.1 | 50 | 3 |
| F(25 recure) | 0.8 | 0 | 0 | 0 | 0 | 0 | 0 | 0.1 | 0.1 | 50 | 3 |
| F(26) | 0.92 | 0 | 0 | 0 | 0 | 0 | 0 | 0 | 0.08 | 50 | 2 |
| F(27) | 0.92 | 0 | 0 | 0 | 0 | 0 | 0 | 0 | 0.08 | 50 | 2 |
| F(28) | 0.92 | 0 | 0 | 0 | 0 | 0 | 0 | 0 | 0.08 | 50 | 2 |
| F(29) | 0.92 | 0 | 0 | 0 | 0 | 0 | 0 | 0 | 0.08 | 50 | 2 |
| F(30) | 0.92 | 0 | 0 | 0 | 0 | 0 | 0 | 0 | 0.08 | 50 | 2 |
| F(31) | 0.92 | 0 | 0 | 0 | 0 | 0 | 0 | 0 | 0.08 | 50 | 2 |
| F(Control 32) | 0.92 | 0 | 0 | 0 | 0 | 0 | 0 | 0 | 0.08 | 50 | 2 |
| F(33) | 0.9 | 0.053 | 0 | 0.047 | 0 | 0 | 0 | 0 | 0.08 | 50 | 3 |
| F(34) | 0.92 | 0 | 0 | 0 | 0 | 0 | 0 | 0 | 0.08 | 50 | 2 |
| F(35) | 0.92 | 0 | 0 | 0 | 0 | 0 | 0 | 0 | 0.08 | 50 | 2 |
| F(36) | 0.92 | 0 | 0 | 0 | 0 | 0 | 0 | 0 | 0.08 | 50 | 2 |
| F(37) | 0.92 | 0 | 0 | 0 | 0 | 0 | 0 | 0 | 0.08 | 50 | 2 |
| F(38) | 0.92 | 0 | 0 | 0 | 0 | 0 | 0 | 0 | 0.08 | 50 | 2 |
| F(39) | 0.92 | 0 | 0 | 0 | 0 | 0 | 0 | 0 | 0.08 | 50 | 2 |

TABLE 3B-continued

Midcoat formulations

| Coating # | PTFE | PFA | FEP | LPTFE | THV | PAI | PPS | Ceramic | Water | Solids | # of passes |
|---|---|---|---|---|---|---|---|---|---|---|---|
| F(40) | 0.92 | 0 | 0 | 0 | 0 | 0 | 0 | 0 | 0.08 | 50 | 2 |
| F(41) | 0.92 | 0 | 0 | 0 | 0 | 0 | 0 | 0 | 0.08 | 50 | 2 |
| F(42) | 0.92 | 0 | 0 | 0 | 0 | 0 | 0 | 0 | 0.08 | 50 | 2 |
| F(43) | 0.92 | 0 | 0 | 0 | 0 | 0 | 0 | 0 | 0.08 | 50 | 2 |
| F(44) | 0.92 | 0 | 0 | 0 | 0 | 0 | 0 | 0 | 0.08 | 50 | 2 |
| F(45) | 0.92 | 0 | 0 | 0 | 0 | 0 | 0 | 0 | 0.08 | 50 | 2 |
| F(Control 46) | 0.92 | 0 | 0 | 0 | 0 | 0 | 0 | 0 | 0.08 | 50 | 2 |
| F(47) | 0.92 | 0 | 0 | 0 | 0 | 0 | 0 | 0 | 0.08 | 50 | 2 |
| F(48) | 0.92 | 0 | 0 | 0 | 0 | 0 | 0 | 0 | 0.08 | 50 | 2 |
| F(49) | 0.92 | 0 | 0 | 0 | 0 | 0 | 0 | 0 | 0.08 | 50 | 2 |
| F(50) | 0.92 | 0 | 0 | 0 | 0 | 0 | 0 | 0 | 0.08 | 50 | 2 |
| F(51) | 0.92 | 0 | 0 | 0 | 0 | 0 | 0 | 0 | 0.08 | 50 | 2 |
| F(52) | 0.92 | 0 | 0 | 0 | 0 | 0 | 0 | 0 | 0.08 | 50 | 2 |
| F(53) | 0.92 | 0 | 0 | 0 | 0 | 0 | 0 | 0 | 0.08 | 50 | 2 |
| F(54) | 0.92 | 0 | 0 | 0 | 0 | 0 | 0 | 0 | 0.08 | 50 | 2 |
| F(55) | 0.92 | 0 | 0 | 0 | 0 | 0 | 0 | 0 | 0.08 | 50 | 2 |
| F(56) | 0.92 | 0 | 0 | 0 | 0 | 0 | 0 | 0 | 0.08 | 50 | 2 |
| F(57) | 0.92 | 0 | 0 | 0 | 0 | 0 | 0 | 0 | 0.08 | 50 | 2 |
| F(58) | 0.92 | 0 | 0 | 0 | 0 | 0 | 0 | 0 | 0.08 | 50 | 2 |
| F(59) | 0.92 | 0 | 0 | 0 | 0 | 0 | 0 | 0 | 0.08 | 50 | 2 |
| F(60) | 0.92 | 0 | 0 | 0 | 0 | 0 | 0 | 0 | 0.08 | 50 | 2 |
| F(61) | 0.92 | 0 | 0 | 0 | 0 | 0 | 0 | 0 | 0.08 | 50 | 2 |
| F(62) | 0.92 | 0 | 0 | 0 | 0 | 0 | 0 | 0 | 0.08 | 50 | 2 |
| F(63) | 0.92 | 0 | 0 | 0 | 0 | 0 | 0 | 0 | 0.08 | 50 | 2 |
| F(64) | 0.92 | 0 | 0 | 0 | 0 | 0 | 0 | 0 | 0.08 | 50 | 2 |
| F(65) | 0.92 | 0 | 0 | 0 | 0 | 0 | 0 | 0 | 0.08 | 50 | 2 |

TABLE 3C

Topcoat formulations

| Coating # | Base Coat | Mid Coat | Top Coat (PTFE) | Top coat (MFA) | Top Coat (PFA) | Top Coat (FEP) | Top Coat (LPTFE) | Top Coat (MP) | # of Topcoats Applied | Coating Weight |
|---|---|---|---|---|---|---|---|---|---|---|
| F(control A) | PTFE | PTFE | 1 | 0 | 0 | 0 | 0 | 0 | 0 | 248 |
| F(control B) | PTFE | PTFE | 1 | 0 | 0 | 0 | 0 | 0 | 0 | 280 |
| F(1) | PTFE | PTFE | 0 | 0.67 | 0 | 0 | 0.33 | 0 | 1 | 258 |
| F(2) | PTFE | PTFE | 0 | 0.67 | 0 | 0 | 0.33 | 0 | 2 | 264 |
| F(3) | PTFE | PTFE | 0 | 0.67 | 0 | 0 | 0.33 | 0 | 3 | 269 |
| F(4) | PTFE | PTFE | 0 | 0 | 0.53 | 0 | 0.47 | 0 | 1 | 261 |
| F(5) | PTFE | PTFE | 0 | 0 | 0.53 | 0 | 0.47 | 0 | 2 | 263 |
| F(6) | PTFE | PTFE | 0 | 0 | 0.53 | 0 | 0.47 | 0 | 3 | 267 |
| F(7) | PTFE | PTFE | 0.96 | 0 | 0.0212 | 0 | 0.0188 | 0 | 1 | 488 |
| F(8) | PTFE | PTFE | 0.93 | 0 | 0.0371 | 0 | 0.0329 | 0 | 1 | 492 |
| F(9) | PTFE | PTFE | 0.9 | 0 | 0.053 | 0 | 0.047 | 0 | 1 | 490 |
| F(10) | THV | PAI-PPS | 0.95 | 0 | 0.0265 | 0 | 0.0235 | 0 | 6 | 498 |
| F(11) | THV | PAI-PPS | 0.95 | 0 | 0.0265 | 0 | 0.0235 | 0 | 6 | 670 |
| F(12) | PTFE | PTFE | 1 | 0 | 0 | 0 | 0 | 0 | 0 | 556 |
| F(13) | PTFE | PTFE | 0.9 | 0 | 0.053 | 0 | 0.047 | 0 | 2 | 567 |
| F(13 recured) | PTFE | PTFE | 0.9 | 0 | 0.053 | 0 | 0.047 | 0 | 2 | 567 |
| F(14) | PTFE | PAI-PPS | 0.9 | 0 | 0.053 | 0 | 0.047 | 0 | 2 | 454 |
| F(14 recured) | PTFE | PAI-PPS | 0.9 | 0 | 0.053 | 0 | 0.047 | 0 | 2 | 454 |
| F(15) | F(9) Topcoat | PAI-PPS | 0.9 | 0 | 0.053 | 0 | 0.047 | 0 | 2 | 164 |
| F(16) | F(9) Topcoat | PAI-PPS | 0.9 | 0 | 0.053 | 0 | 0.047 | 0 | 2 | 245 |
| F(control 17) | PTFE | PTFE | 1 | 0 | 0 | 0 | 0 | 0 | 0 | 135 |

TABLE 3C-continued

Topcoat formulations

| Coating # | Base Coat | Mid Coat | Top Coat (PTFE) | Top coat (MFA) | Top Coat (PFA) | Top Coat (FEP) | Top Coat (LPTFE) | Top Coat (MP) | # of Topcoats Applied | Coating Weight |
|---|---|---|---|---|---|---|---|---|---|---|
| F(control 18) | PTFE | PTFE | 1 | 0 | 0 | 0 | 0 | 0 | 0 | 248 |
| F(control 19) | PTFE | PTFE | 1 | 0 | 0 | 0 | 0 | 0 | 0 | 280 |
| F(control 20) | PTFE | PTFE | 1 | 0 | 0 | 0 | 0 | 0 | 0 | 556 |
| F(21) | PTFE | PTFE Ceramic | 0.95 | 0 | 0.0265 | 0 | 0.0235 | 0 | 2 | 610 |
| F(21 recure) | PTFE | PTFE Ceramic | 0.95 | 0 | 0.0265 | 0 | 0.0235 | 0 | 2 | 610 |
| F(22) | PTFE | PTFE Ceramic | 0.9 | 0 | 0.053 | 0 | 0.047 | 0 | 2 | 607 |
| F(22 recure) | PTFE | PTFE Ceramic | 0.9 | 0 | 0.053 | 0 | 0.047 | 0 | 2 | 607 |
| F(23) | PTFE | PTFE Ceramic | 0.85 | 0 | 0.0795 | 0 | 0.0705 | 0 | 2 | 602 |
| F(23 recure) | PTFE | PTFE Ceramic | 0.85 | 0 | 0.0795 | 0 | 0.0705 | 0 | 2 | 602 |
| F(24) | PTFE | PTFE Ceramic | 0.9 | 0 | 0.053 | 0 | 0.047 | 0 | 1 | 575 |
| F(24 recure) | PTFE | PTFE Ceramic | 0.9 | 0 | 0.053 | 0 | 0.047 | 0 | 1 | 575 |
| F(25) | PTFE | PTFE Ceramic | 0.9 | 0 | 0.053 | 0 | 0.047 | 0 | 2 | 557 |
| F(25 recure) | PTFE | PTFE Ceramic | 0.9 | 0 | 0.053 | 0 | 0.047 | 0 | 2 | 557 |
| F(26) | PTFE | PTFE | 0 | 0 | 0 | 0.5 | 0.5 | 0 | 2 | 287 |
| F(27) | PTFE | PTFE | 0 | 0 | 0 | 0.75 | 0.25 | 0 | 2 | 280 |
| F(28) | PTFE | PTFE | 0.9 | 0 | 0 | 0.05 | 0.05 | 0 | 2 | 294 |
| F(29) | PTFE | PTFE | 0.9 | 0 | 0 | 0.075 | 0.025 | 0 | 2 | 298 |
| F(30) | F(28) Topcoat | PTFE | 0 | 0 | 0 | 0 | 0 | 0 | 2 | |
| F(31) | F(29) Topcoat | PTFE | 0 | 0 | 0 | 0 | 0 | 0 | 2 | |
| F(control 32) | PTFE-LPTFE | PTFE-LPTFE | 0.9 | 0 | 0 | 0 | 0.1 | 0 | 2 | 287 |
| F(33) | F(13) Topcoat | F(13) Topcoat | 0.9 | 0 | 0.053 | 0 | 0.047 | 0 | 2 | 498 |
| F(34) | PTFE | PTFE | 0 | 0 | 0.25 | 0 | 0.75 | 0 | 1 | 287 |
| F(35) | PTFE | PTFE | 0 | 0 | 0.4 | 0 | 0.6 | 0 | 1 | 287 |
| F(36) | PTFE | PTFE | 0 | 0 | 0.6 | 0 | 0.4 | 0 | 1 | 290 |
| F(37) | PTFE | PTFE | 0 | 0 | 0.75 | 0 | 0.25 | 0 | 1 | 292 |
| F(38) | PTFE | PTFE | 0.9 | 0 | 0.075 | 0 | 0.025 | 0 | 1 | 290 |
| F(39) | PTFE | PTFE | 0.9 | 0 | 0.0265 | 0.025 | 0.0485 | 0 | 1 | 286 |
| F(40) | PTFE | PTFE | 0.9 | 0 | 0.025 | 0 | 0.075 | 0 | 1 | 285 |
| F(41) | PTFE | PTFE | 0.9 | 0 | 0.075 | 0 | 0.025 | 0 | 1 | 287 |
| F(42) | PTFE | PTFE | 0.9 | 0 | 0.06 | 0 | 0.04 | 0 | 1 | 290 |
| F(43) | PTFE | PTFE | 0.9 | 0 | 0.04 | 0 | 0.06 | 0 | 1 | 285 |
| F(44) | PTFE | PTFE | 0.9 | 0 | 0 | 0 | 0 | 0.1 | 1 | 290 |
| F(45) | PTFE | PTFE | 0.9 | 0 | 0 | 0 | 0 | 0.1 | 1 | 285 |
| F(control 46) | PTFE | PTFE | 1 | 0 | 0 | 0 | 0 | 0 | 3 | 518 |
| F(47) | PTFE | PTFE | 0.9 | 0 | 0.1 | 0 | 0 | 0 | 1 | 295 |
| F(48) | PTFE | PTFE | 0.9 | 0 | 0 | 0.1 | 0 | 0 | 1 | 299 |
| F(49) | PTFE | PTFE | 0.8 | 0 | 0.106 | 0 | 0.094 | 0 | 1 | 299 |
| F(50) | PTFE | PTFE | 0.7 | 0 | 0.159 | 0 | 0.141 | 0 | 1 | 299 |
| F(51) | PTFE | PTFE | 0.83 | 0 | 0.14 | 0 | 0.03 | 0 | 1 | 296 |
| F(52) | PTFE | PTFE | 0.76 | 0 | 0.2 | 0 | 0.04 | 0 | 1 | 297 |

TABLE 3C-continued

Topcoat formulations

| Coating # | Base Coat | Mid Coat | Top Coat (PTFE) | Top coat (MFA) | Top Coat (PFA) | Top Coat (FEP) | Top Coat (LPTFE) | Top Coat (MP) | # of Topcoats Applied | Coating Weight |
|---|---|---|---|---|---|---|---|---|---|---|
| F(53) | PTFE | PTFE | 0.65 | 0 | 0.3 | 0 | 0.05 | 0 | 1 | 294 |
| F(54) | PTFE | PTFE | 0.4 | 0 | 0.4 | 0 | 0.2 | 0.4 | 1 | 292 |
| F(55) | PTFE | PTFE | 0.4 | 0 | 0.2 | 0 | 0.4 | 0.2 | 1 | 293 |
| F(56) | PTFE | PTFE | 0.5 | 0 | 0.25 | 0 | 0.25 | 0.25 | 1 | 290 |
| F(57) | PTFE | PTFE | 0.75 | 0 | 0.05 | 0 | 0.2 | 0.05 | 1 | 289 |
| F(58) | PTFE | PTFE | 0.75 | 0 | 0.18 | 0 | 0.07 | 0.18 | 1 | 297 |
| F(59) | PTFE | PTFE | 0.45 | 0 | 0.5 | 0 | 0.05 | 0.5 | 1 | 291 |
| F(60) | PTFE | PTFE | 0.15 | 0 | 0.05 | 0 | 0.8 | 0 | 1 | 291 |
| F(61) | PTFE | PTFE | 0.3 | 0 | 0.1 | 0 | 0.6 | 0 | 1 | 294 |
| F(62) | PTFE | PTFE | 0.2 | 0 | 0.7 | 0 | 0.1 | 0 | 1 | 292 |
| F(63) | PTFE | PTFE | 0.05 | 0 | 0.9 | 0 | 0.05 | 0 | 1 | 296 |
| F(64) | PTFE | PTFE | 0 | 0 | 0 | 0 | 1 | 0 | 1 | 293 |
| F(65) | PTFE | PTFE | 0 | 0 | 1 | 0 | 0 | 0 | 1 | 307 |

The fluoropolymer components of the Topcoats were as follows:

PTFE (HPTFE)—Solvay D3112X, solids=60%.

MFA—Solvay Hyflon MFA XPH 6202-1, Lot# Lab, solids=27.2%.

PFA—du Pont PFA TE7224, Lot#0804330005, Solids=58.6%).

FEP—du Pont FEP TE9568, solids=54.0%).

LPTFE—SFN-D, Chenguang, except that topcoat F(44) was made with Dyneon 9207 TF PTFE micropowder, and topcoat F(45) was made with UF 8TA surface treated PTFE micropowder.

THV-Dyneon THV 340C, solids=50.0%, used with Versamid cross-linking agent.

PAI-PPS-PAI: Whitford D7949 PAI solution, PPS: Chevron Phillips Ryton PPS.

All of the coating compositions were mixed using a standard mixer under medium shear for 5-7 minutes. All mixed coatings were applied to glasscloth in the laboratory using draw down bars. The glasscloth substrate grades are set forth in Table 3A above, produced by PD Interglas or Porcher Industries. The coated substrate is subjected to a flash off in a laboratory box oven set at 260° C. (500° F.) for 2 minutes followed by curing in a laboratory box oven set at 400° C. (752° F.) for 1 minute.

The control samples were standard products produced using conventional PTFE dispersions by AFC (Advanced Flexible Composites) and no modifications or further coatings were applied to these samples. The basecoat, midcoat and PTFE of the topcoat of the control samples were all standard PTFE dispersions.

Due to line speed conditions used in some trials dwell time at temperature was reduced. In these instances samples were post cured in a laboratory box oven for 2 minutes at 430° C. Substrate temperature was measured and 430° C. was attained for between 45 and 52 seconds. Samples were subjected to a full test schedule to determine whether dwell time had any effect on properties. The foregoing samples are labeled "recure" or "recured" in the tables herein.

Example 2

Determination of Roughness, Gloss, and Contact Angle

In this Example, roughness, gloss, and contact angle of the coatings were determined. The test protocols are as follows.

Roughness.

A stylus type surface roughness detector equipped with an analyzer that provides a tracing of the surface was used according to EN ISO 13565, such as the following: Mitutoyo Surftest 402 surface roughness detector and analyzer, available from Mitutoyo Canada, 2121 Meadowvale Blvd, Mississauga, Toronto, Ontario, ON L5N 5N1, and Perthometer M2P/M3P/M4P surface roughness detector and analyzer (Mahr GmbH—Carl-Mahr-Str.1, D-37073 Göttingen, Germany). These instruments measure Ra (arithmetic mean deviation of the roughness profile, measured in microns) and Pc (peak count).

The procedure is as follows. First, prepare the sample to be measured. Due to the configuration of most detectors this may require cutting the sample to obtain a flat surface accessible to the detector. Set the detector roughness range to the level just higher than the expected roughness to be measured. Set the length of trace, scale magnification and measurement units (English or metric). Calibrate the detector according to the manufacturer's instructions using a known reference standard. In the same manner, measure the roughness of the sample surface. Make at least 6 measurements.

Gloss.

Gloss measurements were attained using a Miniglossmeter 110V 20°-60°, available from Sheen Instruments, at an angle of 60°. The gloss meter conformed to the following standards: BS3900/D5, DIN EN ISO 2813, DIN 67530, EN ISO 7668, ASTM D523, ASTM D1455, ASTM C346, ASTM C584, ASTM D2457, JIS Z 8741, MFT 30064, TAPPI T 480. Units of measurement are expressed as % reflectance.

Contact Angle.

Contact angle was measured for a water droplet and is expressed in degrees, as determined according to ASTM D7334-08 using the "Drop Shape Analysis" system (DSA10), available from Kruss GmbH of Hamburg, Germany, according to the Young Relation.

The results are set forth in Table 4 below:

TABLE 4

Roughness, Gloss and Contact Angle

| Coating # | Ra | Gloss | Contact Angle (Water) |
|---|---|---|---|
| F(Control A) | 2.42 | 20.6 | 119.3 |
| F(Control B) | 1.37 | 15.8 | 128.02 |

TABLE 4-continued

Roughness, Gloss and Contact Angle

| Coating # | Ra | Gloss | Contact Angle (Water) |
|---|---|---|---|
| F(1) | 1.6 | 25.9 | — |
| F(2) | 1.46 | 25.4 | — |
| F(3) | 1.41 | 24 | — |
| F(4) | 1.59 | 22.6 | — |
| F(5) | 1.06 | 26.5 | — |
| F(6) | 1.01 | 23.4 | — |
| F(7) | 1.4 | 22.7 | — |
| F(8) | 1.02 | 23.1 | — |
| F(9) | 0.87 | 22.6 | — |
| F(10) | 1.47 | 48.1 | — |
| F(11) | 0.47 | 33 | — |
| F(12) | 0.61 | 44.1 | 109.57 |
| F(13) | 0.24 | 46.3 | 102.93 |
| F(13 recured) | 0.42 | 52.1 | — |
| F(14) | 3.88 | 50.5 | — |
| F(14 recured) | 2.37 | 54.2 | — |
| F(15) | 1.93 | 32.4 | 111.98 |
| F(16) | 1.54 | 33.5 | 117.04 |
| F(Control 17) | 2.67 | 24.1 | 125.78 |
| F(Control 18) | 1.66 | 20.6 | 119.3 |
| F(Control 19) | 1.37 | 15.8 | 128.02 |
| F(Control 20) | 1.52 | 38.7 | 68.23 |
| F(21) | 1.2 | 45.35 | 102.3 |
| F(21 recure) | 0.77 | 45.4 | 108.8 |
| F(22) | 0.79 | 43.8 | 124.7 |
| F(22 recure) | 0.61 | 44.4 | 125 |
| F(23) | 0.9 | 40.05 | 103.1 |
| F(23 recure) | 0.85 | 44.4 | 135.4 |
| F(24) | 1.13 | 33.25 | 95.8 |
| F(24 recure) | 0.85 | 45.6 | 114.9 |
| F(25) | 0.83 | 46.7 | — |
| F(25 recure) | 1.01 | 48.8 | 73.37 |
| F(26) | 1.028 | 26.02 | 119.98 |
| F(27) | 1.214 | 14.61 | 113.91 |
| F(28) | 0.733 | 48.28 | 125.29 |
| F(29) | 0.75 | 51.48 | 120.36 |
| F(30)* | 3.42 | 28.1 | — |
| F(31)* | 3.16 | 27.4 | — |
| F(Control 32) | 0.84 | 46.4 | — |
| F(33) | 0.78 | 64.8 | 106.9 |
| F(34) | 1.05 | 41.7 | 125.87 |
| F(35) | 1.19 | 45.9 | 113.4 |
| F(36) | 1.01 | 50.1 | 118.33 |
| F(37) | 0.97 | 35.3 | 117.16 |
| F(38) | 0.62 | 53.2 | 116.32 |
| F(39) | 0.7 | 54.4 | 115.6 |
| F(40) | 0.8 | 46.8 | 127.51 |
| F(41) | 0.82 | 48 | 114.02 |
| F(42) | 0.96 | 45.4 | 116.08 |
| F(43) | 1.02 | 47.1 | 107.39 |
| F(44) | 0.91 | 36.8 | 112.94 |
| F(45) | 1.12 | 33.1 | 109.09 |
| F(Control 46) | 0.86 | 43.9 | 126.4 |
| F(47) | 0.82 | 45.5 | 119.7 |
| F(48) | 0.84 | 44.5 | 112.57 |
| F(49) | 0.82 | 46.2 | — |
| F(50) | 0.87 | 42.1 | 119.78 |
| F(51) | 0.76 | 48.3 | 109.31 |
| F(52) | 0.69 | 46.4 | 113.12 |
| F(53) | 0.65 | 42.5 | 119.63 |
| F(54) | 0.7 | 24.1 | — |
| F(55) | 0.76 | 27.6 | 124.5 |
| F(56) | 0.82 | 31.5 | 131.9 |
| F(57) | 0.71 | 43.7 | 128.83 |
| F(58) | 0.85 | 40.6 | 130.49 |
| F(59) | 0.78 | 43.4 | 120.15 |
| F(60) | 1.22 | 10.4 | — |
| F(61) | 0.89 | 16.6 | — |
| F(62) | 0.9 | 24.3 | — |
| F(63) | 1.39 | 17.6 | — |
| F(64) | 0.77 | 18.9 | — |
| F(65) | 2.79 | 7.8 | — |

The results in Table 4 above show a significant improvement in smoothness, an increase in gloss, and an increase in the contact angle of water over the control topcoats for coating compositions made in accordance with the first and second embodiments of the present invention when applied to flexible glass substrates.

Example 3

Reciprocating Abrasion Test

A reciprocating abrasion test (RAT) was conducted on each coating under the test protocol set forth at the end of this Example. The results are set forth in Table 5 below:

TABLE 5

Reciprocating abrasion test (RAT)

| Coating # | RAT Ambient initial | RAT ambient 10% |
|---|---|---|
| F(Control A) | 2000 | 4000 |
| F(Control B) | 2000 | 5000 |
| F(1) | 4000 | 6000 |
| F(2) | 3000 | 8000 |
| F(3) | 5000 | 8000 |
| F(4) | 4000 | 7000 |
| F(5) | 6000 | 11000 |
| F(6) | 6000 | 12000 |
| F(7) | 12000 | 18000 |
| F(8) | 12000 | 19000 |
| F(9) | 14000 | 22000 |
| F(10) | 14000 | 31000 |
| F(11) | 16000 | 32000 |
| F(12) | 12000 | 26000 |
| F(13) | 18000 | 22000 |
| F(13 recured) | 28000 | 32000 |
| F(14) | 4000 | 7000 |
| F(14 recured) | 6000 | 10000 |
| F(15) | 5000 | 8000 |
| F(16) | 6000 | 8000 |
| F(Control 17) | 3000 | 6000 |
| F(Control 18) | 2000 | 4000 |
| F(Control 19) | 2000 | 5000 |
| F(Control 20) | 5000 | 8000 |
| F(21) | 7000 | 9000 |
| F(21 recure) | 8000 | 10000 |
| F(22) | 8000 | 11000 |
| F(22 recure) | 12000 | 17000 |
| F(23) | 11000 | 14000 |
| F(23 recure) | 7000 | 11000 |
| F(24) | 7000 | 10000 |
| F(24 recure) | 7000 | 10000 |
| F(25) | 8000 | 14000 |
| F(25 recure) | 9000 | 15000 |
| F(26) | 5000 | 12000 |
| F(27) | 6000 | 12000 |
| F(28) | 6000 | 11000 |
| F(29) | 10000 | 29000 |
| F(30) | — | — |
| F(31) | — | — |
| F(Control 32) | 4000 | 10000 |
| F(33) | 4000 | 21000 |
| F(34) | 7000 | 31000 |
| F(35) | 7000 | 12000 |
| F(36) | 7000 | 14000 |
| F(37) | 10000 | 15000 |
| F(38) | 9000 | 15000 |
| F(39) | 10000 | 27000 |
| F(40) | 12000 | 20000 |
| F(41) | 4000 | 18000 |
| F(42) | 12000 | 18000 |
| F(43) | 8000 | 23000 |
| F(44) | 7000 | 11000 |
| F(45) | 8000 | 12000 |
| F(Control 46) | 4000 | 8000 |
| F(47) | 3000 | 6000 |
| F(48) | 4000 | 8000 |
| F(49) | 6000 | 12000 |
| F(50) | 3000 | 8000 |
| F(51) | 6000 | 10000 |

TABLE 5-continued

Reciprocating abrasion test (RAT)

| Coating # | RAT Ambient initial | RAT ambient 10% |
|---|---|---|
| F(52) | 5000 | 8000 |
| F(53) | 6000 | 12000 |
| F(54) | 5000 | 12000 |
| F(55) | 9000 | 17000 |
| F(56) | 9000 | 21000 |
| F(57) | 5000 | 12000 |
| F(58) | 4000 | 11000 |
| F(59) | 5000 | 9000 |
| F(60) | 2000 | 6000 |
| F(61) | 4000 | 12000 |
| F(62) | 4000 | 10000 |
| F(63) | 2000 | 8000 |
| F(64) | 5000 | 11000 |
| F(65) | 9000 | 14000 |

The results in the table above show that there is up to a 200% improvement in linear abrasion resistance over the control topcoats with the topcoats made in accordance with the first and second embodiments of the present when applied to flexible glass substrates.

Reciprocating Abrasion Rest (RAT)

The reciprocating abrasion test was conducted based on the complete protocol set forth below with the following modifications: (1) the coated sample were tested until 10% exposure of substrate; (2) the test was performed using a 3 kg weight at ambient temperature; and (3) the Scotchbrite 3M (7447) pads were changed every 1000 cycles.

The complete test protocol is as follows:

Scope.

This test measures the resistance of coatings to abrasion by a reciprocating Scotch-Brite pad. The test subjects coating abrasion in a back and forth motion. The test is a measure of the useful life of coatings that have been subjected to scouring and other similar forms of damage caused by cleaning TM 135C is specific to a test apparatus built by Whitford Corporation of West Chester, Pa. However, it is applicable to similar test methods such as the one described in British Standard 7069-1988.

Equipment and Materials.

(1) A test machine capable of holding a Scotch-Brite abrasive pad of a specific size to the surface to be tested with a fixed force and capable of moving the pad in a back and forth (reciprocating) motion over a distance to 10-15 cm (4 to 6 inches). The force and motion are applied by a free falling, weighted stylus. The machine must be equipped with a counter, preferably one that may be set to shut off after a given number of cycles.

(2) Scotch-Brite pads of required abrasiveness cut to required size. Scotch-Brite pads are made by 3M Company, Abrasive Systems Division, St Paul, Minn. 55144-1000. Pads come in grades with varying levels of abrasiveness as follows:

Lowest—7445, 7448, 6448, 7447, 6444, 7446, 7440, 5440—Highest

Scotch-Brite pads may be used at temperatures up to 150° C. (300° F.). Equivalent pads may be used.

(3) Hot plate to heat test specimens. (Optional)

(4) Detergent solution or oil for performing test in with a liquid. (Optional)

Procedure.

Before beginning the test, the end point must be defined. Usually, the end point is defined when some amount of substrate has been exposed. However, the end point may be defined as a given number of strokes even if substrate is not exposed. The present inventors use a 10% exposure of substrate over the abraded area as the standard definition of end point. Other end points may be used.

Secure the part to be tested under the reciprocating pad. The part must be firmly fastened with bolts, clamps or tape. The part should be as flat as possible and long enough so that the pad does not run off an edge. Bumps in the surface will wear first, and overrunning an edge can tear the pad and cause premature scratching and a false result.

Cut a piece of Scotch Brite of required abrasiveness to the exact size of the "foot" of the stylus. The present inventors use Grade 7447 as standard, and the "foot" of the stylus on the test machine is 5 cm (2 inches) in diameter. Attach the pad to the bottom of the "foot." The Scotch-Brite pad is fixed to the "foot" by means of a piece of "Velcro" glued to the bottom of the foot.

If the machine has an adjustable stroke length, set the required length. The present inventors use a 10 cm (4 inch) stroke length as standard. Lower the pad onto the surface of the piece to be tested. Make sure that the weight is completely free. The present inventors used a 3.0 Kg weight as standard, but this can be varied.

If the machine is equipped with a counter, set the counter to the required number of strokes. One stroke is a motion in one direction. If the machine does not have an automatic counter, the counter must be watched so that the machine can be turned off at the proper time. The machine is stopped at various intervals to change the abrasive pad. The abrasiveness of the pad changes (usually becomes less effective) as the pad fills with debris. The present inventors changed pads at intervals of 1,000 strokes. One thousand strokes is the preferred interval between pad changes.

Start the test machine. Allow to run until an end point is reached or until a required number of strokes are attained before changing the pad.

Inspect the test piece carefully at the beginning and end of each start up. As the end point is approached, the substrate will begin to show through the coating. When close to the end point, observe the test piece constantly. Stop the machine when the end point has been reached.

Evaluation.

Record the following for the test machine:
1. Grade and size of Scotch-Brite pad.
2. Load on stylus
3. Number of strokes between pad changes.
4. Length of stroke.
5. Definition of end point.
6. Number of strokes to end point.

Duplicate tests provide greater reliability. Indicate if end point is a single result or the average of several results.

Record the description of the coating, the film thickness, and the substrate and surface preparation.

If the test is conducted to a specific number of strokes, record the number of strokes. Record a description of the amount of wear, such as percent of substrate exposed, or number of strokes to first substrate exposure. Optionally, record the film thickness and/or weight before and after testing.

If the test is performed at elevated temperature, record the temperature of the test. If performed with a liquid, record the specifics of the liquid.

Comments/Precautions.

Both sides of a Scotch-Brite pad may be used. Pads must be cut precisely to fit the "foot." Ragged edges or rough spots on the pad will give false results. Test pieces must be flat and free from dirt or other particles. This test method is similar to the abrasion test described in BS 7069:1988, Appendix A1. When tested according to BS 7069, test pieces are immersed in 50 cm$^3$ of a 5 g/liter solution of household dish washing detergent in water. The test runs for 250 cycles with pads changed every 50 cycles.

Example 4

Taber Reciprocating Abrasion Test

A Taber reciprocating abrasion test was conducted according to ASTM D3389 under the following conditions: (1) the test was completed on a Taber 5135 Abraser using the weight loss method; (2) resilient Calibrase wheels H-18 were used with a 250 g load on each abraser arm, and the wheels were resurfaced every 1000 cycles; and (3) the Taber Wear Index was calculated as:

$$TWI = Wt(loss)(mg)/\# \text{ of cycles}$$

Taber tests generally involve mounting a specimen (typically less than 12.5 mm thickness) to a turntable platform that rotates at a fixed speed. Two abrasive wheels, which are applied at a specific pressure, are lowered onto the specimen surface. As the turntable rotates, the wheels are driven by the sample in opposite directions about a horizontal axis displaced tangentially from the axis of the sample. One abrading wheel rubs the specimen outward toward the periphery and the other, inward toward the centre while a vacuum system removes loose debris during testing.

The results are set forth in Table 6 below:

TABLE 6

| Taber reciprocating abrasion test | | | |
|---|---|---|---|
| Coating # | TWI 1000 | TWI 2000 | TWI 3000 |
| F(Control A) | 15 | 20 | 23 |
| F(Control B) | 11 | 10.5 | 10 |
| F(1) | 12 | 11 | 12.33 |
| F(2) | 15 | 13.5 | 13.33 |
| F(3) | 13 | 13.5 | 12 |
| F(4) | 12 | 16 | 17.66 |
| F(5) | 13 | 17 | 15.33 |
| F(6) | 22 | 18.5 | 16 |
| F(7) | 32.6 | 37 | 36 |
| F(8) | 31 | 38 | 37.6 |
| F(9) | 20 | 23.5 | 23 |
| F(10) | 25 | 17 | 14 |
| F(11) | 14 | 7.5 | 9.37 |
| F(12) | 31 | 38 | 37.66 |
| F(13) | 17 | 16 | 16 |
| F(13 recured) | 13 | 14.5 | 13.33 |
| F(14) | 35 | 23.5 | 21.6 |
| F(14 recured) | 39 | 36 | 26.33 |
| F(15) | 42 | 64 | 102 |
| F(16) | 54 | 40 | 152 |
| F(Control 17) | 46 | 75.5 | 87.3 |
| F(Control 18) | 15 | 20 | 23 |
| F(Control 19) | 11 | 10.5 | 10 |
| F(Control 20) | 27 | 24 | 21.6 |
| F(21) | 3 | 2 | 5.66 |
| F(21 recure) | 13 | 7 | 7 |
| F(22) | 14 | 14.5 | 13.66 |
| F(22 recure) | 11 | 12 | 12.66 |
| F(23) | 11 | 19 | 16.66 |
| F(23 recure) | 31 | 23 | 22 |
| F(24) | 14 | 13 | 9.33 |
| F(24 recure) | 10 | 15 | 14.3 |
| F(25) | 19 | 16.5 | 17.66 |
| F(25 recure) | 19 | 13 | 14.3 |
| F(26) | 32 | 22.5 | 19.7 |
| F(27) | 16 | 15.5 | 15 |
| F(28) | 16 | 16 | 14 |

TABLE 6-continued

| Taber reciprocating abrasion test | | | |
|---|---|---|---|
| Coating # | TWI 1000 | TWI 2000 | TWI 3000 |
| F(29) | 17 | 14.5 | 15.3 |
| F(30)* | 49 | 61 | 58 |
| F(31)* | 38 | 41 | 44 |
| F(Control 32) | 53 | 35 | 29 |
| F(33) | 17 | 18.5 | 10 |
| F(34) | 14 | 10.5 | 12 |
| F(35) | 18 | 14.5 | 14 |
| F(36) | 17 | 17.5 | 14 |
| F(37) | 21 | 21 | 19.7 |
| F(38) | 22 | 17.5 | 17.3 |
| F(39) | 24 | 17 | 16 |
| F(40) | 10 | 24 | 30 |
| F(41) | 36 | 26 | 23 |
| F(42) | 23 | 21 | 21 |
| F(43) | 28 | 26 | 26 |
| F(44) | 19 | 19.5 | 21.3 |
| F(45) | 57 | 42.3 | 30 |
| F(Control 46) | 17 | 17.5 | 17.7 |
| F(47) | 24 | 19 | 18 |
| F(48) | 18 | 18 | 19 |
| F(49) | 31 | 23 | 23 |
| F(50) | 31 | 28 | 23.3 |
| F(51) | 18 | 16.5 | 16.3 |
| F(52) | 24 | 16.5 | 14 |
| F(53) | 13 | 11 | 12 |
| F(54) | 11 | 15.5 | 12.3 |
| F(55) | 20 | 21.5 | 15.7 |
| F(56) | 12 | 18 | 13 |
| F(57) | 20 | 18 | 16 |
| F(58) | 17 | 11 | 12.7 |
| F(59) | 19 | 14 | 14.7 |
| F(60) | 25 | 20 | 21 |
| F(61) | 22 | 16 | 16 |
| F(62) | 20 | 15 | 12.7 |
| F(63) | 22 | 21.5 | 16.7 |
| F(64) | 27 | 20 | 18.3 |
| F(65) | 16 | 13.5 | 12.3 |

The results in Table 6 above show that there is a reduction in the Taber Wear Index with the topcoats made in accordance with the first and second embodiments of the present when applied to flexible glass substrates, indicating an improvement in cross directional abrasion resistance over the control topcoats.

Example 5

Cooking Release Tests

Cooking release tests were conducted in accordance with the protocols below for cookie dough, pizza dough, chicken leg, and egg. The results were graded from 1-5 (1-cannot remove, 5-excellent release with no residue and no staining)

Cookie Dough.

Small round piece (approximately 5 cm diameter) of dough placed centrally on coated substrate and cooked for 12 mins at 160° C. Allowed to cool for 5 mins. Release evaluated including ease of release, residue and staining.

Pizza Dough.

Small round piece (approximately 5 cm diameter) of dough placed centrally on coated substrate and cooked for 12 mins at 160° C. Allowed to cool for 5 mins. Release evaluated including ease of release, residue and staining.

Chicken Leg.

One chicken leg placed centrally on coated substrate and cooked for 30 mins at 225° C. Allowed to cool for 5 mins. Release evaluated including ease of release, residue and staining.

Egg.

The egg test followed a slightly different protocol to the other release tests in this case the number of cycles to failure (equivalent to level 3 for the other release tests of Table 7) is quoted The results are set forth in Table 7 below:

TABLE 7

| Coating # | Release (egg) | Release (Cookie) | Release (Pizza) | Release (Chicken) |
|---|---|---|---|---|
| F(Control A) | 3 | 3 | 3 | 2 |
| F(Control B) | 3 | 3 | 3 | 2 |
| F(1) | — | 4 | 4 | 3 |
| F(2) | — | 4 | 4 | 3 |
| F(3) | — | 4 | 4 | 3 |
| F(4) | — | 4 | 4 | 3 |
| F(5) | — | 4 | 4 | 3 |
| F(6) | — | 4 | 4 | 3 |
| F(7) | — | 4 | 5 | 4 |
| F(8) | — | 4 | 5 | 4 |
| F(9) | — | 5 | 5 | 5 |
| F(10) | — | 4 | 5 | 5 |
| F(11) | — | 4 | 5 | 5 |
| F(12) | 5 | 4 | 5 | 4 |
| F(13) | 7 | — | 5 | 4 |
| F(13 recured) | 9 | 4 | 5 | — |
| F(14) | 5 | — | 5 | 4 |
| F(14 recured) | 5 | 4 | 5 | — |
| F(15) | — | — | 5 | 5 |
| F(16) | — | 4 | 5 | 5 |
| F(Control 17) | 2 | 4 | 5 | 3 |
| F(Control 18) | 4 | 4 | 5 | 3 |
| F(Control 19) | 4 | 4 | 5 | 3 |
| F(Control 20) | 2 | 4 | 3 | 3 |
| F(21) | — | — | — | — |
| F(21 recure) | — | 5 | 4 | 3 |
| F(22) | 8 | — | — | — |
| F(22 recure) | — | 5 | 5 | 4 |
| F(23) | — | — | — | — |
| F(23 recure) | 8 | 5 | 5 | 3 |
| F(24) | — | — | — | — |
| F(24 recure) | — | 5 | 5 | 3 |
| F(25) | 2 | — | — | — |
| F(25 recure) | 3 | 5 | 5 | 4 |
| F(26) | — | 5 | 5 | — |
| F(27) | — | 5 | 5 | 3 |
| F(28) | — | 5 | 5 | 1 |
| F(29) | — | 5 | 5 | 4 |
| F(30) | — | — | — | — |
| F(31) | — | — | — | — |
| F(Control 32) | 4 | 4 | 5 | 3 |
| F(33) | 8 | 5 | 5 | 4 |
| F(34) | — | 4 | 5 | 4 |
| F(35) | — | 4 | 5 | 4 |
| F(36) | — | 4 | 5 | 4 |
| F(37) | — | 4 | 5 | 5 |
| F(38) | — | 4 | 5 | 5 |
| F(39) | — | 2 | 5 | 5 |
| F(40) | — | 3 | 5 | 4 |
| F(41) | — | 3 | 5 | 4 |
| F(42) | — | 3 | 5 | 5 |
| F(43) | — | 3 | 5 | 5 |
| F(44) | — | 5 | 5 | 5 |
| F(45) | — | 4 | 5 | 4 |
| F(Control 46) | — | 3 | 4 | 3 |
| F(47) | — | 4 | 5 | 3 |
| F(48) | — | 4 | 5 | 3 |
| F(49) | — | 4 | 4 | 4 |
| F(50) | — | 4 | 4 | 4 |
| F(51) | — | 5 | 5 | 4 |
| F(52) | — | 4 | 4 | 4 |
| F(53) | — | 3 | 4 | 3 |
| F(54) | — | 4 | 4 | 3 |
| F(55) | — | 3 | 5 | 4 |
| F(56) | — | 4 | 4 | 4 |
| F(57) | — | 3 | 4 | 2 |

TABLE 7-continued

| Coating # | Release (egg) | Release (Cookie) | Release (Pizza) | Release (Chicken) |
|---|---|---|---|---|
| F(58) | — | 4 | 4 | 3 |
| F(59) | — | 3 | 3 | 3 |
| F(60) | — | 3 | 3 | 3 |
| F(61) | — | 3 | 3 | 2 |
| F(62) | — | 3 | 4 | 3 |
| F(63) | — | 3 | 3 | 3 |
| F(64) | — | 3 | 3 | 3 |
| F(65) | — | 3 | 3 | 3 |

The results in the table above show that there is an improvement in the release, reduction in staining, and ease of cleaning characteristics for all types of food tested over the control topcoats with the topcoats made in accordance with the first and second embodiments of the present invention when applied to flexible glass substrates.

Example 6

Light Transmission Test

A light transmission test was conducted using a TES 1334 light meter, available from TES Electronic Corp. of Taipei, Taiwan. Units of measurement are lux (lx).

Samples were secured on a frame 2 inches in front of a light box and the peak reading was measured. Light transmission is expressed as a percent (%) obtained by dividing the measured lx value for a coated sample by the measured lx value for an uncoated sample.

The results are set forth in Table 8A below:

TABLE 8A

Light transmission test

| Formula | Reading-lux |
|---|---|
| No Substrate | 4.02 |
| F (Control A) | 1.47 |
| F (Control B) | 0.31 |
| F(1) | 1.29 |
| F(2) | 1.38 |
| F(3) | 1.36 |
| F(4) | 1.27 |
| F(5) | 1.28 |
| F(6) | 1.58 |
| F(7) | 1.27 |
| F(8) | 1.3 |
| F(9) | 1.14 |
| F(12) | 1.16 |
| F(13) | 0.96 |
| F(13 recured) | 0.96 |
| F(14) | 0.56 |
| F(14 recured) | 0.56 |
| F(15) | 0.79 |
| F(16) | 0.68 |
| F(Control 17) | 0.64 |
| F(Control 18) | 1.47 |
| F(Control 19) | 0.61 |
| F(Control 20) | 1.56 |
| F(21) | 1.49 |
| F(21 recure) | 1.49 |
| F(22) | 1.53 |
| F(22 recure) | 1.49 |
| F(23) | 1.49 |
| F(23 recure) | 1.49 |
| F(24) | 1.49 |
| F(24 recure) | 1.49 |
| F(25) | 1.49 |
| F(25 recure) | 1.49 |

TABLE 8A-continued

Light transmission test

| Formula | Reading-lux |
|---|---|
| F(26) | 1.63 |
| F(27) | 1.03 |
| F(28) | 1.41 |
| F(29) | 1.12 |
| F(Control 32) | 1.82 |
| F(33) | 3.35 |
| F(34) | 1.53 |
| F(35) | 1.61 |
| F(36) | 1.64 |
| F(37) | 1.68 |
| F(38) | 1.92 |
| F(39) | 1.29 |
| F(40) | 2.13 |
| F(41) | 2.11 |
| F(42) | 2.14 |
| F(43) | 2.05 |
| F(44) | 1.93 |
| F(45) | 1.93 |
| F(Control 46) | 2.44 |
| F(47) | 1.52 |
| F(48) | 1.85 |
| F(49) | 1.96 |
| F(50) | 1.82 |
| F(51) | 1.77 |
| F(52) | 1.69 |
| F(53) | 1.81 |
| F(54) | 1.95 |
| F(55) | 1.66 |
| F(56) | 1.77 |
| F(57) | 2.02 |
| F(58) | 2.03 |
| F(59) | 2.05 |
| F(60) | 1.74 |
| F(61) | 1.78 |
| F(62) | 1.57 |
| F(63) | 2.01 |
| F(64) | 1.97 |
| F(65) | 1.41 |

Coating F(Control 46) is equivalent to coating F(33) in that it employs the same HPTFE-based base coat and mid coat, includes HPTFE in its topcoat, and was coated onto the same bleached glass fabric substrate, hence the light transmission test is directly comparable to coating F(33), which is a blend of HPTFE/PFA/LPTFE. As can be seen from Table 8B below, in which the light transmission % has been adjusting for the variation in coating weight, coating F(33) transmits 31% more light than the coating F(Control 46). Furthermore, coating F(33) is not only translucent but was also found to be semi transparent to the extent that it was possible to discern images and read printed text through it.

Films cast from the formulation of F(33) are optically transparent and those skilled in the art will recognize that these films can be laminated to a variety of substrates. It is believed that the transparency of these films is indicative of a void free material containing crystalline structures too small to interfere with visible light.

The method of film casting used herein is described below but should not be considered limiting, as one of ordinary skill in the art will recognize that any film casting method would be equally suitable.

Films were prepared as follows:
1. Make a liquid blend of MPF, LPTFE, and HPTFE in the desired ratios.
2. Add the appropriate formulation to the blend created in Step 1. Use the following formulations and percentages to make the blends for drawdown:
 a. For PFA, use Mix A of Table 8B below. Multiply the amount created in Step 1 by ⅔.
 b. For FEP, use Mix B of Table 8B below. Multiply the amount created in Step 1 by 0.70.
3. Blend the mix gently to avoid air bubbles.
4. Using a pipet, apply a small amount to an aluminum degreased panel.
5. Draw the coating down the panel in a smooth motion using a 3 mil wet path bird applicator.
6. Flash the panel for approximately 5-10 minutes at 93° C. (200° F.).
7. Move the panel to 204° C. (400° F.) and flash an additional 3-5 minutes.
8. Cure the panel for 10 minutes at 399° C. (750° F.).
9. Carefully peel off film from cured panel.

TABLE 8B

| Mix A | |
|---|---|
| DIW | 71.15 |
| Carbowax polyethylene glycol/DIW solution (50/50) | 15.15 |
| Triethanolamine | 4.00 |
| Silwet L-77 | 2.85 |
| Aromatic 100 | 3.75 |
| Carbopol EP-1 | 3.00 |
| Mix B | |
| Carbowax polyethylene glycol/DIW solution (50/50) | 29.25 |
| DIW | 52.00 |
| Surfynol 440 | 4.50 |
| 10% FC-4430 in DIW | 6.95 |
| Morpholine | 0.40 |
| ASE60 | 6.90 |

Figure 55:
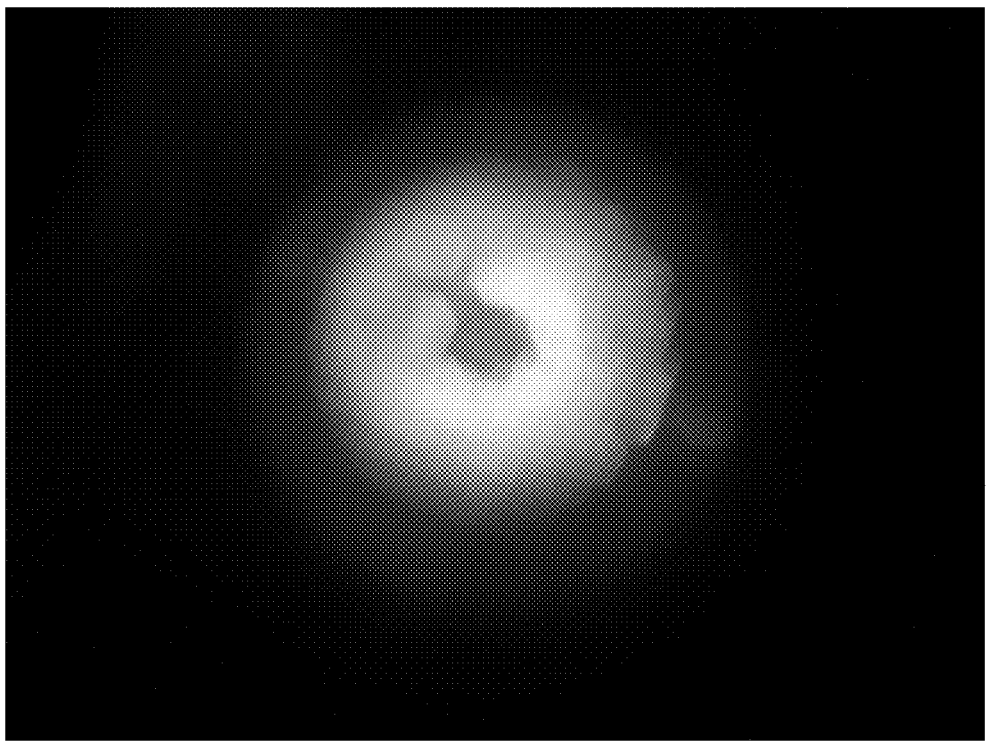
FIG. 55 is a picture of the light source through sample F(33), a piece of glasscloth including a coating having HPTFE, PFA, and LPTFE (Example 6)
Figure 56:
FIG. 56 is a picture of the light source through sample F(46) control, a piece of glasscloth including a coating having only HPTFE (Example 6)

In the case of the Glasscloth coated sample F(33) the transparency of this sample not only indicates that the coating is essentially void free but that there is also intimate contact between the coating and the fibers of the fabric. Such intimate contact avoids internal reflections and refraction as light passes through the material, hence the material is transparent. With the proviso that the ability to discern images and read printed text through the coated glasscloth samples is somewhat difficult to illustrate well in black and white prints, FIGS. 55 and 56 respectively show this comparison of a glasscloth test sample coated with the coating of F(33), which is light in color, versus a sample of glasscloth that has been coated with the control F(46).

Figure 57:
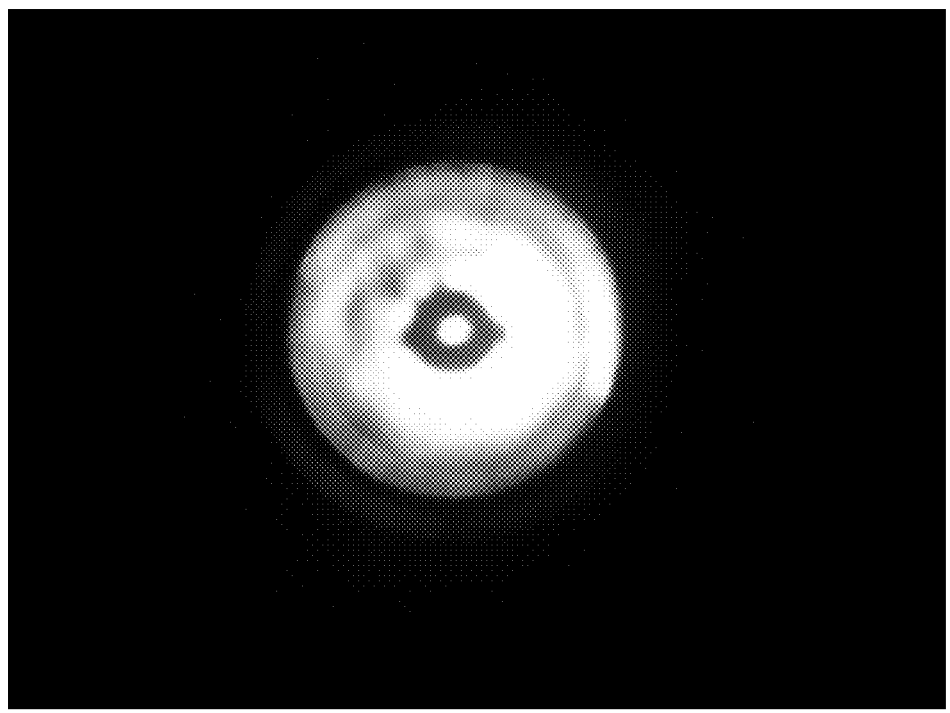
FIG. 57 is a picture of the naked light source used in Example 6.

These samples were placed in front of a small light source (FIG. 57) and photographed. It is clear from a comparison of FIGS. 55 and 56 that the image quality is considerably better and brighter for F(33) versus the control F(46). FIG. 57 shows the naked light source by way of reference.

TABLE 8B

Light transmission test; results of F(33) vs. F(Control 46 adjusted for coating weight

| | | | Transmission % | | |
|---|---|---|---|---|---|
| Coating # | Coating Wt. | Reading-LUX | Actual | Adjusted for relative coating weights | Normalized versus Control |
| F(33) | 498 | 3.35 | 83% | 83% | 131% |
| F(Control 46) 2110/577 | 518 | 2.44 | 61% | 63% | 100% |

Example 7

Oil Wicking Test

An oil wicking test was performed by suspending a piece of substrate in groundnut oil at a temperature of 160° C. (320° F.). The distance that the oil traveled up the web of substrate was measured. The unit of measurements used was millimeters (mm).

The oil was replenished every 24 hours to avoid gelling. The results are set forth in Table 9 below:

TABLE 9

| | Oil wicking test | |
|---|---|---|
| | Height in mm | |
| No of Hours | F(CONTROL 20) | F(33) |
| 16 | 11 | 2 |
| 24 | 12 | 2 |
| 96 | 16 | 3 |
| 168 | 16 | 5 |
| 216 | 18 | 6 |

Table 9 shows the height that the oil has wicked up the coated glasscloth piece as a function of time. It can be readily seen that the coating employing a HPTFE/LPTFE/PFA system, coating F(33) was considerably more resistant to oil ingress and wicking along the fabric fibers. It is believed that such improvement is due to a much more intimate contact between the coating and the glasscloth in the case of the F(33) coating versus the control F(20). Furthermore, it is also believed that this reduction in permeability is further facilitated by the essentially void free nature of the present coating systems, as discussed in the light transmission test of Example 6 above.

Example 8

Adhesion Test

Adhesion tests were conducted under the following conditions: (1) the test was completed on a Lloyd LRX Tensometer; (2) Samples 25 mm wide, 200 mm in length are prepared by sealing 2 strips of fabric with PFA film (temperature 375° C., 25 seconds).

The test is conducted at a speed of 100 mm/min for a distance of 25 mm. An average reading of 3 measurements are quoted, and the units of measurement are lbs/f.

The results are set forth in Table 10 below:

TABLE 10

| | Adhesion test | |
|---|---|---|
| Coating # | Instantaneous Force (lbf) | Kinetic Force (lbf) |
| F(Control A) | 4.32 | 2.29 |
| F(Control B) | 5.93 | 4.77 |
| F(1) | 6.24 | 4.32 |
| F(2) | — | — |
| F(3) | — | — |
| F(4) | 5.73 | 6.21 |
| F(5) | — | — |
| F(6) | — | — |
| F(7) | — | — |
| F(8) | — | — |
| F(9) | 5.88 | 5.96 |
| F(10) | 3.08 | 2.78 |
| F(11) | 6.68 | 6.43 |
| F(12) | 2.99 | 3.41 |
| F(13) | — | — |
| F(13) recure | — | — |
| F(14) | — | — |
| F(14) recure | — | — |
| F(15) | 3.03 | 1.59 |
| F(16) | — | — |
| F(Control 17) | 2.44 | 1.4 |
| F(Control 18) | 4.32 | 2.29 |
| F(Control 19) | 5.93 | 4.77 |
| F(Control 20) | 5.67 | 5.12 |
| F(21) | 6.36 | 5.66 |
| F(21) recure | — | — |
| F(22) | 5.09 | 4.71 |
| F(22) recure | — | — |
| F(23) | 4.5 | 4.85 |
| F(23) recure | 4.97 | 3.91 |
| F(24) | 5.84 | 4.04 |
| F(24) recure | — | — |
| F(25) | 7.64 | 6.02 |
| F(25) recure | — | — |
| F(26) | 5.18 | 4.25 |
| F(27) | 4.69 | 2.92 |
| F(28) | — | — |
| F(29) | — | — |
| F(30) | — | — |
| F(31) | 5.48 | 3.67 |
| F(Control 32) | 9.09 | 3.97 |
| F(33) | 4.68 | 4.09 |
| F(34) | 5.25 | 5.12 |
| F(35) | 5.37 | 3.75 |
| F(36) | 4.78 | 5.14 |
| F(37) | 5.77 | 4.92 |
| F(38) | 5.21 | 5.29 |
| F(39) | 5.21 | 5.29 |
| F(40) | 4.16 | 3.83 |
| F(41) | 4.68 | 3.46 |
| F(42) | 4.63 | 3.19 |
| F(43) | 5.06 | 3.65 |
| F(44) | 4.74 | 3.61 |
| F(45) | 4.21 | 3.37 |
| F(Control 46) | 6.46 | 4.38 |
| F(47) | 4.6 | 4.55 |
| F(48) | 6.43 | 4.15 |
| F(49) | 5.48 | 3.37 |
| F(50) | 3.94 | 3.57 |
| F(51) | 8.74 | 6.91 |
| F(52) | 3.74 | 3.95 |
| F(53) | 4.66 | 4.15 |
| F(54) | 6.22 | 5.23 |
| F(55) | 4.81 | 4.62 |
| F(56) | 3.94 | 3.65 |
| F(57) | 3.08 | 2.87 |
| F(58) | 5.01 | 4.82 |
| F(59) | 4.97 | 4.69 |
| F(60) | 6.07 | 5.79 |
| F(61) | 4.26 | 3.25 |
| F(62) | 5.49 | 5.5 |
| F(63) | 4.46 | 3.88 |
| F(64) | 4.48 | 4.32 |
| F(65) | 5.09 | 4.23 |

The results in Table 10 show that the adhesion properties of the control topcoats are either maintained or show a slight improvement in the present coating compositions when applied to flexible glass substrates, indicating that the addition of the coating compositions does not interfere with the adhesion of the coating to the substrate.

Example 9

Statistical Analysis of the Use of LPTFE Micropowders as the LPTFE Component in HPTFE/MPF/LPTFE Blends Two LPTFE micropowders were examined as the LPTFE components of the HPTFE/MPF/LPTFE topcoats, and were these were compared with their dispersion LPTFE equivalents. The results are shown in Table 11 below. Examination of Table 11 reveals that the blends made using the micropowders TF9207 (topcoat F(44)) and UF8TA (topcoat F(45)) as denoted by "HPTFE+HPTFE+HPTFE, PFA, MicroP" behave similarly to topcoats that include LPTFE obtained via emulsion polymerization and without being subjected to agglomeration, thermal degradation, or irradiation. The topcoats that include LPTFE micropowders were also observed to be generally superior to pure HPTFE-based topcoats.

However, the HPTFE+HPTFE+HPTFE, PFA, MicroP topcoats do show inferior abrasion resistance when compared to the HPTFE/MPF/LPTFE topcoats, and hence might be considered intermediate in performance between pure HPTFE topcoats and HPTFE/MPF/LPTFE topcoats.

It should be noted that, for the Taber wear test/Taber wear index (TWI) data, lower values equate to superior performance.

TABLE 11

| Test | Coating System Type (Basecoat + Midcoat + Topcoat) | Table 1 Coating F# | Number | Mean |
|---|---|---|---|---|
| Initial Ambient RAT by Coating System | HPTFE + HPTFE + HPTFE, PFA, LPTFE, | 7, 8, 9, 13, 13 (recured), 38, 40, 41, 42, 43 | 10 | 12900 |
| | HPTFE + HPTFE + HPTFE, PFA, FEP, LPTFE, | 39 | 1 | 10000 |
| | HPTFE + HPTFE + HPTFE, FEP, LPTFE, | 28, 29 | 2 | 8000 |
| | HPTFE + HPTFE + HPTFE, PFA, MicroP | 44, 45 | 2 | 7500 |
| | HPTFE + HPTFE + HPTFE, | A, B, 12, 17, 18, 19, 46 | 7 | 3857 |
| Ambient RAT at 10% by Coating System | HPTFE + HPTFE + HPTFE, PFA, FEP, LPTFE, | 39 | 1 | 27000 |
| | HPTFE + HPTFE + HPTFE, PFA, LPTFE, | 7, 8, 9, 13, 13 (recured), 38, 40, 41, 42, 43 | 10 | 20700 |
| | HPTFE + HPTFE + HPTFE, FEP, LPTFE, | 28, 29 | 2 | 20000 |
| | HPTFE + HPTFE + HPTFE, PFA, MicroP | 44, 45 | 2 | 11500 |
| | HPTFE + HPTFE + HPTFE, | A, B, 12, 17, 18, 19, 46 | 7 | 8285.7 |
| Taber Wear Index (TWI 1000) by Coating System | HPTFE + HPTFE + HPTFE, PFA, MicroP | 44, 45 | 2 | 38.00 |
| | HPTFE + HPTFE + HPTFE, PFA, FEP, LPTFE, | 39 | 1 | 24.00 |
| | HPTFE + HPTFE + HPTFE, PFA, LPTFE, | 7, 8, 9, 13, 13 (recured), 38, 40, 41, 42, 43 | 10 | 23.26 |
| | HPTFE + HPTFE + HPTFE, | A, B, 12, 17, 18, 19, 46 | 7 | 20.86 |
| | HPTFE + HPTFE + HPTFE, FEP, LPTFE, | 28, 29 | 2 | 16.50 |
| Taber Wear Index (TWI 2000) by Coating System | HPTFE + HPTFE + HPTFE, PFA, MicroP | 44, 45 | 2 | 30.90 |
| | HPTFE + HPTFE + HPTFE, | A, B, 12, 17, 18, 19, 46 | 7 | 27.43 |
| | HPTFE + HPTFE + HPTFE, PFA, LPTFE, | 7, 8, 9, 13, 13 (recured), 38, 40, 41, 42, 43 | 10 | 24.35 |
| | HPTFE + HPTFE + HPTFE, PFA, FEP, LPTFE, | 39 | 1 | 17.00 |
| | HPTFE + HPTFE + HPTFE, FEP, LPTFE, | 28, 29 | 2 | 15.25 |
| Taber Wear Index (TWI 3000) by Coating System | HPTFE + HPTFE + HPTFE, | A, B, 12, 17, 18, 19, 46 | 7 | 29.81 |
| | HPTFE + HPTFE + HPTFE, PFA, MicroP | 44, 45 | 2 | 25.65 |
| | HPTFE + HPTFE + HPTFE, PFA, LPTFE, | 7, 8, 9, 13, 13 (recured), 38, 40, 41, 42, 43 | 10 | 24.32 |
| | HPTFE + HPTFE + HPTFE, PFA, FEP, LPTFE, | 39 | 1 | 16.00 |
| | HPTFE + HPTFE + HPTFE, FEP, LPTFE, | 28, 29 | 2 | 14.65 |
| Normalized abrasion testing by Coating System | HPTFE + HPTFE + HPTFE, PFA, FEP, LPTFE, | 39 | 1 | 0.71 |
| | HPTFE + HPTFE + HPTFE, FEP, LPTFE, | 28, 29 | 2 | 0.67 |
| | HPTFE + HPTFE + HPTFE, PFA, LPTFE, | 7, 8, 9, 13, 13 (recured), 38, 40, 41, 42, 43 | 10 | 0.66 |
| | HPTFE + HPTFE + HPTFE, PFA, MicroP | 44, 45 | 2 | 0.53 |
| | HPTFE + HPTFE + HPTFE, | A, B, 12, 17, 18, 19, 46 | 7 | 0.50 |
| Cookie release test by Coating System | HPTFE + HPTFE + HPTFE, FEP, LPTFE, | 28, 29 | 2 | 5.00 |
| | HPTFE + HPTFE + HPTFE, PFA, MicroP | 44, 45 | 2 | 4.50 |
| | HPTFE + HPTFE + HPTFE, PFA, LPTFE, | 7, 8, 9, 13 (recured), 38, 40, 41, 42, 43 | 9 | 3.67 |
| | HPTFE + HPTFE + HPTFE, | A, B, 12, 17, 18, 19, 46 | 7 | 3.57 |
| | HPTFE + HPTFE + HPTFE, PFA, FEP, LPTFE, | 39 | 1 | 2.00 |
| Pizza release test by Coating System | HPTFE + HPTFE + HPTFE, FEP, LPTFE, | 28, 29 | 2 | 5.00 |
| | HPTFE + HPTFE + HPTFE, PFA, FEP, LPTFE, | 39 | 1 | 5.00 |
| | HPTFE + HPTFE + HPTFE, PFA, LPTFE, | 7, 8, 9, 13, 13 (recured), 38, 40, 41, 42, 43 | 10 | 5.00 |
| | HPTFE + HPTFE + HPTFE, PFA, MicroP | 44, 45 | 2 | 5.00 |
| | HPTFE + HPTFE + HPTFE, | A, B, 12, 17, 18, 19, 46 | 7 | 4.29 |
| Chicken release test by Coating System | HPTFE + HPTFE + HPTFE, PFA, LPTFE, | 7, 8, 9, 13, 38, 43 | 6 | 4.50 |
| | HPTFE + HPTFE + HPTFE, PFA, MicroP | 44, 45 | 2 | 4.50 |
| | HPTFE + HPTFE + HPTFE, | A, B, 12, 17, 18, 19, 46 | 7 | 2.86 |
| | HPTFE + HPTFE + HPTFE, FEP, LPTFE, | 28, 29 | 2 | 2.50 |
| Normalized Release test by Coating System | HPTFE + HPTFE + HPTFE, PFA, MicroP | 44, 45 | 2 | 0.90 |
| | HPTFE + HPTFE + HPTFE, PFA, LPTFE, | 7, 8, 9, 13, 13 (recured), 38, 40, 41, 42, 43 | 10 | 0.80 |
| | HPTFE + HPTFE + HPTFE, FEP, LPTFE, | 28, 29 | 2 | 0.79 |
| | HPTFE + HPTFE + HPTFE, | A, B, 12, 17, 18, 19, 46 | 7 | 0.54 |
| | HPTFE + HPTFE + HPTFE, PFA, FEP, LPTFE, | 39 | 1 | 0.50 |
| Surface Roughness, | HPTFE + HPTFE + HPTFE, | A, B, 12, 17, 18, 19, 46 | 7 | 1.57 |
| | HPTFE + HPTFE + HPTFE, PFA, MicroP | 44, 45 | 2 | 1.02 |

TABLE 11-continued

| Test | Coating System Type (Basecoat + Midcoat + Topcoat) | Table 1 Coating F# | Number | Mean |
|---|---|---|---|---|
| Ra (microns) by Coating System | HPTFE + HPTFE + HPTFE, PFA, LPTFE, | 7, 8, 9, 13, 13 (recured), 38, 40, 41, 42, 43 | 10 | 0.82 |
| | HPTFE + HPTFE + HPTFE, FEP, LPTFE, | 28, 29 | 2 | 0.74 |
| | HPTFE + HPTFE + HPTFE, PFA, FEP, LPTFE, | 39 | 1 | 0.70 |
| Gloss by Coating System | HPTFE + HPTFE + HPTFE, PFA, FEP, LPTFE, | 39 | 1 | 54.40 |
| | HPTFE + HPTFE + HPTFE, FEP, LPTFE, | 28, 29 | 2 | 49.88 |
| | HPTFE + HPTFE + HPTFE, PFA, LPTFE, | 7, 8, 9, 13, 13 (recured), 38, 40, 41, 42, 43 | 10 | 40.73 |
| | HPTFE + HPTFE + HPTFE, PFA, MicroP | 44, 45 | 2 | 34.95 |
| | HPTFE + HPTFE + HPTFE, | A, B, 12, 17, 18, 19, 46 | 7 | 26.41 |

Example 10

Comparison of LPTFE/HPTFE/MPF Coating Compositions with HPTFE/MPF and HPTFE/LPTFE Coating Compositions A comparison of properties of two component topcoats of the type HPTFE/MPF and HPTFE/LPTFE with those of the three component topcoats of HPTFE/MPF/LPTFE is shown in Table 12 below. For the HPTFE/MPF topcoats the most significant weakness for these materials versus the HPTFE/MPF/LPTFE topcoats was in greatly reduced abrasion performance particularly in RAT testing, where these materials perform even worse than pure HPTFE topcoats. The HPTFE/LPTFE topcoats have even worse overall abrasion resistance than the HPTFE/MPF topcoats and in most other aspects are generally inferior to the HPTFE/MPF/LPTFE topcoats. When all the data for all the tests are normalized, the ranking shown in the last section of Table 12 is obtained (on a 0-1 scale), where it is clearly seen that the HPTFE/MPF/LPTFE topcoats are superior overall to those of the other types.

"Normalized" data are obtained from the following equations:

Normalized Surface Properties Calculation

Mean {[Maximum (Ra)−(Ra)]/[Maximum (Ra)−Minimum (Ra)],

[Gloss−Minimum (Gloss)]/[Maximum (Gloss)−Minimum (Gloss)],

[Contact Angle−Minimum (Contact Angle)]/[Maximum (Contact Angle)−Minimum (Contact Angle]}     Equation 1:

Normalized Adhesion Calculation

Mean {[Instantaneous Force−Minimum (Instantaneous Force)]/[Maximum (Instantaneous Force)−Minimum (Instantaneous Force)],

[Kinetic Force−Minimum (Kinetic Force)]/[Maximum (Kinetic Force)−Minimum (Kinetic Force)]}     Equation 2:

Normalized Abrasion Calculation

Mean {[RAT Ambient Initial−Minimum (RAT Ambient Initial)]/[Maximum (RAT Ambient Initial)−Minimum (RAT Ambient Initial)],

[RAT Ambient 10%−Minimum (RAT Ambient 10%)]/[Maximum (RAT Ambient 10%)−Minimum (RAT Ambient 10%)],

[Maximum (TWI 1000)−(TWI 1000)]/[Maximum (TWI 1000)−Minimum (TWI 1000)],

[Maximum (TWI 2000)−(TWI 2000)]/[Maximum (TWI 2000)−Minimum (TWI 2000)],

[Maximum (TWI 3000)−(TWI 3000)]/[Maximum (TWI 3000)−Minimum (TWI 3000)]}     Equation 3:

Normalized Release Calculation

Mean {[Egg Release−Minimum (Egg Release)]/[Maximum (Egg Release)−Minimum (Egg Release)],

[Release Cookie−Minimum (Release Cookie)]/[Maximum (Release Cookie)−Minimum (Release Cookie)],

[Release Pizza−Minimum (Release Pizza)]/[Maximum (Release Pizza)−Minimum (Release Pizza)],

[Release Chicken−Minimum (Release Chicken)]/[Maximum (Release Chicken)−Minimum (Release Chicken)]}     Equation 4:

Normalized all Data Calculation

Mean {Normalized Surface Properties, Normalized Adhesion, Normalized Abrasion, Normalized Release}     Equation 5:

That is, for each test where a maximum value is desirable the [actual values−the minimum value observed for that test] measured for all samples are divided by the range of values for that test, this normalizes the data on a 0-1 scale with 1 being best. However, if a minimum value is desirable for a test then the [maximum value−actual values] measured for all samples are divided by the range for that test, which again normalizes the data on a 0-1 scale with 1 being best. Then, to combine all tests of a certain type, e.g., release, the mean of all the normalized values is taken. A single value for all tests may then be calculated as per Equation 5 above.

TABLE 12

| Test | Coating System Type (Basecoat + Midcoat + Topcoat) | Table 1 Coating F# | Number | Mean |
|---|---|---|---|---|
| Initial Ambient RAT by Coating System | HPTFE + HPTFE + HPTFE, PFA, LPTFE, | 7, 8, 9, 13, 13 (recured), 38, 40, 41, 42, 43 | 10 | 12900 |
| | HPTFE + HPTFE + HPTFE, PFA, FEP, LPTFE, | 39 | 1 | 10000 |
| | HPTFE + HPTFE + HPTFE, FEP, LPTFE, | 28, 29 | 2 | 8000 |
| | HPTFE + HPTFE + HPTFE, FEP, | 48 | 1 | 4000 |
| | HPTFE + HPTFE + HPTFE, LPTFE, | 32 | 1 | 4000 |

TABLE 12-continued

| Test | Coating System Type (Basecoat + Midcoat + Topcoat) | Table 1 Coating F# | Number | Mean |
|---|---|---|---|---|
| | HPTFE + HPTFE + HPTFE, | A, B, 12, 17, 18, 19, 46 | 7 | 3857.1 |
| | HPTFE + HPTFE + HPTFE, PFA, | 47 | 1 | 3000 |
| Ambient | HPTFE + HPTFE + HPTFE, PFA, FEP, LPTFE, | 39 | 1 | 27000 |
| RAT at | HPTFE + HPTFE + HPTFE, PFA, LPTFE, | 7, 8, 9, 13, 13 (recured), 38, 40, 41, 42, 43 | 10 | 20700 |
| 10% by | | | | |
| Coating | HPTFE + HPTFE + HPTFE, FEP, LPTFE, | 28, 29 | 2 | 20000 |
| System | HPTFE + HPTFE + HPTFE, LPTFE, | 32 | 1 | 10000 |
| | HPTFE + HPTFE + HPTFE, | A, B, 12, 17, 18, 19, 46 | 7 | 8285.7 |
| | HPTFE + HPTFE + HPTFE, FEP, | 48 | 1 | 8000 |
| | HPTFE + HPTFE + HPTFE, PFA, | 47 | 1 | 6000 |
| Taber | HPTFE + HPTFE + HPTFE, LPTFE, | 32 | 1 | 53 |
| Wear Index | HPTFE + HPTFE + HPTFE, PFA, | 47 | 1 | 24 |
| (TWI | HPTFE + HPTFE + HPTFE, PFA, FEP, LPTFE, | 39 | 1 | 24 |
| 1000) by | HPTFE + HPTFE + HPTFE, PFA, LPTFE, | 7, 8, 9, 13, 13 (recured), 38, 40, 41, 42, 43 | 10 | 23.26 |
| Coating | | | | |
| System | HPTFE + HPTFE + HPTFE, | A, B, 12, 17, 18, 19, 46 | 7 | 20.86 |
| | HPTFE + HPTFE + HPTFE, FEP, | 48 | 1 | 18.00 |
| | HPTFE + HPTFE + HPTFE, FEP, LPTFE, | 28, 29 | 2 | 16.50 |
| Taber | HPTFE + HPTFE + HPTFE, LPTFE, | 32 | 1 | 35.00 |
| Wear Index | HPTFE + HPTFE + HPTFE, | A, B, 12, 17, 18, 19, 46 | 7 | 27.43 |
| (TWI | HPTFE + HPTFE + HPTFE, PFA, LPTFE, | 7, 8, 9, 13, 13 (recured), 38, 40, 41, 42, 43 | 10 | 24.35 |
| 2000) by | | | | |
| Coating | HPTFE + HPTFE + HPTFE, PFA, | 47 | 1 | 19.00 |
| System | HPTFE + HPTFE + HPTFE, FEP, | 48 | 1 | 18.00 |
| | HPTFE + HPTFE + HPTFE, PFA, FEP, LPTFE, | 39 | 1 | 17.00 |
| | HPTFE + HPTFE + HPTFE, FEP, LPTFE, | 28, 29 | 2 | 15.25 |
| Taber | HPTFE + HPTFE + HPTFE, | A, B, 12, 17, 18, 19, 46 | 7 | 29.81 |
| Wear Index | HPTFE + HPTFE + HPTFE, LPTFE, | 32 | 1 | 29.00 |
| (TWI | HPTFE + HPTFE + HPTFE, PFA, LPTFE, | 7, 8, 9, 13, 13 (recured), 38, 40, 41, 42, 43 | 10 | 24.32 |
| 3000) by | | | | |
| Coating | HPTFE + HPTFE + HPTFE, FEP, | 48 | 1 | 19.00 |
| System | HPTFE + HPTFE + HPTFE, PFA, | 47 | 1 | 18.00 |
| | HPTFE + HPTFE + HPTFE, PFA, FEP, LPTFE, | 39 | 1 | 16.00 |
| | HPTFE + HPTFE + HPTFE, FEP, LPTFE, | 28, 29 | 2 | 14.65 |
| Normalized | HPTFE + HPTFE + HPTFE, PFA, FEP, LPTFE, | 39 | 1 | 0.71 |
| abrasion | HPTFE + HPTFE + HPTFE, FEP, LPTFE, | 28, 29 | 2 | 0.67 |
| testing by | HPTFE + HPTFE + HPTFE, PFA, LPTFE, | 7, 8, 9, 13, 13 (recured), 38, 40, 41, 42, 43 | 10 | 0.66 |
| Coating | | | | |
| System | HPTFE + HPTFE + HPTFE, FEP, | 48 | 1 | 0.54 |
| | HPTFE + HPTFE + HPTFE, PFA, | 47 | 1 | 0.50 |
| | HPTFE + HPTFE + HPTFE, | A, B, 12, 17, 18, 19, 46 | 7 | 0.50 |
| | HPTFE + HPTFE + HPTFE, LPTFE, | 32 | 1 | 0.38 |
| Cookie | HPTFE + HPTFE + HPTFE, FEP, LPTFE, | 28, 29 | 2 | 5.00 |
| release test | HPTFE + HPTFE + HPTFE, FEP, | 48 | 1 | 4.00 |
| by Coating | HPTFE + HPTFE + HPTFE, LPTFE, | 32 | 1 | 4.00 |
| System | HPTFE + HPTFE + HPTFE, PFA, | 47 | 1 | 4.00 |
| | HPTFE + HPTFE + HPTFE, PFA, LPTFE, | 7, 8, 9, 13 (recured), 38, 40, 41, 42, 43 | 9 | 3.67 |
| | HPTFE + HPTFE + HPTFE, | A, B, 12, 17, 18, 19, 46 | 7 | 3.57 |
| | HPTFE + HPTFE + HPTFE, PFA, FEP, LPTFE, | 39 | 1 | 2.00 |
| Pizza | HPTFE + HPTFE + HPTFE, FEP, | 48 | 1 | 5.00 |
| release test | HPTFE + HPTFE + HPTFE, FEP, LPTFE, | 28, 29 | 2 | 5.00 |
| by Coating | HPTFE + HPTFE + HPTFE, LPTFE, | 32 | 1 | 5.00 |
| System | HPTFE + HPTFE + HPTFE, PFA, | 47 | 1 | 5.00 |
| | HPTFE + HPTFE + HPTFE, PFA, FEP, LPTFE, | 39 | 1 | 5.00 |
| | HPTFE + HPTFE + HPTFE, PFA, LPTFE, | 7, 8, 9, 13, 13 (recured), 38, 40, 41, 42, 43 | 10 | 5.00 |
| | HPTFE + HPTFE + HPTFE, | A, B, 12, 17, 18, 19, 46 | 7 | 4.29 |
| Chicken | HPTFE + HPTFE + HPTFE, PFA, LPTFE, | 39 | 6 | 4.50 |
| release test | HPTFE + HPTFE + HPTFE, FEP, | 48 | 1 | 3.00 |
| by Coating | HPTFE + HPTFE + HPTFE, LPTFE, | 32 | 1 | 3.00 |
| System | HPTFE + HPTFE + HPTFE, PFA, | 47 | 1 | 3.00 |
| | HPTFE + HPTFE + HPTFE, | A, B, 12, 17, 18, 19, 46 | 7 | 2.86 |
| | HPTFE + HPTFE + HPTFE, FEP, LPTFE, | 28, 29 | 2 | 2.50 |
| Normalized | HPTFE + HPTFE + HPTFE, PFA, LPTFE, | 7, 8, 9, 13, 13 (recured), 38, 40, 41, 42, 43 | 10 | 0.80 |
| Release | | | | |
| test by | HPTFE + HPTFE + HPTFE, FEP, LPTFE, | 28, 29 | 2 | 0.79 |
| Coating | HPTFE + HPTFE + HPTFE, FEP, | 48 | 1 | 0.72 |
| System | HPTFE + HPTFE + HPTFE, PFA, | 47 | 1 | 0.72 |
| | HPTFE + HPTFE + HPTFE, LPTFE, | 32 | 1 | 0.61 |
| | HPTFE + HPTFE + HPTFE, PFA, FEP, LPTFE, | 39 | 1 | 0.50 |
| | HPTFE + HPTFE + HPTFE, | A, B, 12, 17, 18, 19, 46 | 7 | 0.47 |

TABLE 12-continued

| Test | Coating System Type (Basecoat + Midcoat + Topcoat) | Table 1 Coating F# | Number | Mean |
|---|---|---|---|---|
| Surface Roughness, Ra (microns) by Coating System | HPTFE + HPTFE + HPTFE, | A, B, 12, 17, 18, 19, 46 | 7 | 1.57 |
| | HPTFE + HPTFE + HPTFE, FEP, | 48 | 1 | 0.84 |
| | HPTFE + HPTFE + HPTFE, LPTFE, | 32 | 1 | 0.84 |
| | HPTFE + HPTFE + HPTFE, PFA, | 47 | 1 | 0.82 |
| | HPTFE + HPTFE + HPTFE, PFA, LPTFE, | 7, 8, 9, 13, 13 (recured), 38, 40, 41, 42, 43 | 10 | 0.82 |
| | HPTFE + HPTFE + HPTFE, FEP, LPTFE, | 28, 29 | 2 | 0.74 |
| | HPTFE + HPTFE + HPTFE, PFA, FEP, LPTFE, | 39 | 1 | 0.70 |
| Gloss by Coating System | HPTFE + HPTFE + HPTFE, PFA, FEP, LPTFE, | 39 | 1 | 54.40 |
| | HPTFE + HPTFE + HPTFE, FEP, LPTFE, | 28, 29 | 2 | 49.88 |
| | HPTFE + HPTFE + HPTFE, LPTFE, | 32 | 1 | 46.40 |
| | HPTFE + HPTFE + HPTFE, PFA, | 47 | 1 | 45.50 |
| | HPTFE + HPTFE + HPTFE, FEP, | 48 | 1 | 44.50 |
| | HPTFE + HPTFE + HPTFE, PFA, LPTFE, | 7, 8, 9, 13, 13 (recured), 38, 40, 41, 42, 43 | 10 | 40.73 |
| | HPTFE + HPTFE + HPTFE, | A, B, 12, 17, 18, 19, 46 | 7 | 26.41 |
| Normalized Surface Properites by Coating System | HPTFE + HPTFE + HPTFE, PFA, FEP, LPTFE, | 39 | 1 | 0.833207 |
| | HPTFE + HPTFE + HPTFE, FEP, LPTFE, | 28, 29 | 2 | 0.782477 |
| | HPTFE + HPTFE + HPTFE, LPTFE, | 32 | 1 | 0.734279 |
| | HPTFE + HPTFE + HPTFE, PFA, | 47 | 1 | 0.72806 |
| | HPTFE + HPTFE + HPTFE, FEP, | 48 | 1 | 0.715351 |
| | HPTFE + HPTFE + HPTFE, PFA, LPTFE, | 7, 8, 9, 13, 13 (recured), 38, 40, 41, 42, 43 | 10 | 0.68109 |
| | HPTFE + HPTFE + HPTFE, | A, B, 12, 17, 18, 19, 46 | 7 | 0.435492 |
| Normalized all data by Coating System | HPTFE + HPTFE + HPTFE, FEP, LPTFE, | 28, 29 | 2 | 0.707215 |
| | HPTFE + HPTFE + HPTFE, PFA, LPTFE, | 7, 8, 9, 13, 13 (recured), 38, 40, 41, 42, 43 | 10 | 0.703294 |
| | HPTFE + HPTFE + HPTFE, FEP, | 48 | 1 | 0.65974 |
| | HPTFE + HPTFE + HPTFE, PFA, | 47 | 1 | 0.649057 |
| | HPTFE + HPTFE + HPTFE, PFA, FEP, LPTFE, | 39 | 1 | 0.647848 |
| | HPTFE + HPTFE + HPTFE, LPTFE, | 32 | 1 | 0.544165 |
| | HPTFE + HPTFE + HPTFE, | A, B, 12, 17, 18, 19, 46 | 7 | 0.436777 |

Example 11

Contour Plots

FIGS. 1-18 are contour plots of the measured characteristics, including RAT and TWI abrasion tests (Examples 3 and 4), cooking release tests (Example 5), and the roughness, contact angle and gloss tests (Example 2) plotted against PFA and LPTFE content for the topcoats in the Examples that include PFA.

FIGS. 19-36 are contour plots of the measured characteristics, including RAT and TWI abrasion tests (Examples 3 and 4), cooking release tests (Example 5), and the roughness, contact angle and gloss tests (Example 2) plotted against FEP and LPTFE content for the topcoats in the Examples that include FEP.

FIGS. 37-54 are contour plots of the measured characteristics, including RAT and TWI abrasion tests (Examples 3 and 4), cooking release tests (Example 5), and the roughness, contact angle and gloss tests (Example 2) plotted against MPF and LPTFE content for the topcoats in the Examples that include PFA, MFA and FEP (MPF).

Figure 15:
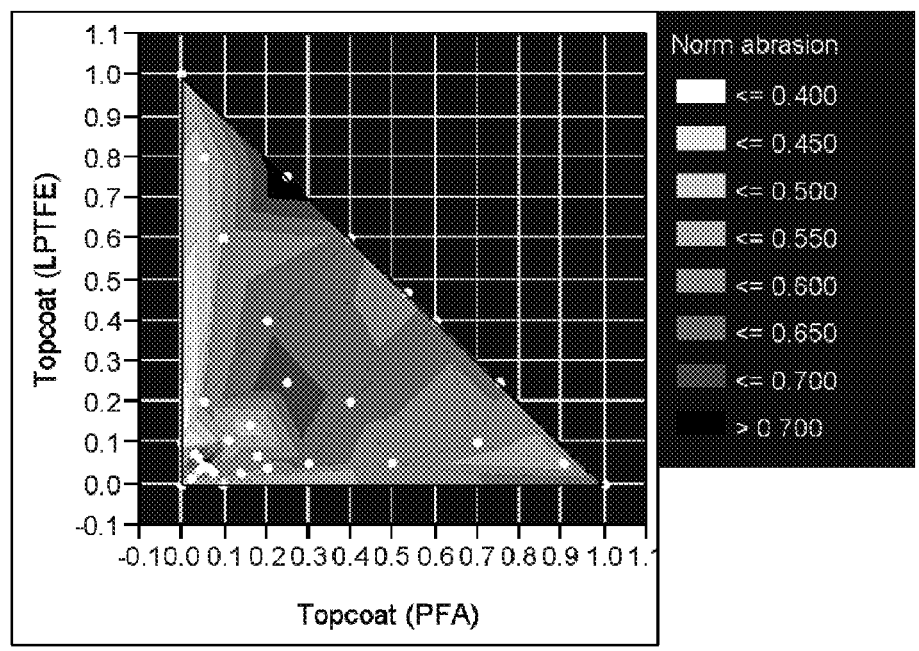
FIG. 15 shows a first contour plot of the normalized results of the RAT and TWI abrasion tests (Examples 3 and 4) plotted against PFA and LPTFE content for the topcoats in the Examples that include PFA, together with a second plot of the HPTFE-rich area of the first plot.
Figure 15:
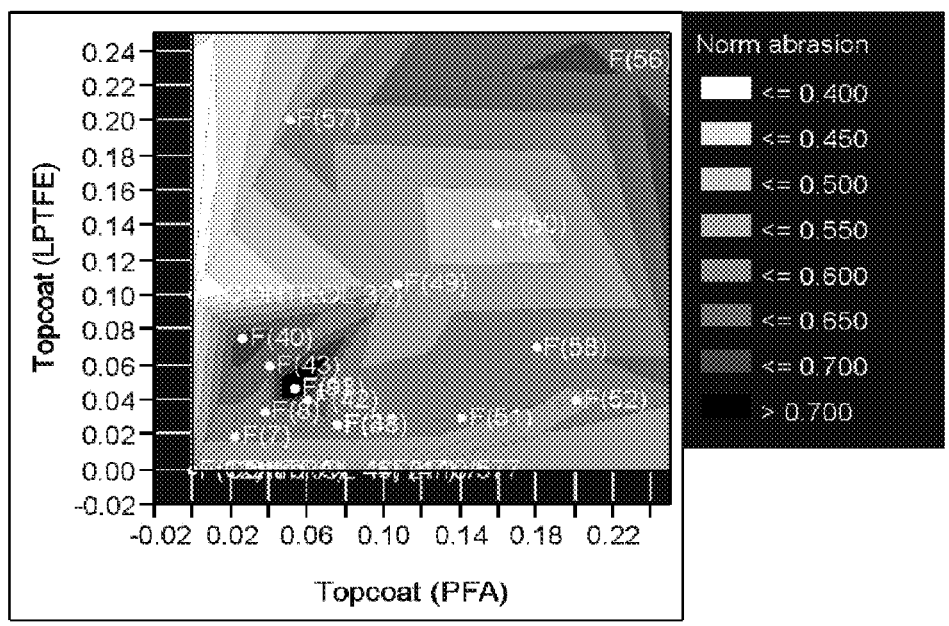
Figure 16:
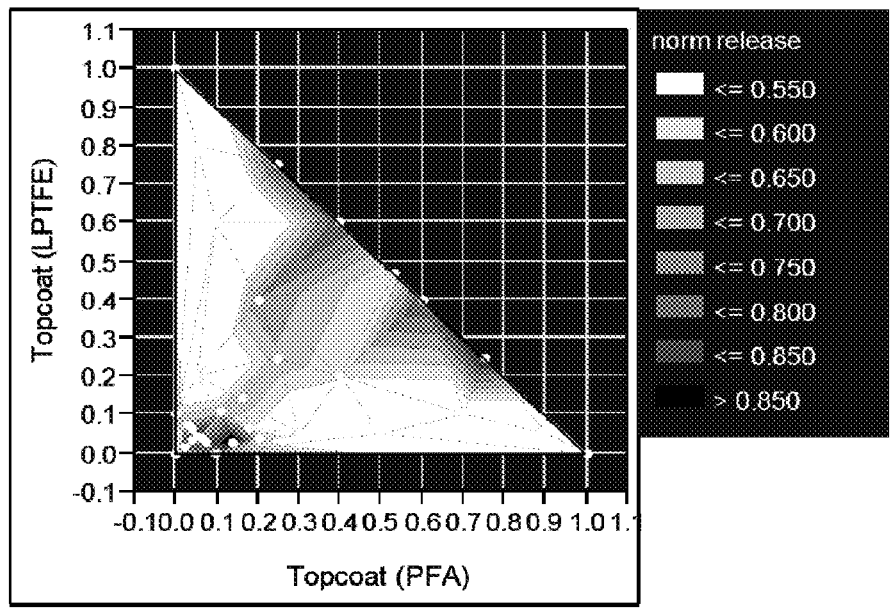
FIG. 16 shows a first contour plot of the normalized results of the cooking release tests (Example 5) plotted against PFA and LPTFE content for the topcoats in the Examples that include PFA, together with a second plot of the HPTFE-rich area of the first plot.
Figure 16:
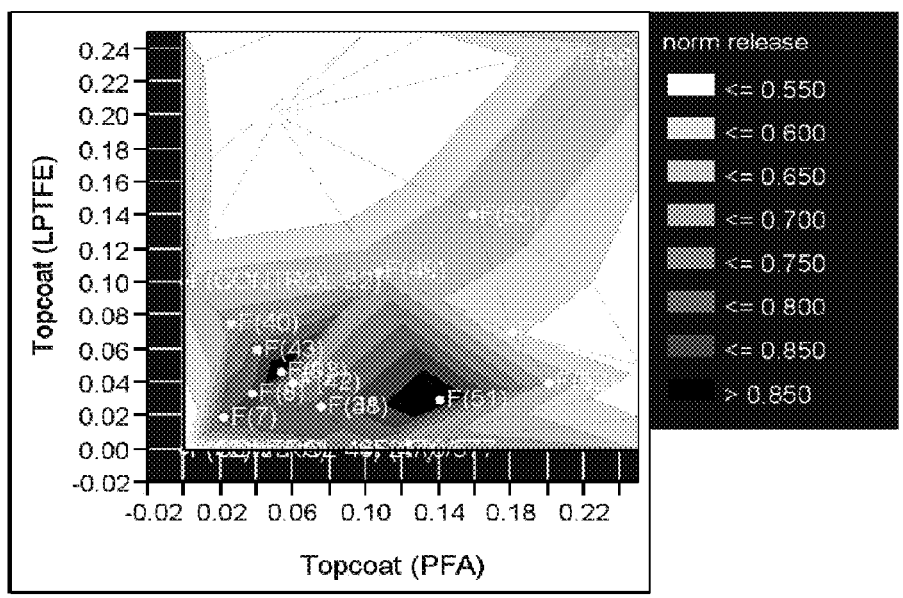
Figure 17:
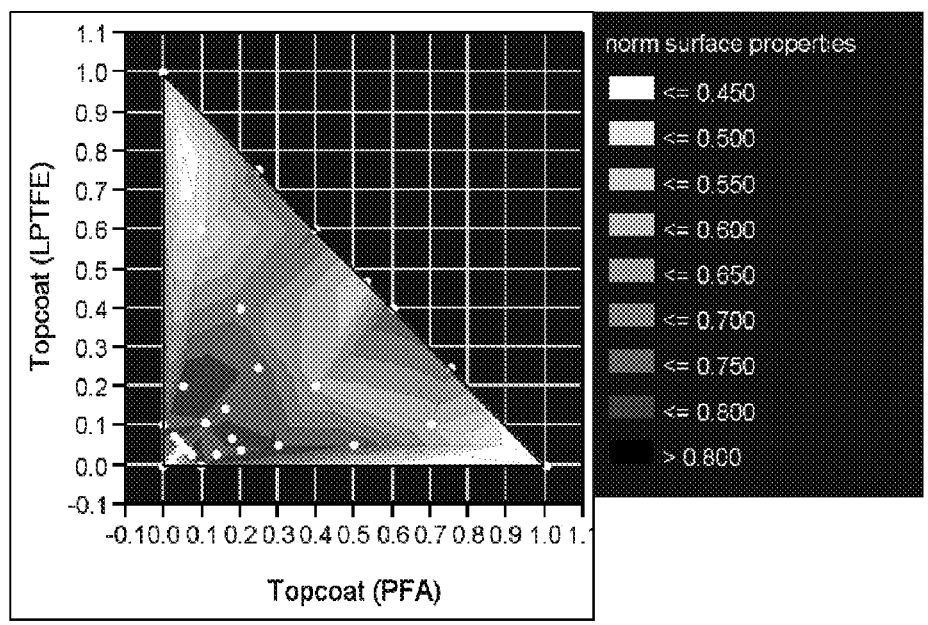
FIG. 17 shows a first contour plot of the normalized results of the roughness, gloss, and contact angle tests (Example 2) plotted against PFA and LPTFE content for the topcoats in the Examples that include PFA, together with a second plot of the HPTFE-rich area of the first plot.
Figure 17:
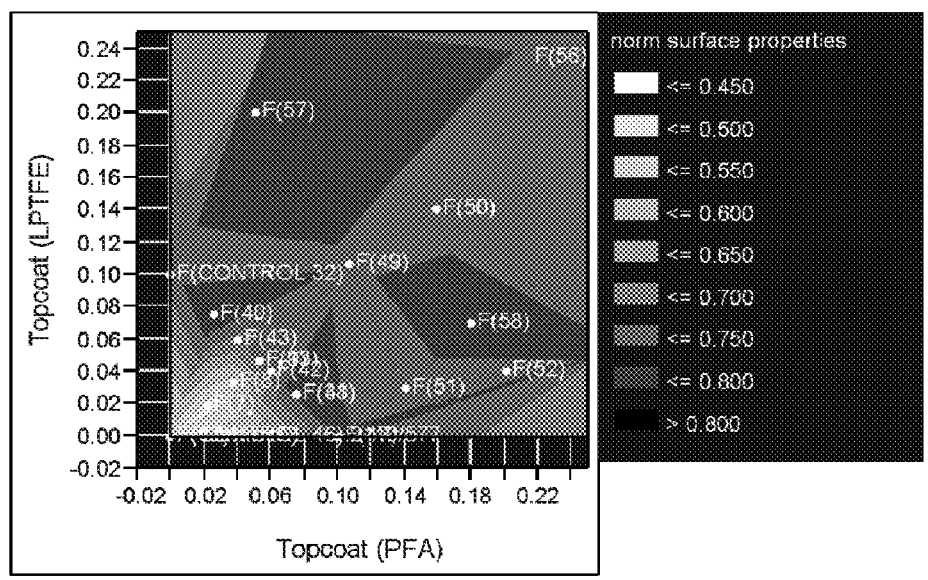
Figure 18:
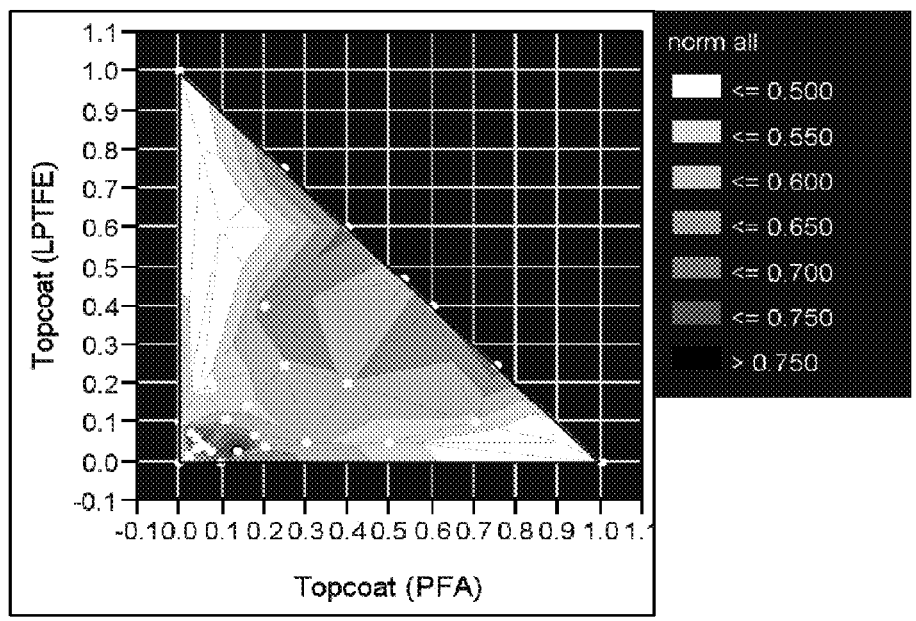
FIG. 18 shows a first contour plot of the normalized results of the RAT and TWI abrasion tests (Examples 3 and 4), the adhesion tests (Example 8), the cooking release tests (Example 5), and the roughness, gloss, and contact angle tests (Example 2) plotted against PFA and LPTFE content for the topcoats in the Examples that include PFA, together with a second plot of the HPTFE-rich area of the first plot.
Figure 18:
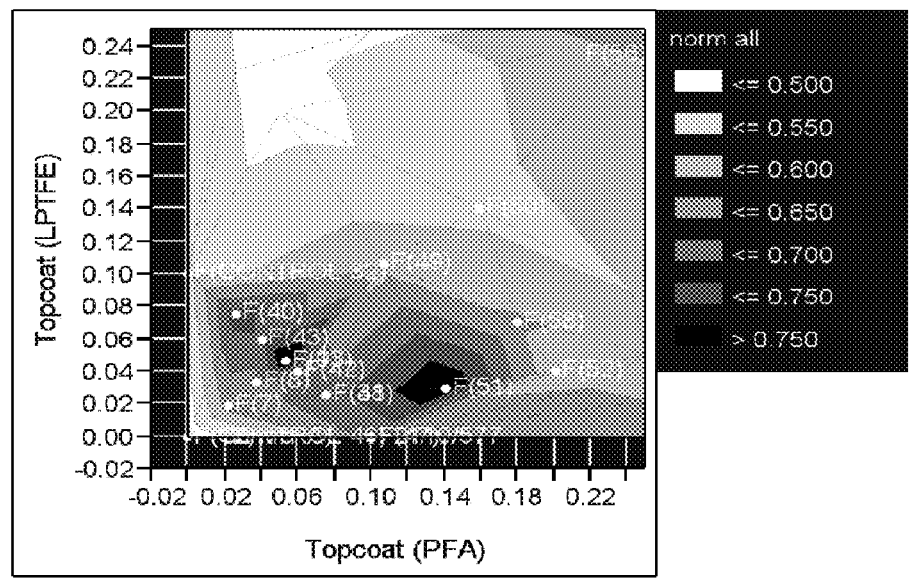
Figure 19:
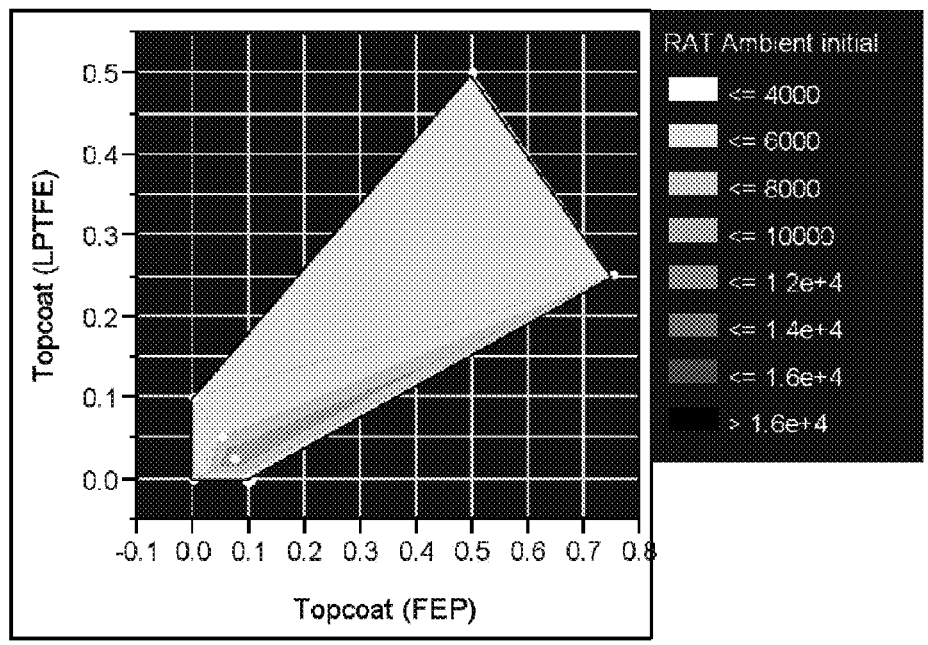
FIG. 19 shows a first contour plot of RAT ambient initial (Example 3) plotted against FEP and LPTFE content for the topcoats in the Examples that include FEP, together with a second plot of the HPTFE-rich area of the first plot.
Figure 19:
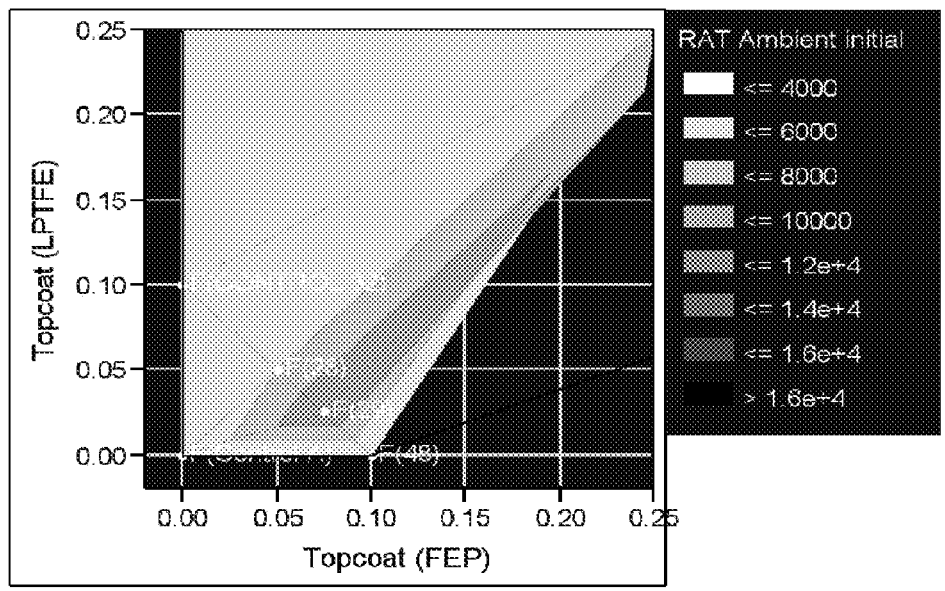
Figure 20:
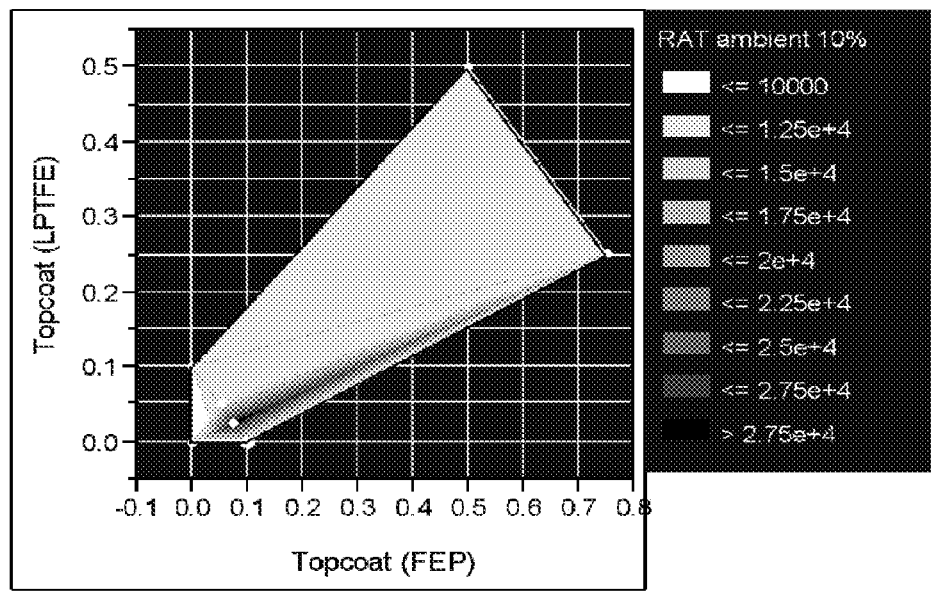
FIG. 20 shows a first contour plot of RAT ambient 10% (Example 3) plotted against FEP and LPTFE content for the topcoats in the Examples that include FEP, together with a second plot of the HPTFE-rich area of the first plot.
Figure 20:
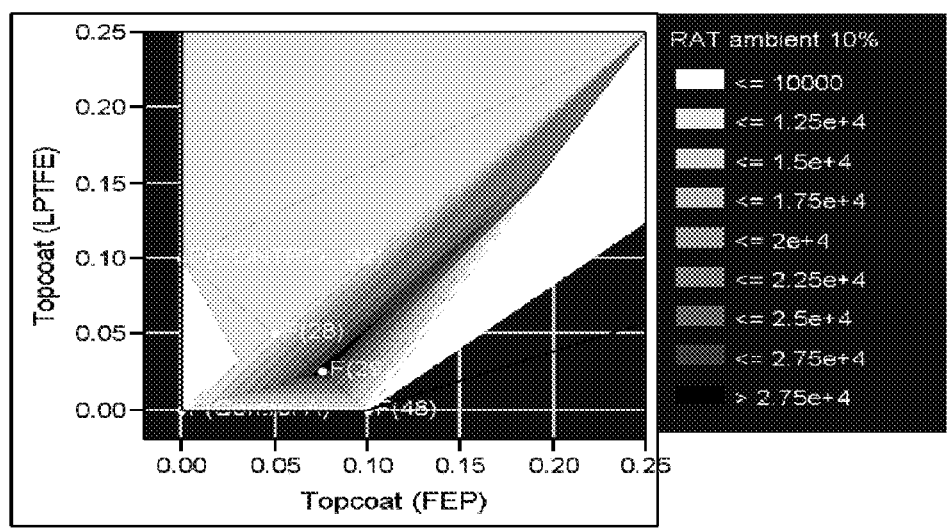
Figure 21:
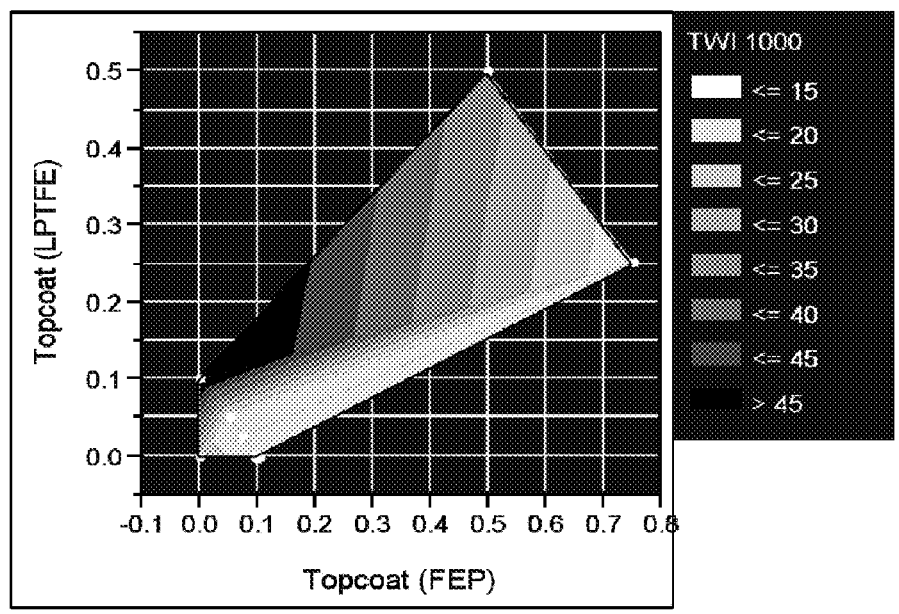
FIG. 21 shows a first contour plot of TWI 1000 (Example 4) plotted against FEP and LPTFE content for the topcoats in the Examples that include FEP, together with a second plot of the HPTFE-rich area of the first plot.
Figure 21:
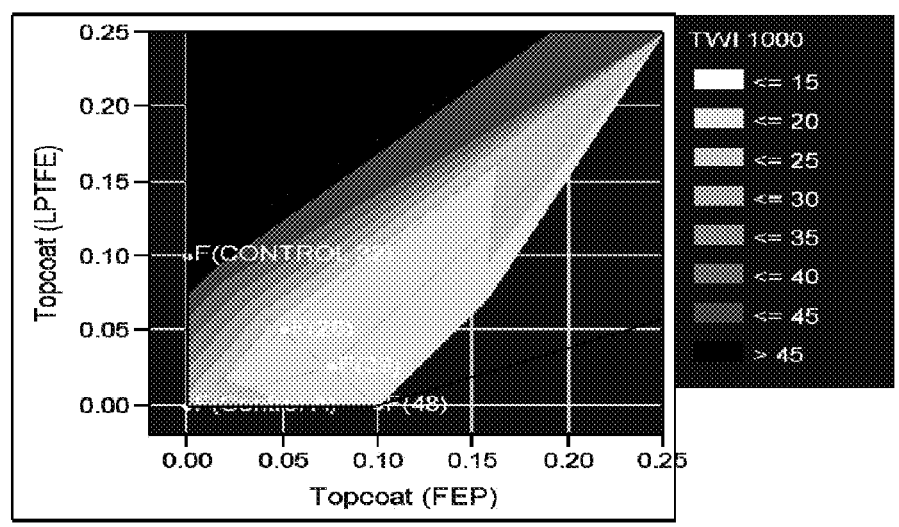
Figure 22:
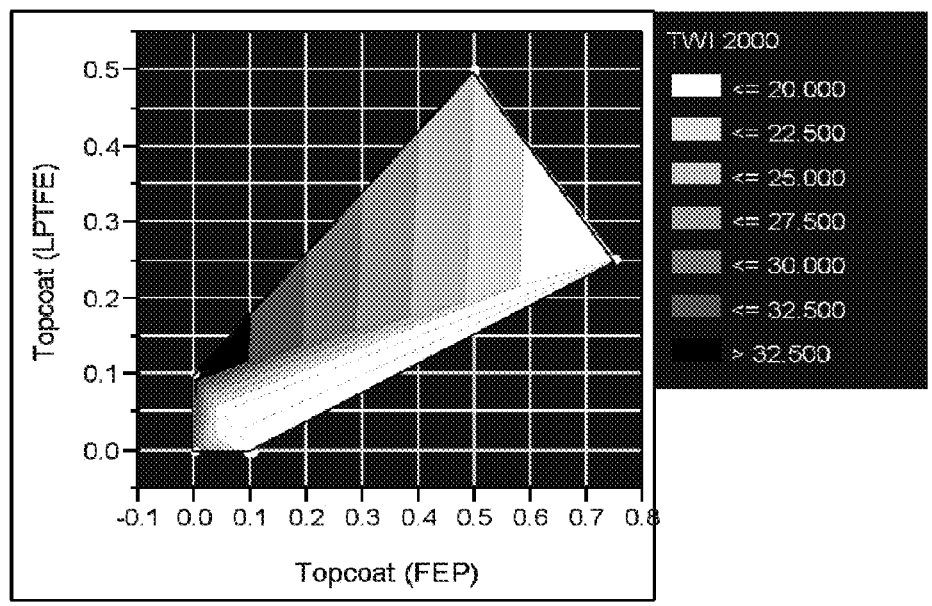
FIG. 22 shows a first contour plot of TWI 2000 (Example 4) plotted against FEP and LPTFE content for the topcoats in the Examples that include FEP, together with a second plot of the HPTFE-rich area of the first plot.
Figure 22:
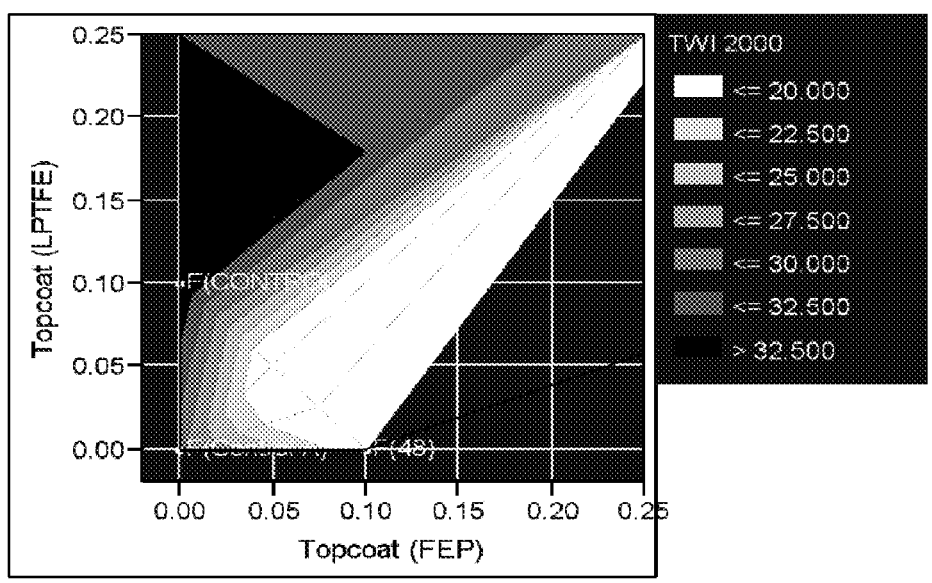
Figure 23:
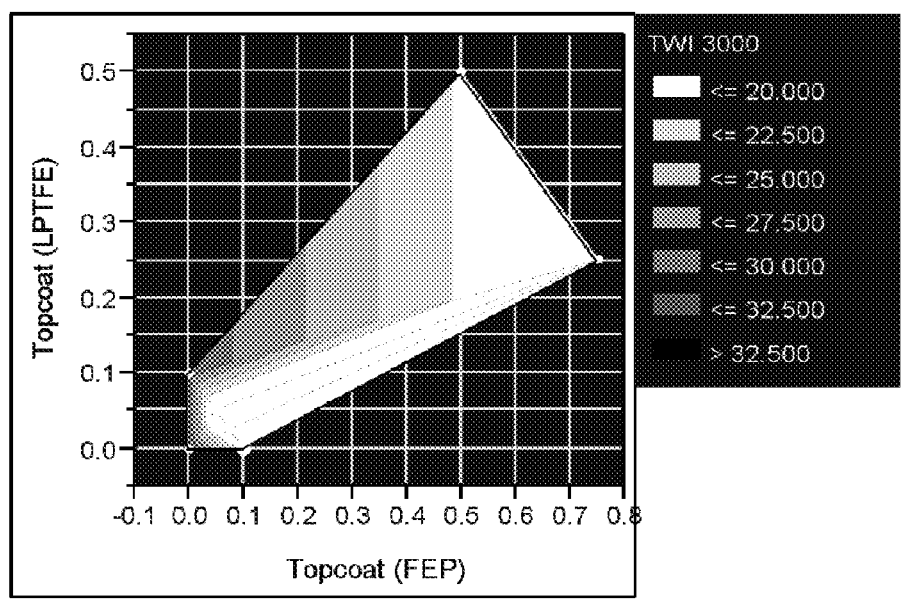
FIG. 23 shows a first contour plot of TWI 3000 (Example 4) plotted against FEP and LPTFE content for the topcoats in the Examples that include FEP, together with a second plot of the HPTFE-rich area of the first plot.
Figure 23:
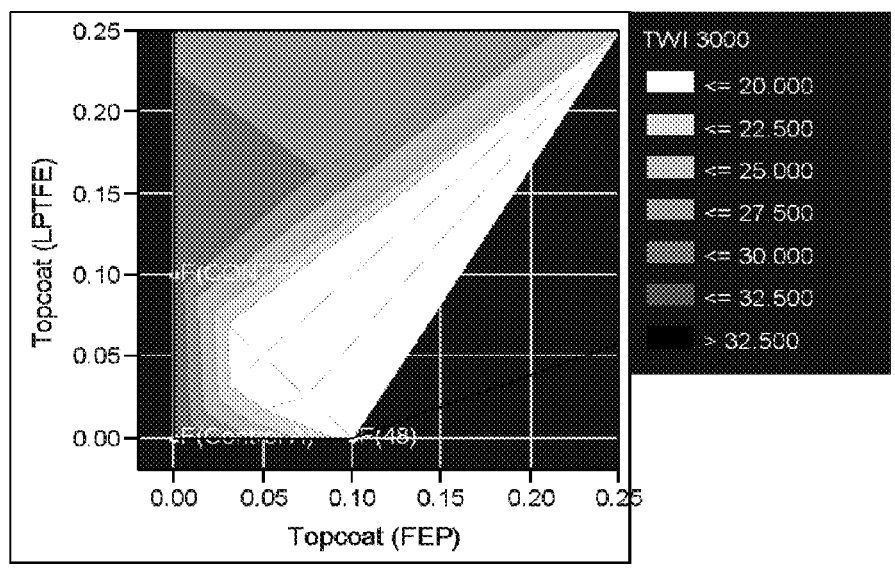
Figure 24:
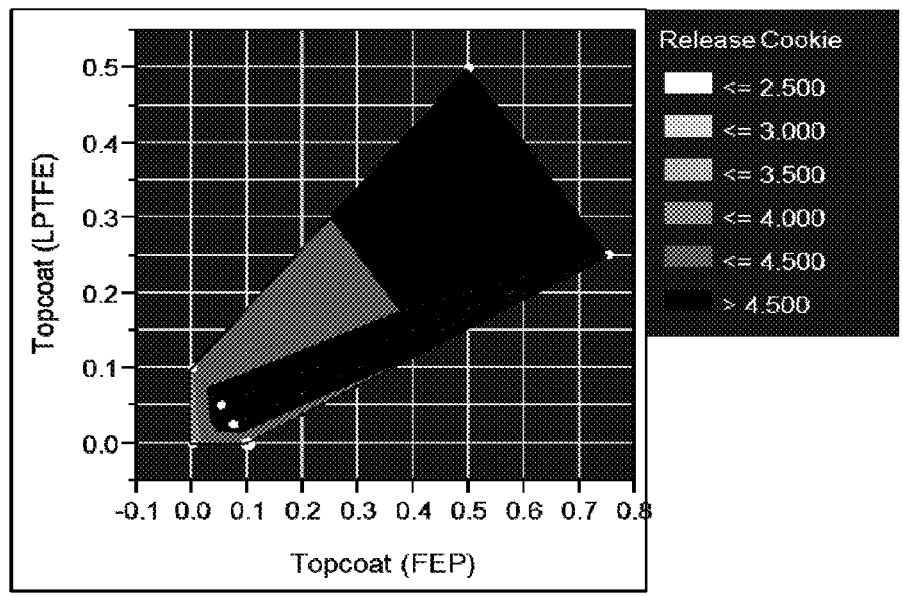
FIG. 24 shows a first contour plot of cookie dough cooking release (Example 5) plotted against FEP and LPTFE content for the topcoats in the Examples that include FEP, together with a second plot of the HPTFE-rich area of the first plot.
Figure 24:
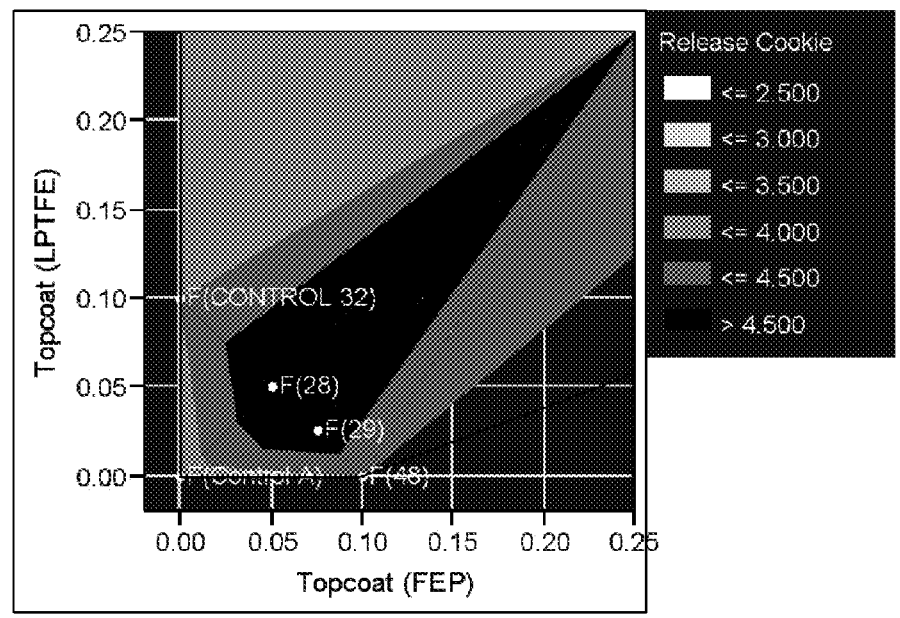
Figure 25:
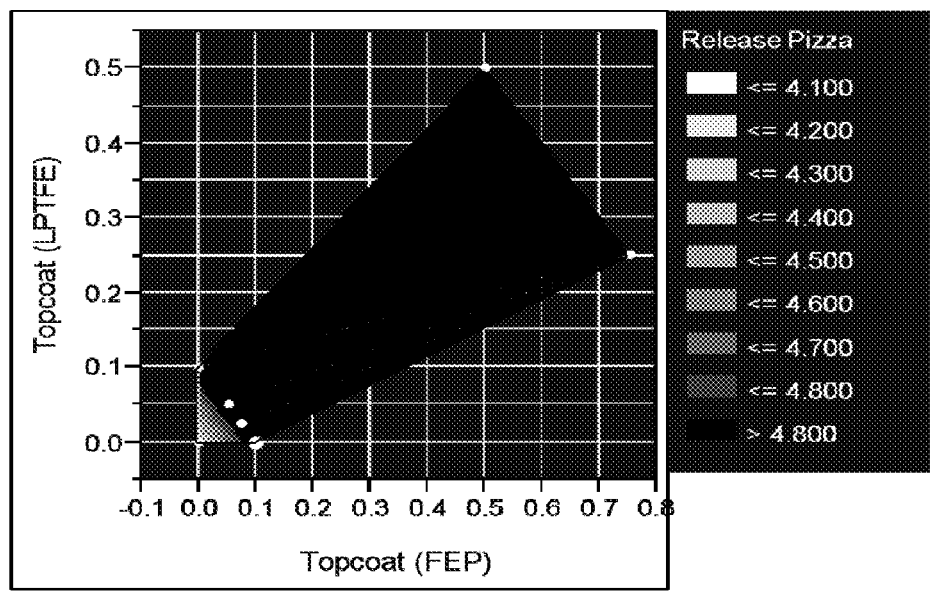
FIG. 25 shows a first contour plot of pizza dough cooking release (Example 5) plotted against FEP and LPTFE content for the topcoats in the Examples that include FEP, together with a second plot of the HPTFE-rich area of the first plot.
Figure 25:
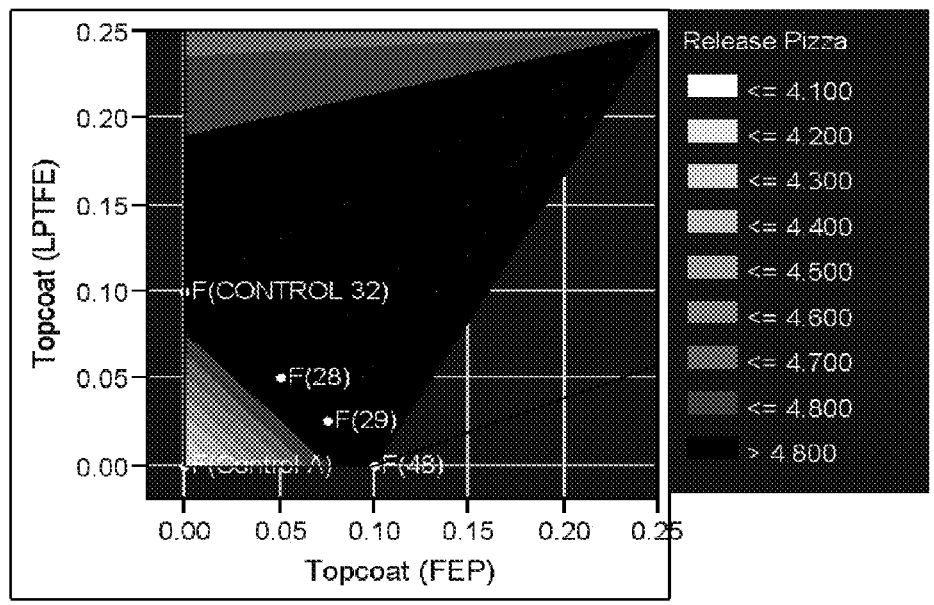
Figure 26:
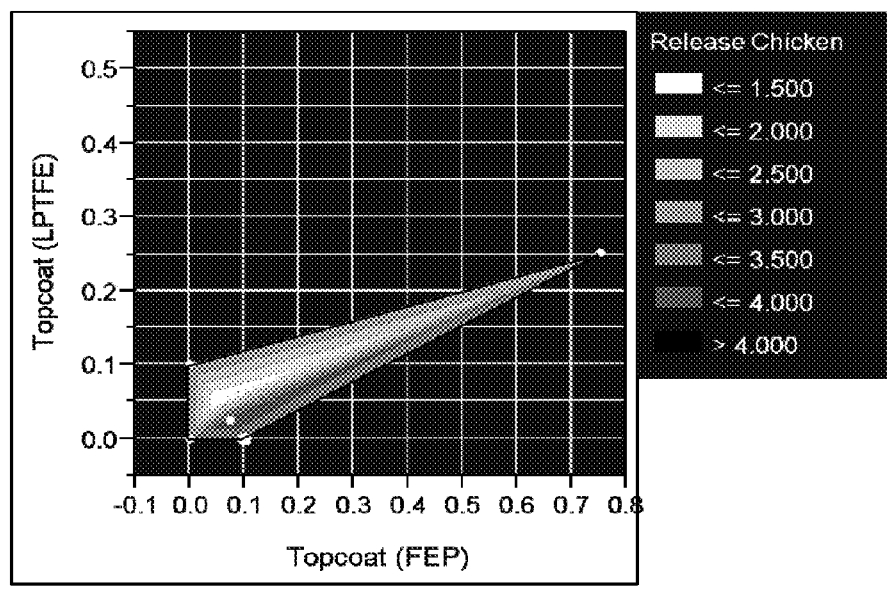
FIG. 26 shows a first contour plot of chicken cooking release (Example 5) plotted against FEP and LPTFE content for the topcoats in the Examples that include FEP, together with a second plot of the HPTFE-rich area of the first plot.
Figure 26:
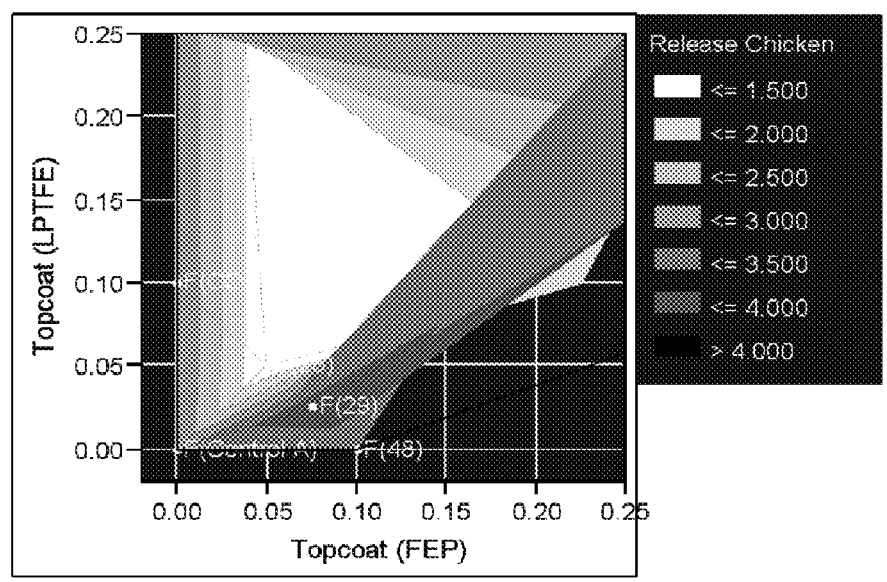
Figure 27:
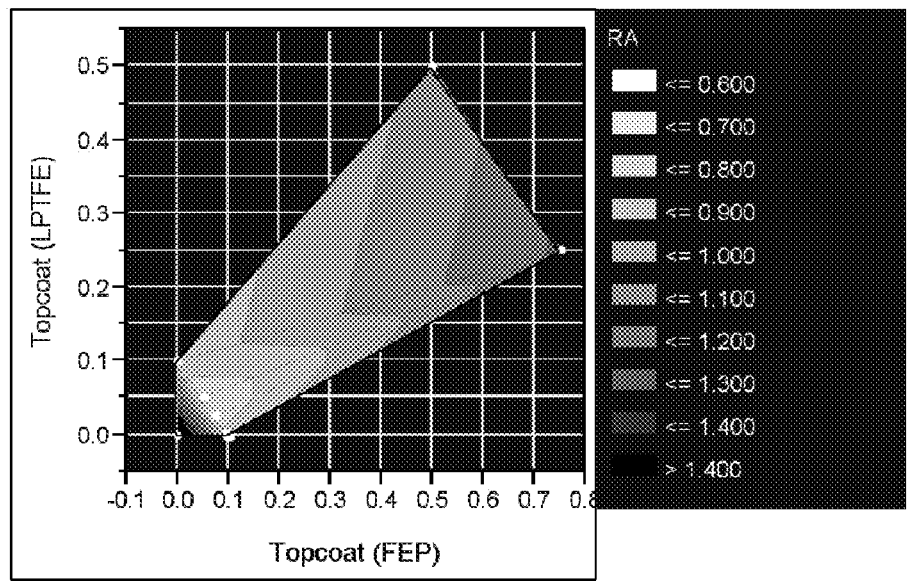
FIG. 27 shows a first contour plot of roughness (Example 2) plotted against FEP and LPTFE content for the topcoats in the Examples that include FEP, together with a second plot of the HPTFE-rich area of the first plot.
Figure 27:
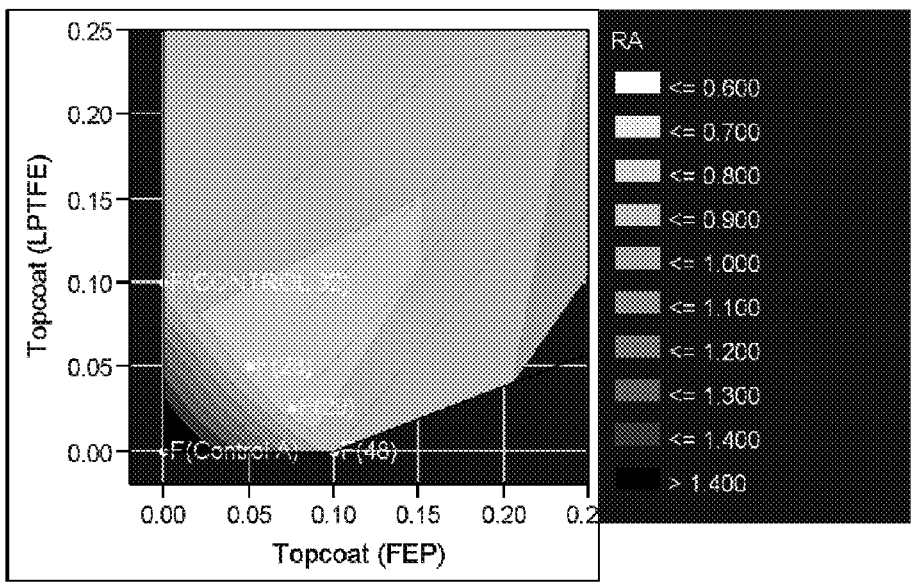
Figure 28:
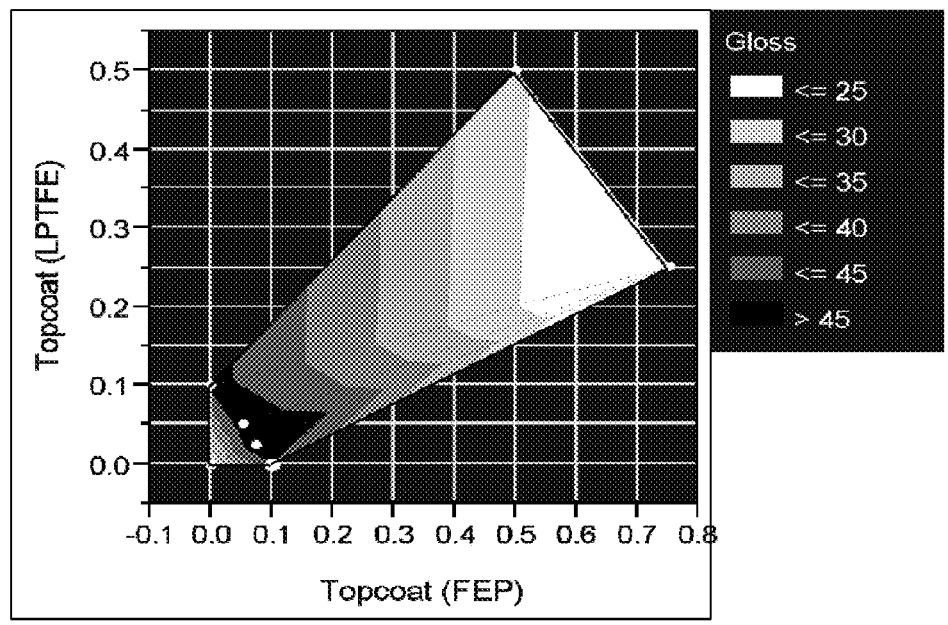
FIG. 28 shows a first contour plot of gloss (Example 2) plotted against FEP and LPTFE content for the topcoats in the Examples that include FEP, together with a second plot of the HPTFE-rich area of the first plot.
Figure 28:
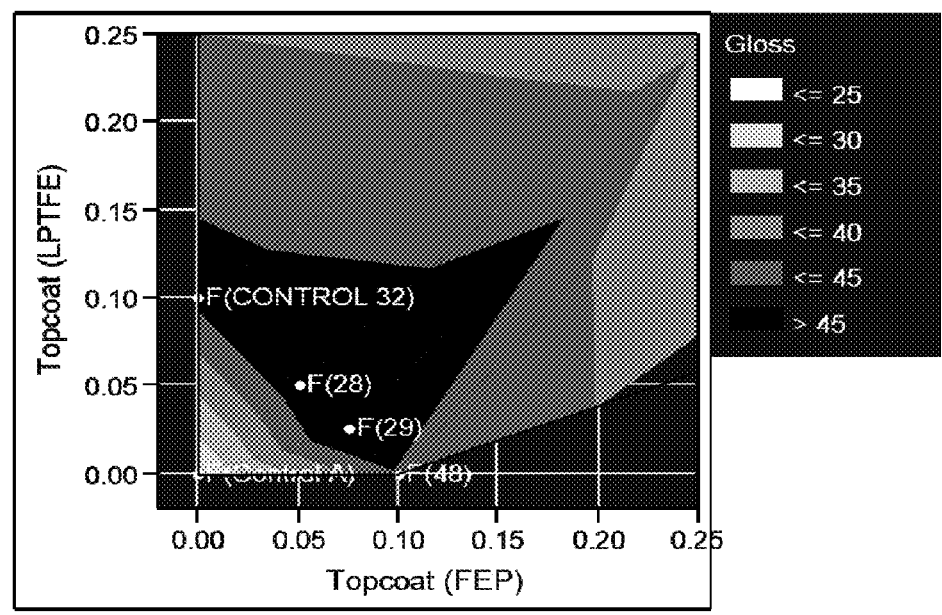
Figure 29:
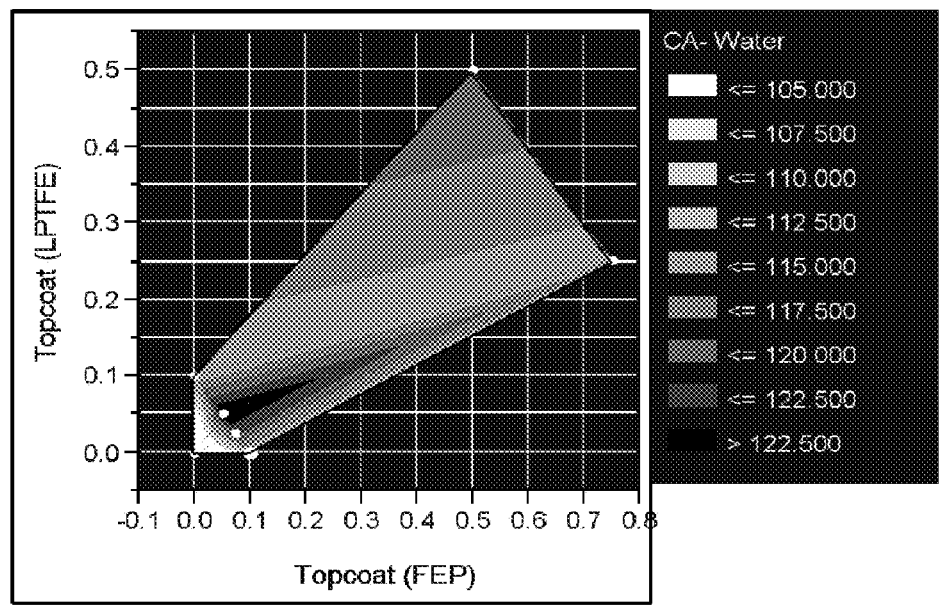
FIG. 29 shows a first contour plot of contact angle (Example 2) plotted against FEP and LPTFE content for the topcoats in the Examples that include FEP, together with a second plot of the HPTFE-rich area of the first plot.
Figure 29:
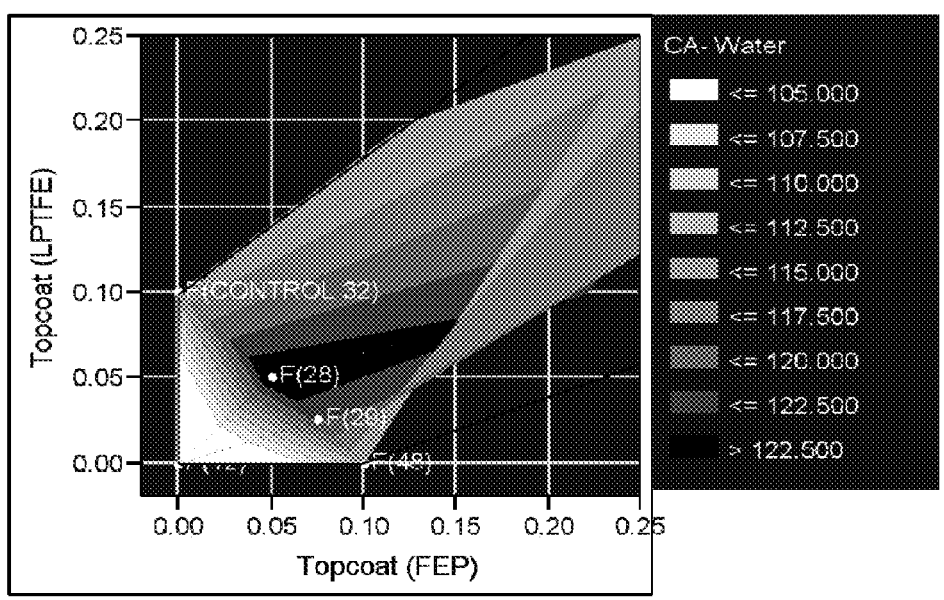
Figure 30:
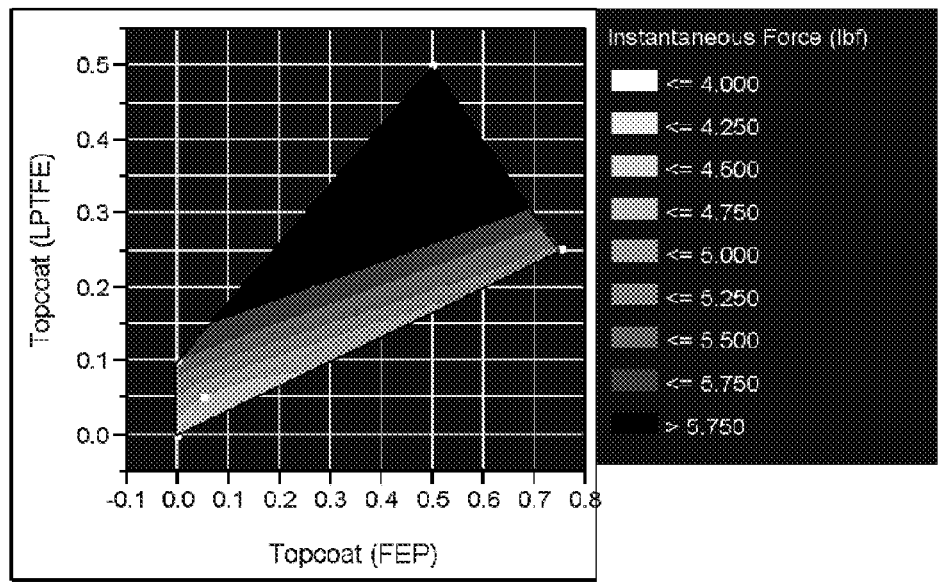
FIG. 30 shows a first contour plot of instantaneous force (Example 8) plotted against FEP and LPTFE content for the topcoats in the Examples that include FEP, together with a second plot of the HPTFE-rich area of the first plot.
Figure 30:
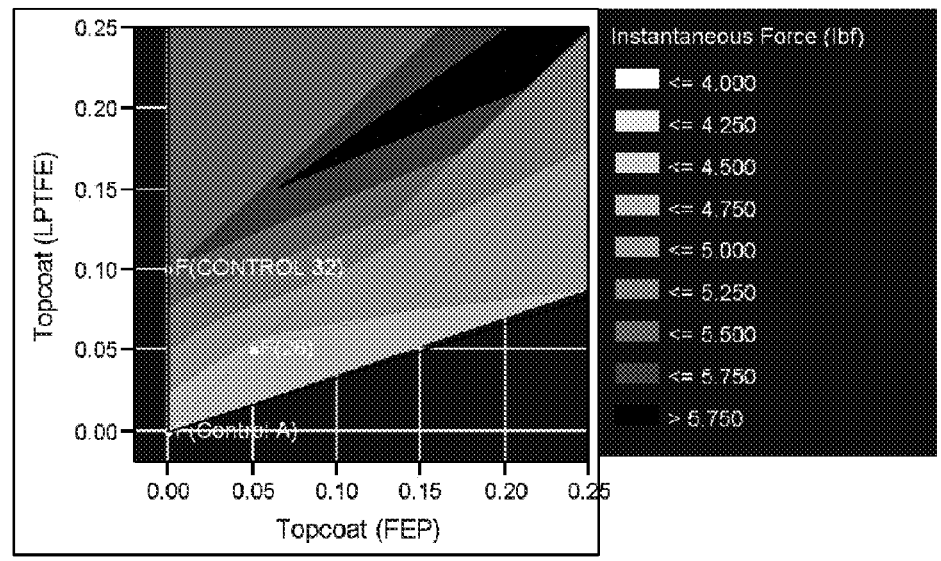
Figure 31:
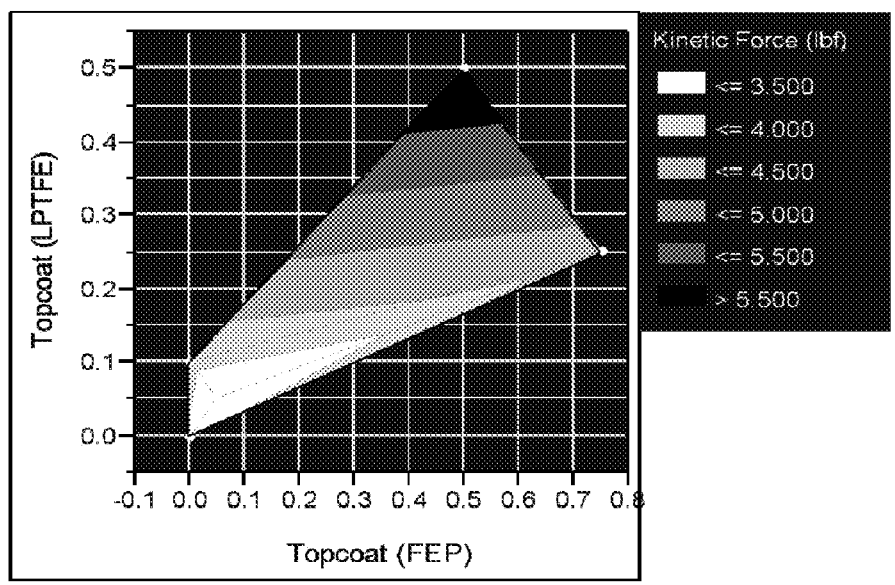
FIG. 31 shows a first contour plot of kinetic force (Example 8) plotted against FEP and LPTFE content for the topcoats in the Examples that include FEP, together with a second plot of the HPTFE-rich area of the first plot.
Figure 31:
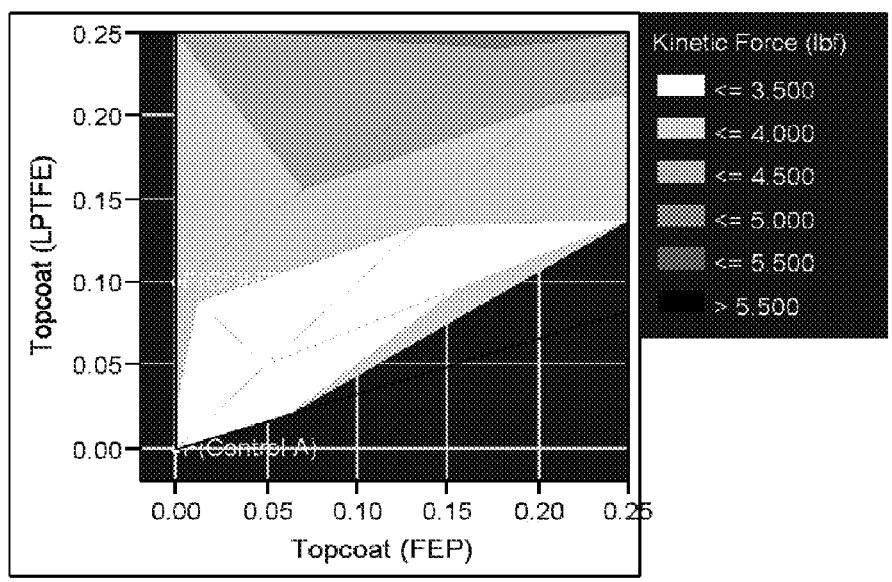
Figure 32:
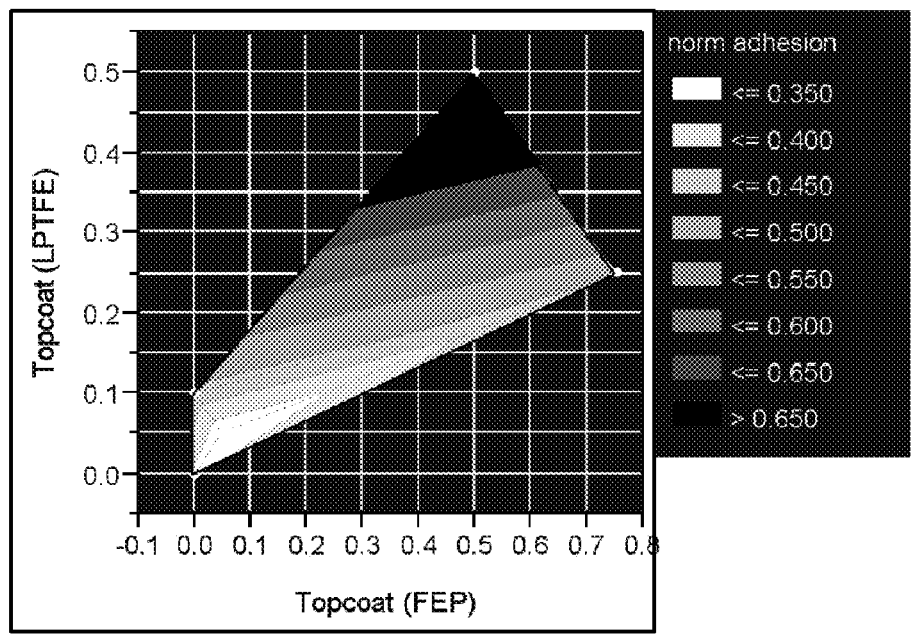
FIG. 32 shows a first contour plot of the normalized results of the adhesion tests (Example 8) plotted against FEP and LPTFE content for the topcoats in the Examples that include FEP, together with a second plot of the HPTFE-rich area of the first plot.
Figure 32:
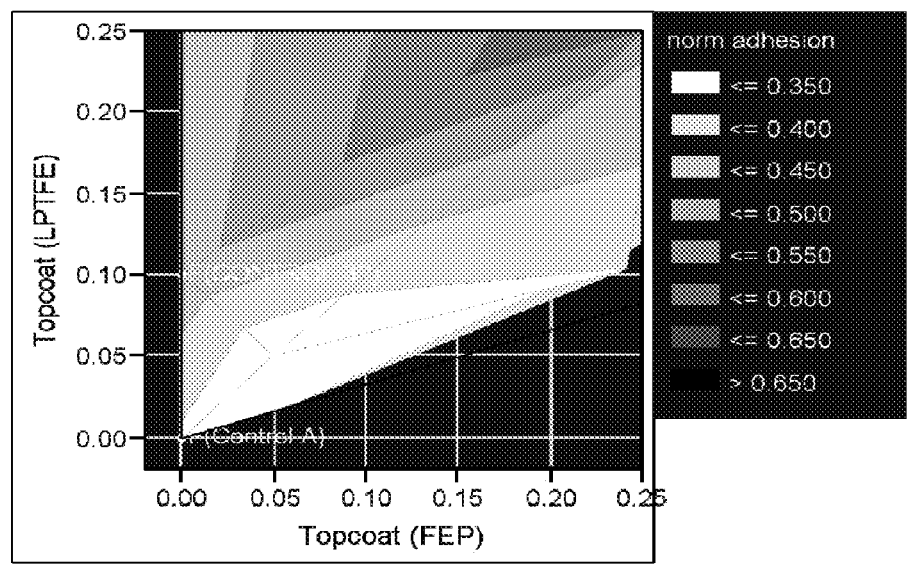
Figure 33:
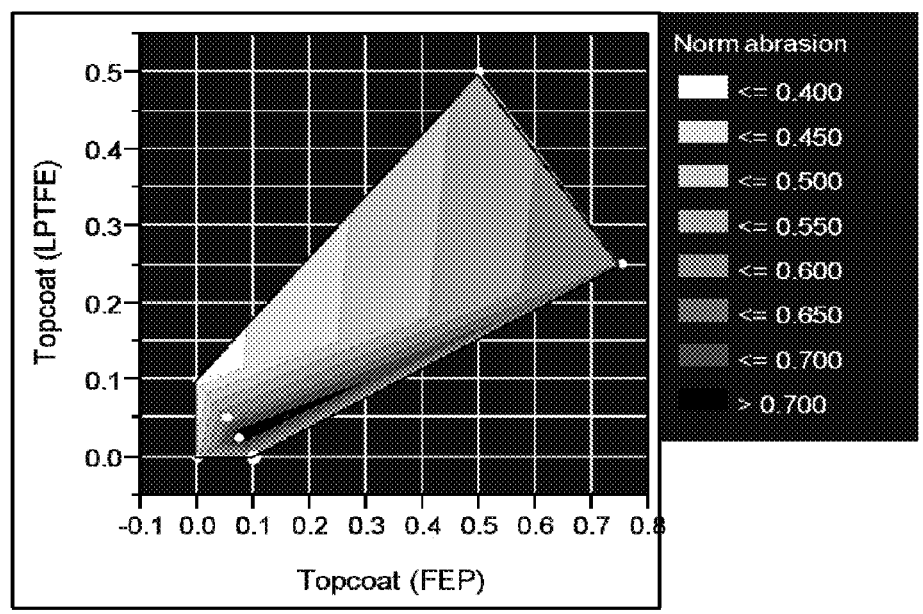
FIG. 33 shows a first contour plot of the normalized results of the RAT and TWI abrasion tests (Examples 3 and 4) plotted against FEP and LPTFE content for the topcoats in the Examples that include FEP, together with a second plot of the HPTFE-rich area of the first plot.
Figure 33:
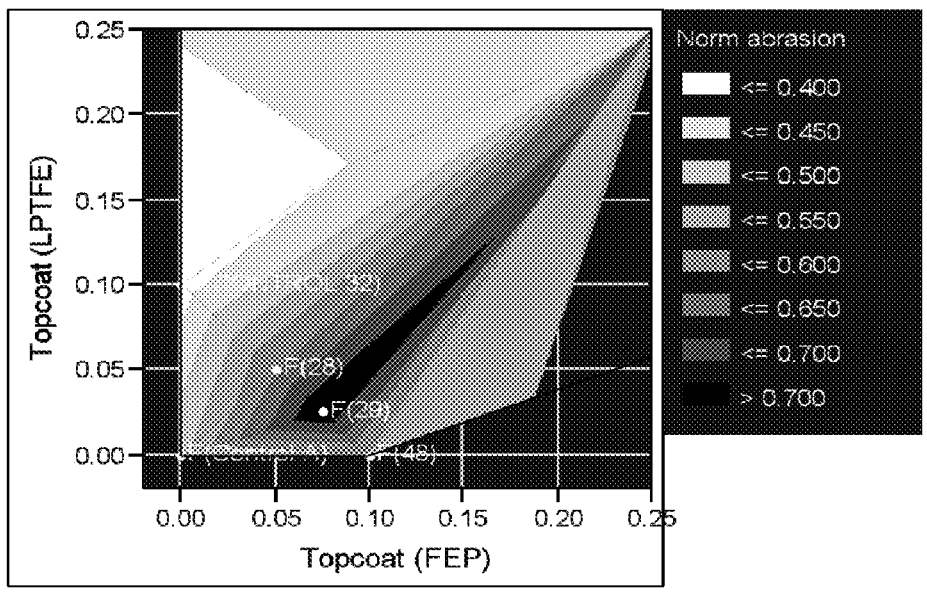
Figure 34:
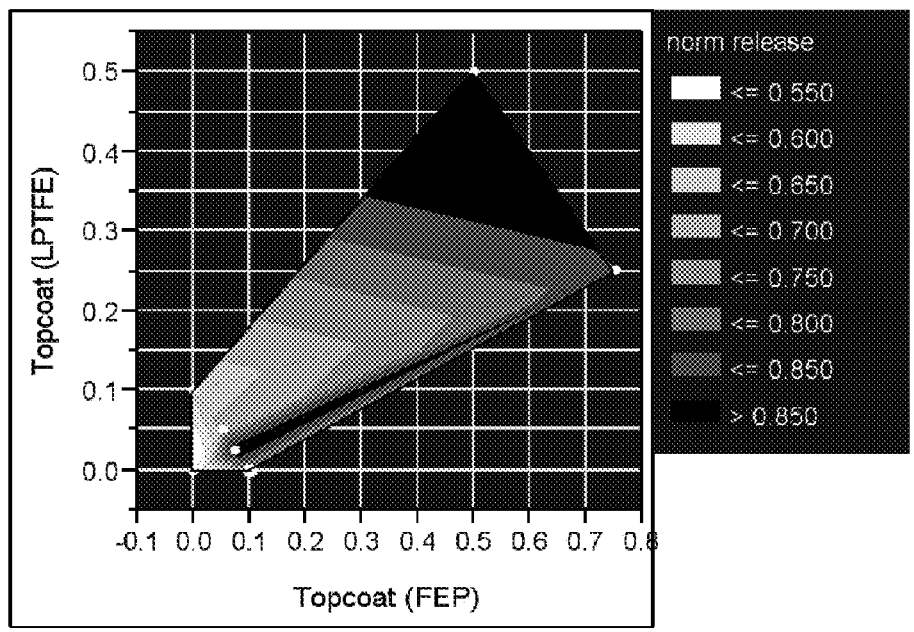
FIG. 34 shows a first contour plot of the normalized results of the cooking release tests (Example 5) plotted against FEP and LPTFE content for the topcoats in the Examples that include FEP, together with a second plot of the HPTFE-rich area of the first plot.
Figure 34:
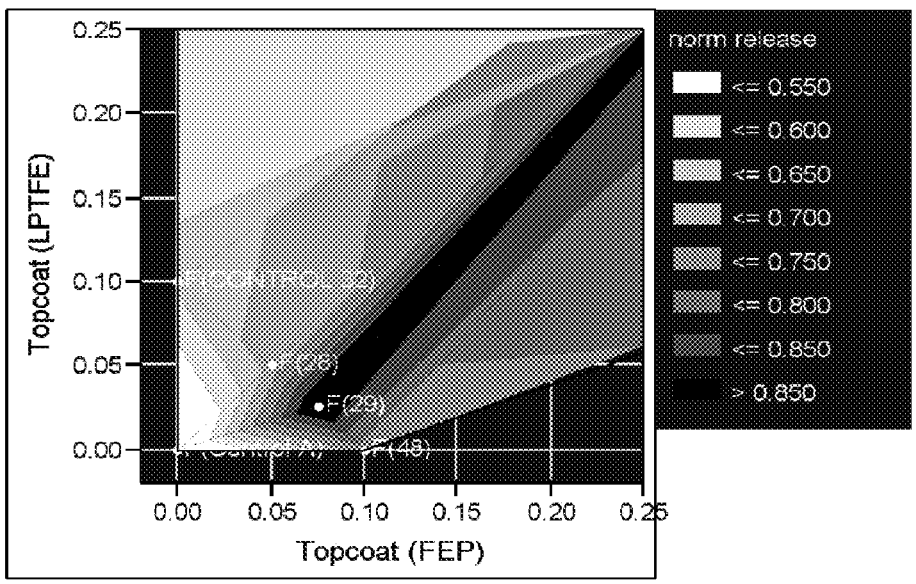
Figure 35:
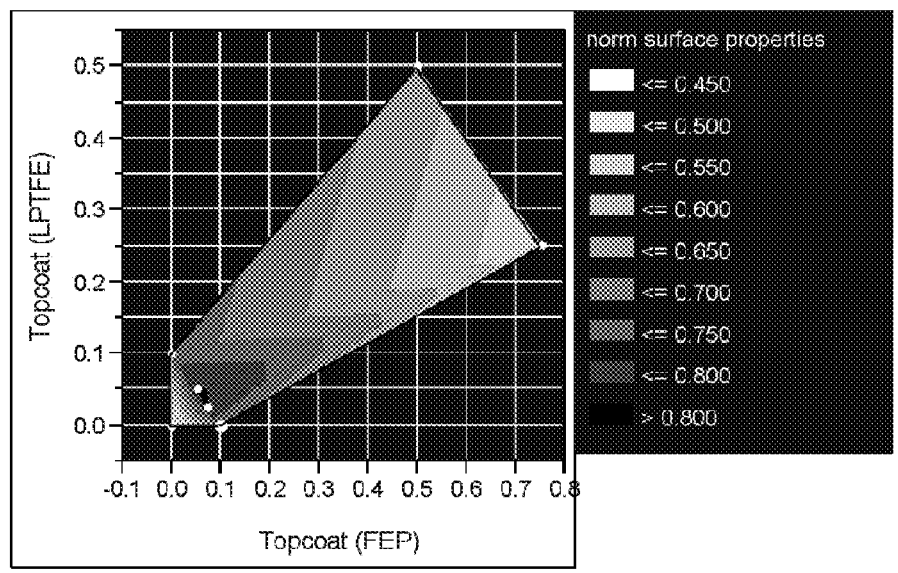
FIG. 35 shows a first contour plot of the normalized results of the roughness, gloss, and contact angle tests (Example 2) plotted against FEP and LPTFE content for the topcoats in the Examples that include FEP, together with a second plot of the HPTFE-rich area of the first plot.
Figure 35:
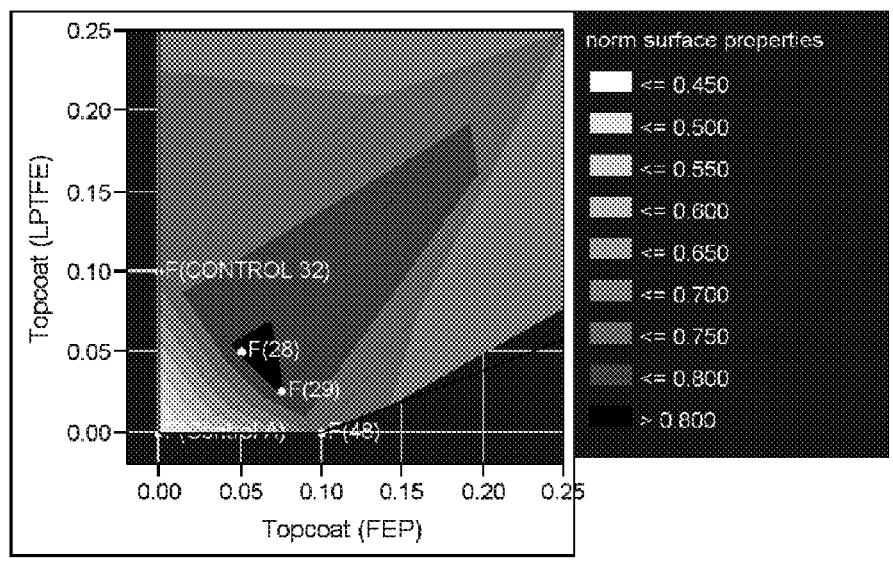
Figure 36:
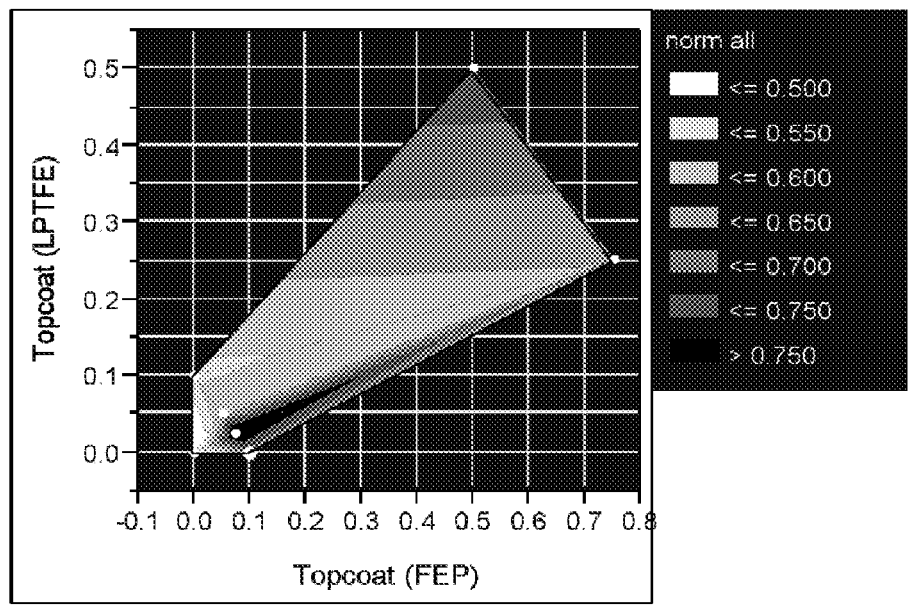
FIG. 36 shows a first contour plot of the normalized results of the RAT and TWI abrasion tests (Examples 3 and 4), the adhesion tests (Example 8), the cooking release tests (Example 5), and the roughness, gloss, and contact angle tests (Example 2) plotted against FEP and LPTFE content for the topcoats in the Examples that include FEP, together with a second plot of the HPTFE-rich area of the first plot.
Figure 36:
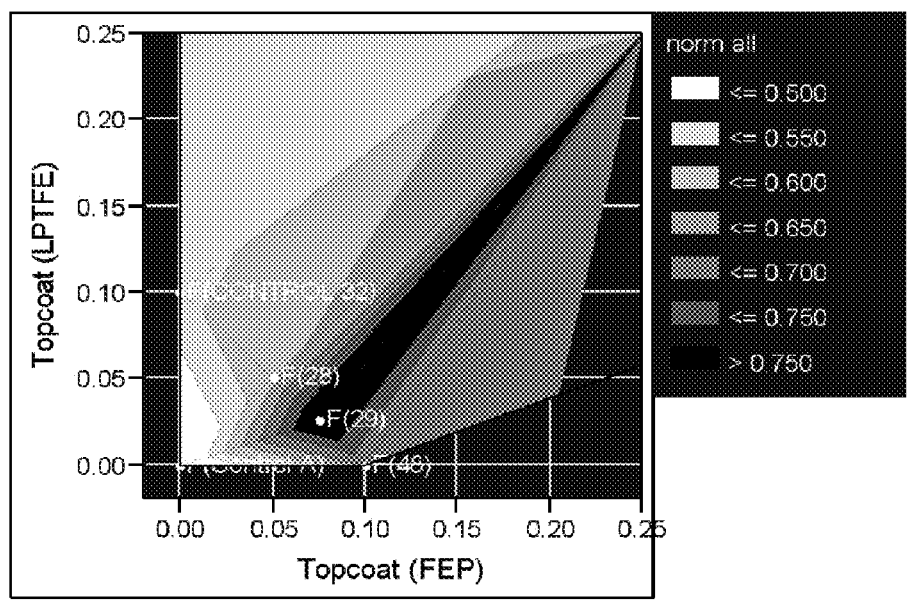
Figure 37:
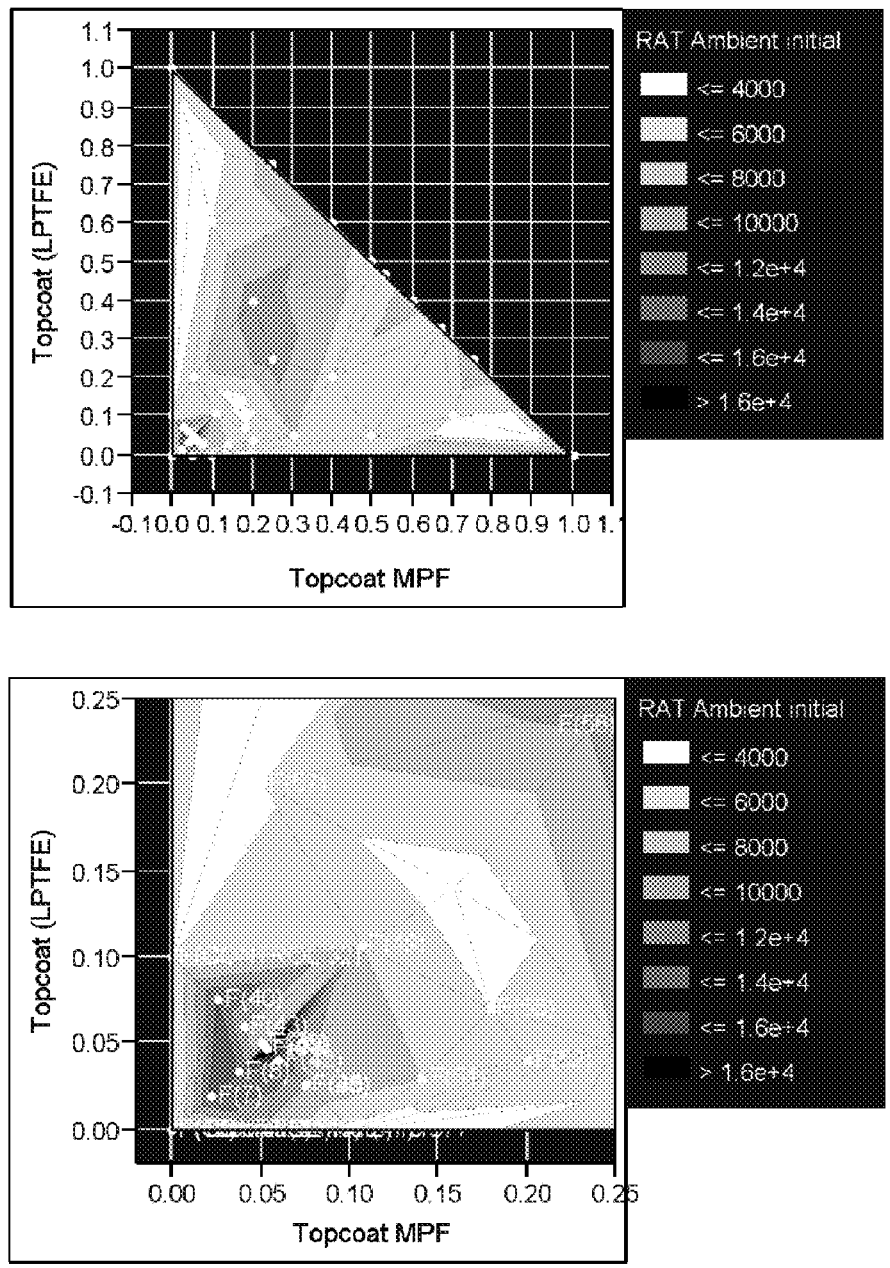
FIG. 37 shows a first contour plot of RAT ambient initial (Example 3) plotted against MPF and LPTFE content for the topcoats in the Examples that include both PFA and FEP (MPF), together with a second plot of the HPTFE-rich area of the first plot.
Figure 38:
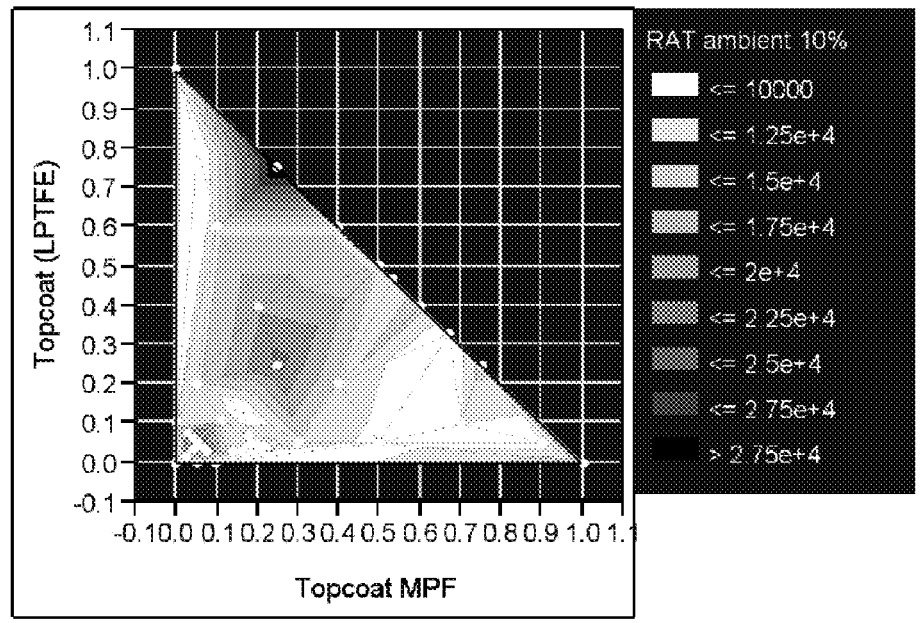
FIG. 38 shows a first contour plot of RAT ambient 10% (Example 3) plotted against MPF and LPTFE content for the topcoats in the Examples that include both PFA and FEP (MPF), together with a second plot of the HPTFE-rich area of the first plot.
Figure 38:
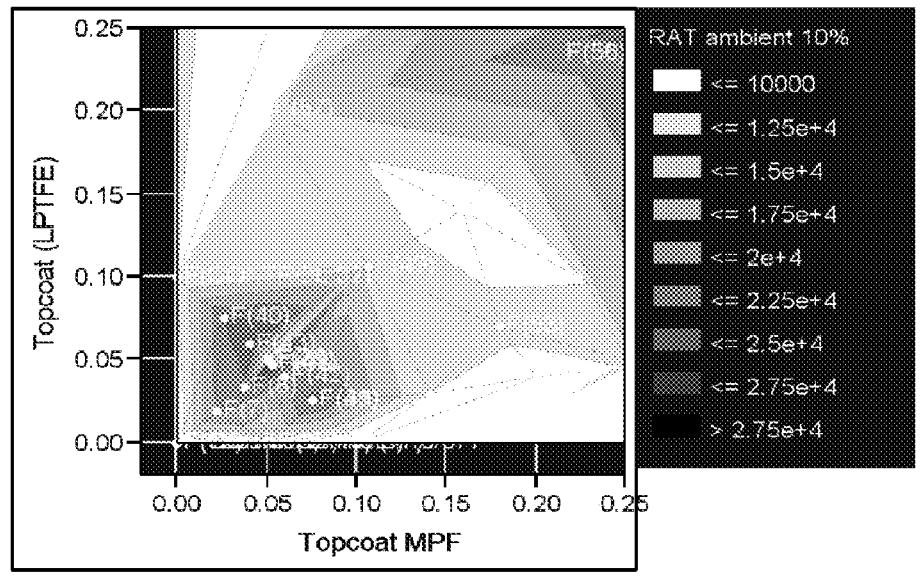
Figure 39:
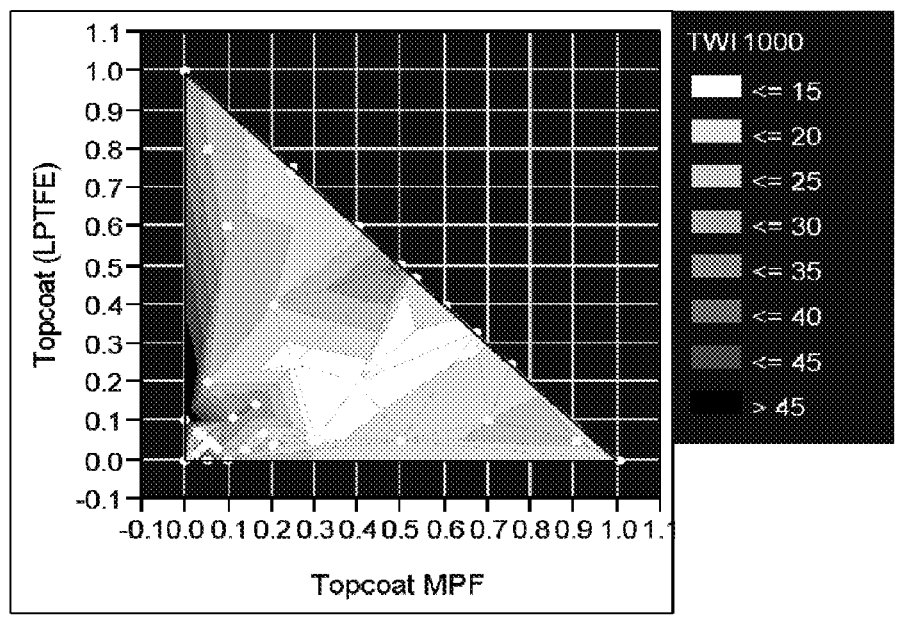
FIG. 39 shows a first contour plot of TWI 1000 (Example 4) plotted against MPF and LPTFE content for the topcoats in the Examples that include both PFA and FEP (MPF), together with a second plot of the HPTFE-rich area of the first plot.
Figure 39:
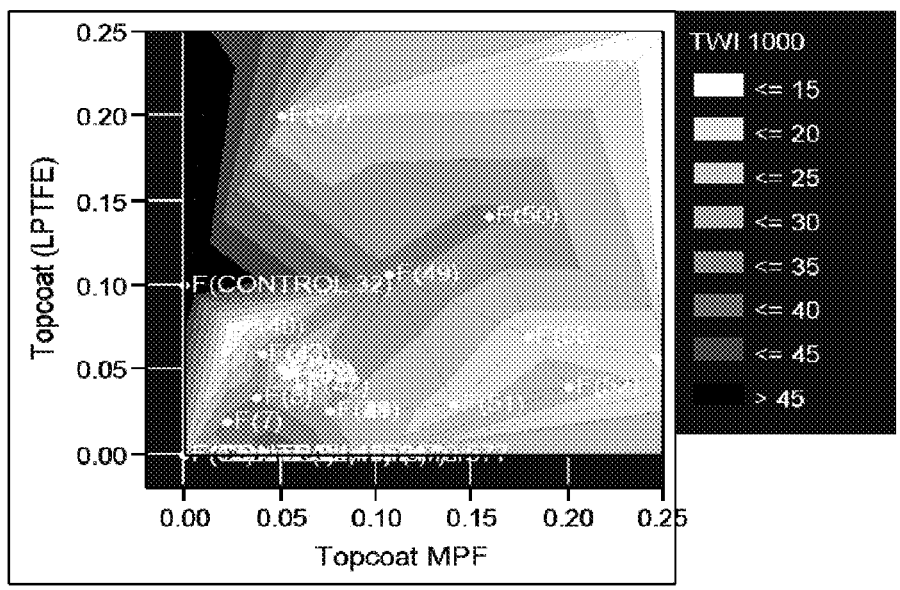
Figure 40:
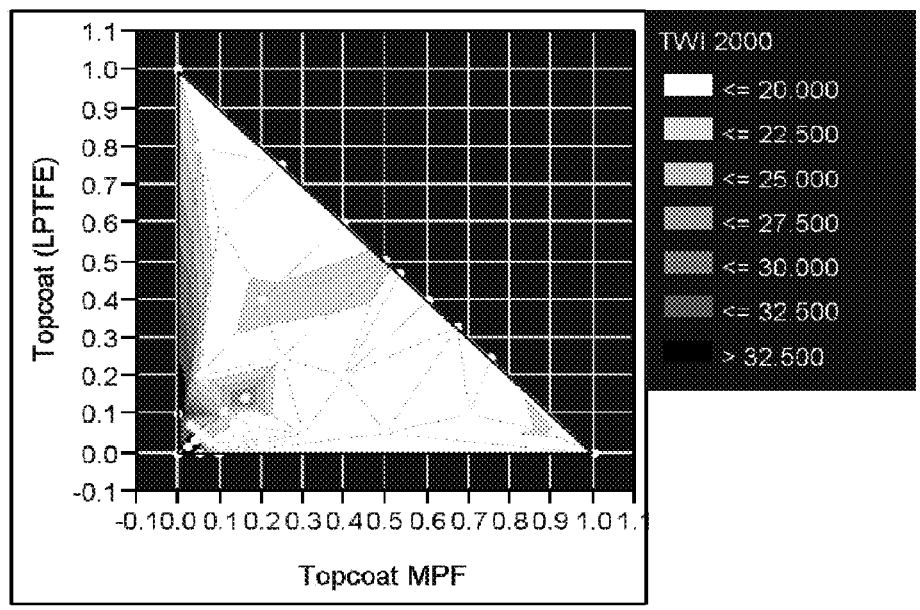
FIG. 40 shows a first contour plot of TWI 2000 (Example 4) plotted against MPF and LPTFE content for the topcoats in the Examples that include both PFA and FEP (MPF), together with a second plot of the HPTFE-rich area of the first plot.
Figure 40:
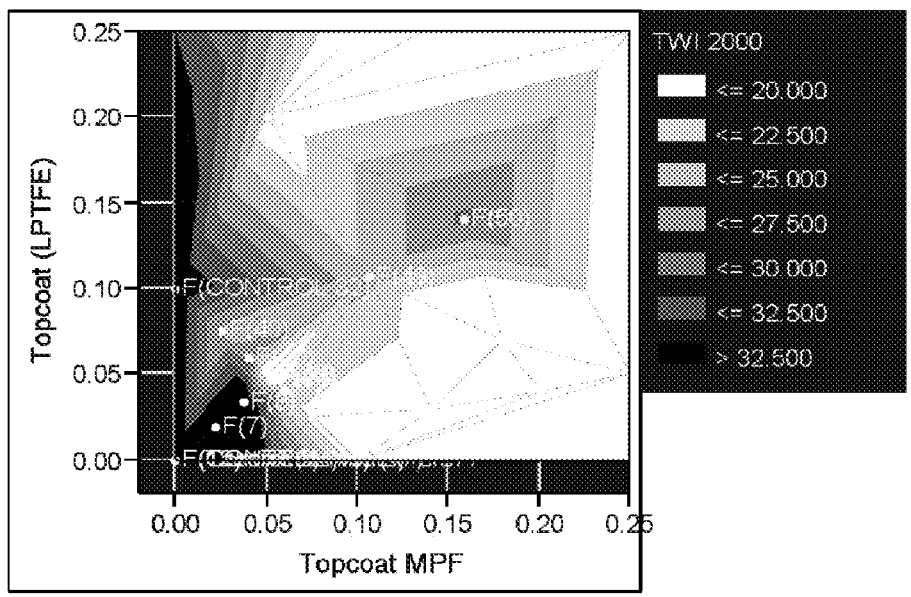
Figure 41:
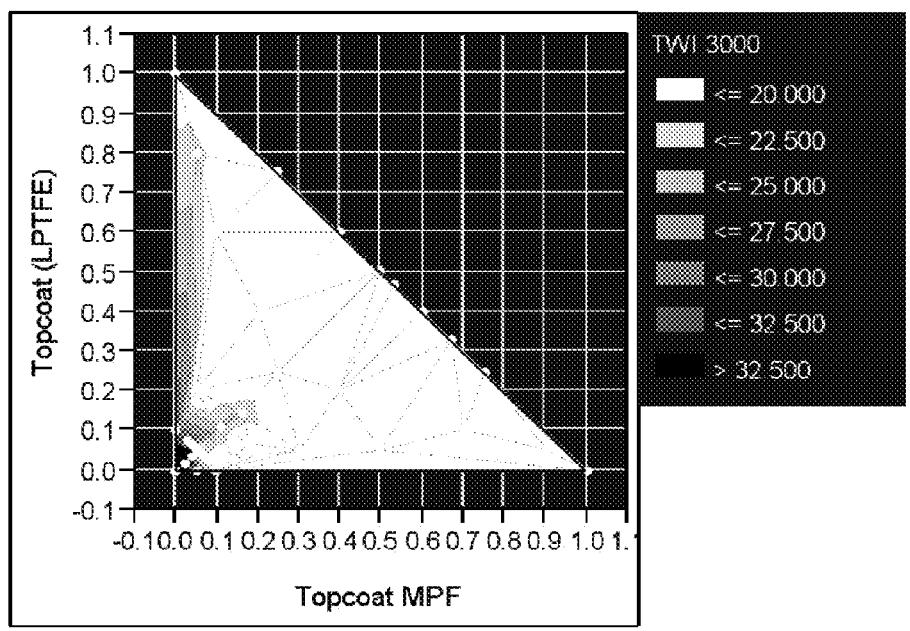
FIG. 41 shows a first contour plot of TWI 3000 (Example 4) plotted against MPF and LPTFE content for the topcoats in the Examples that include both PFA and FEP (MPF), together with a second plot of the HPTFE-rich area of the first plot.
Figure 41:
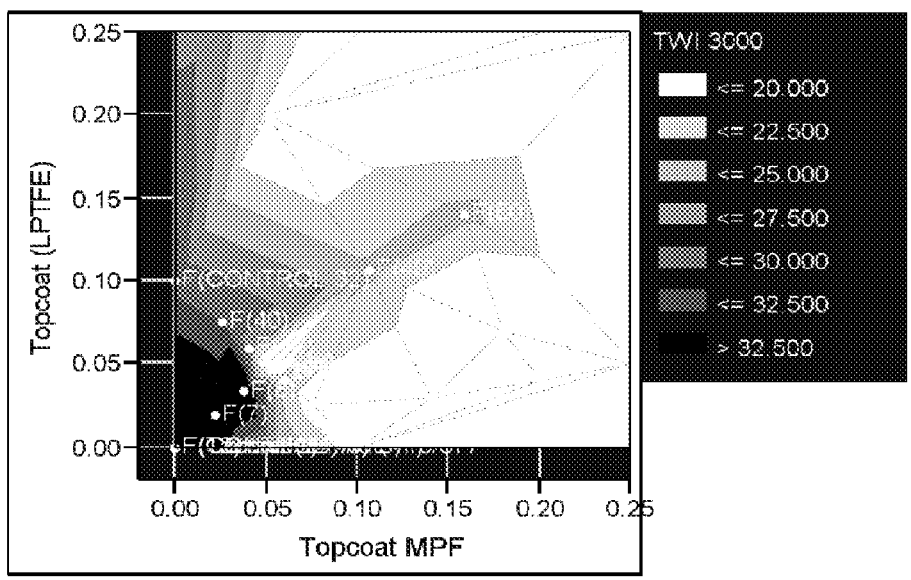
Figure 42:
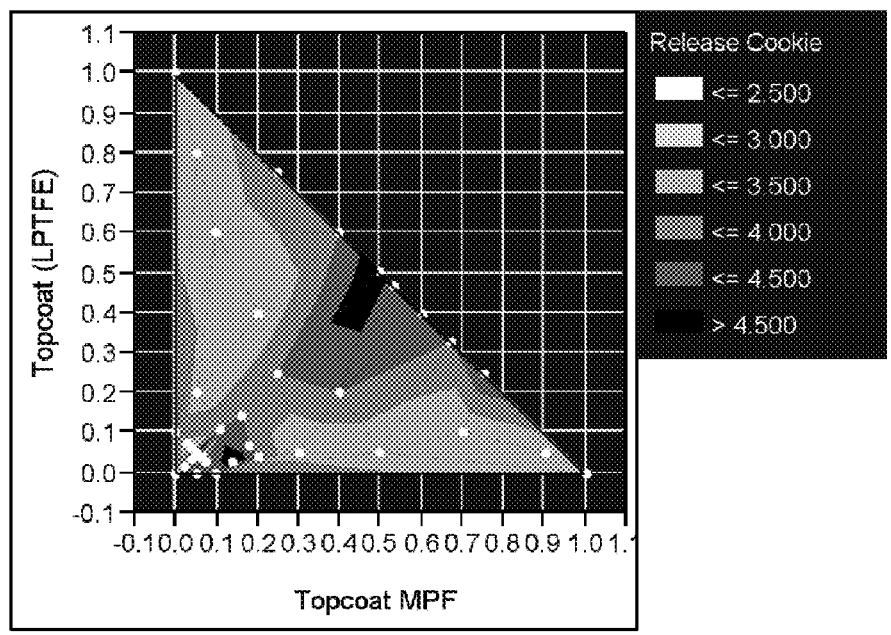
FIG. 42 shows a first contour plot of cookie dough cooking release (Example 5) plotted against MPF and LPTFE content for the topcoats in the Examples that include both PFA and FEP (MPF), together with a second plot of the HPTFE-rich area of the first plot.
Figure 42:
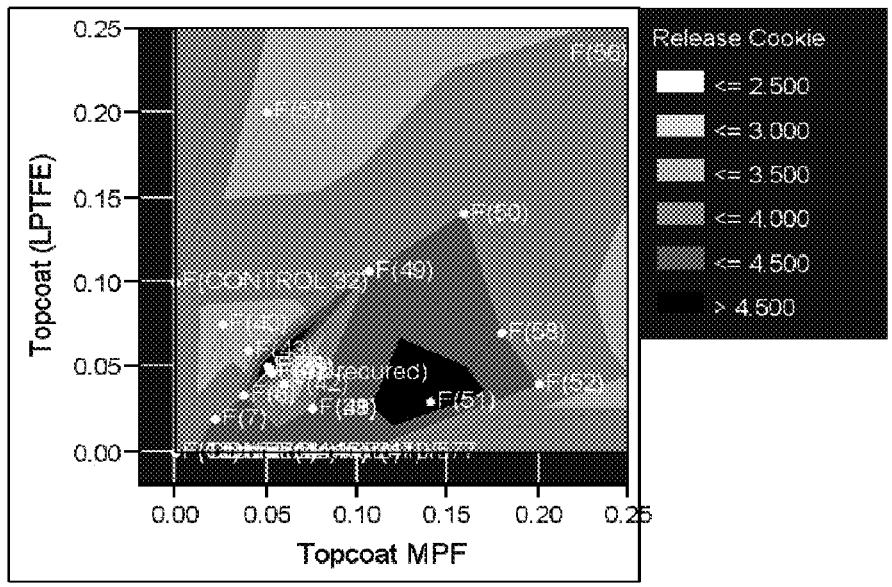
Figure 43:
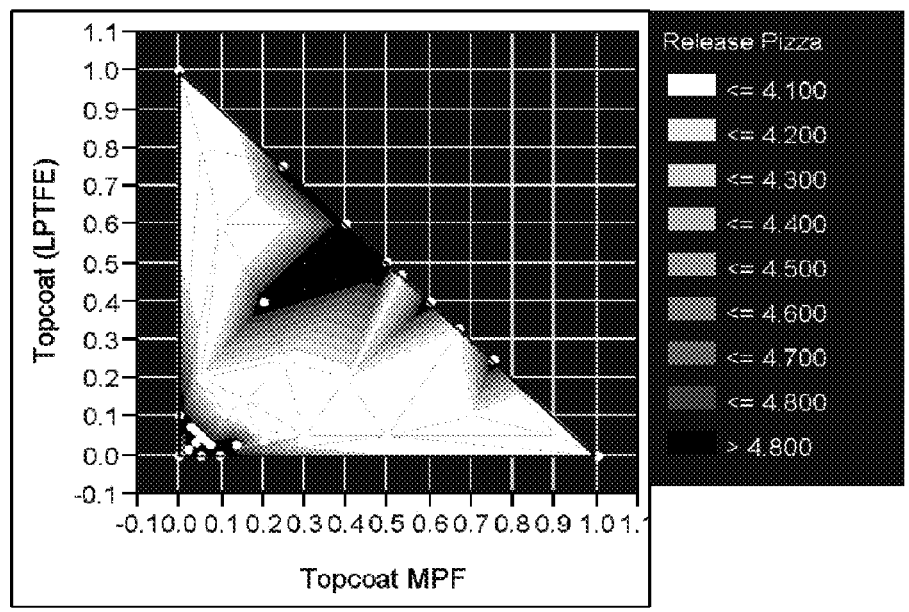
FIG. 43 shows a first contour plot of pizza dough cooking release (Example 5) plotted against MPF and LPTFE content for the topcoats in the Examples that include both PFA and FEP (MPF), together with a second plot of the HPTFE-rich area of the first plot.
Figure 43:
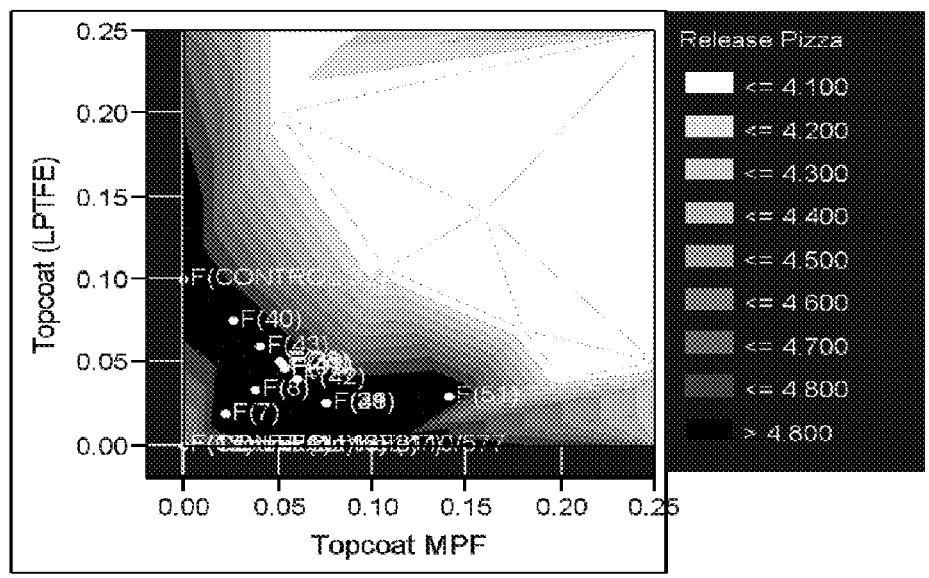
Figure 44:
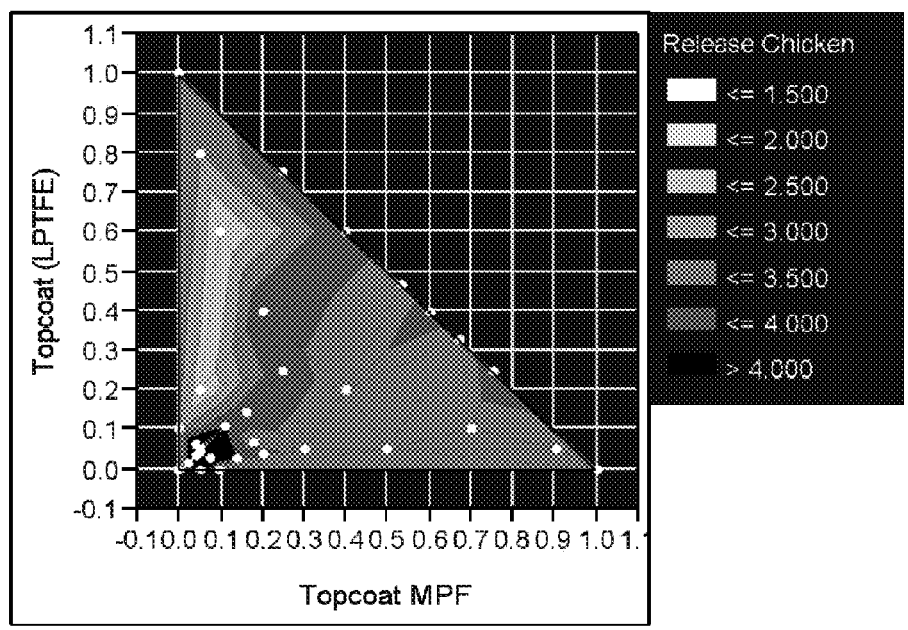
FIG. 44 shows a first contour plot of chicken cooking release (Example 5) plotted against MPF and LPTFE content for the topcoats in the Examples that include both PFA and FEP (MPF), together with a second plot of the HPTFE-rich area of the first plot.
Figure 44:
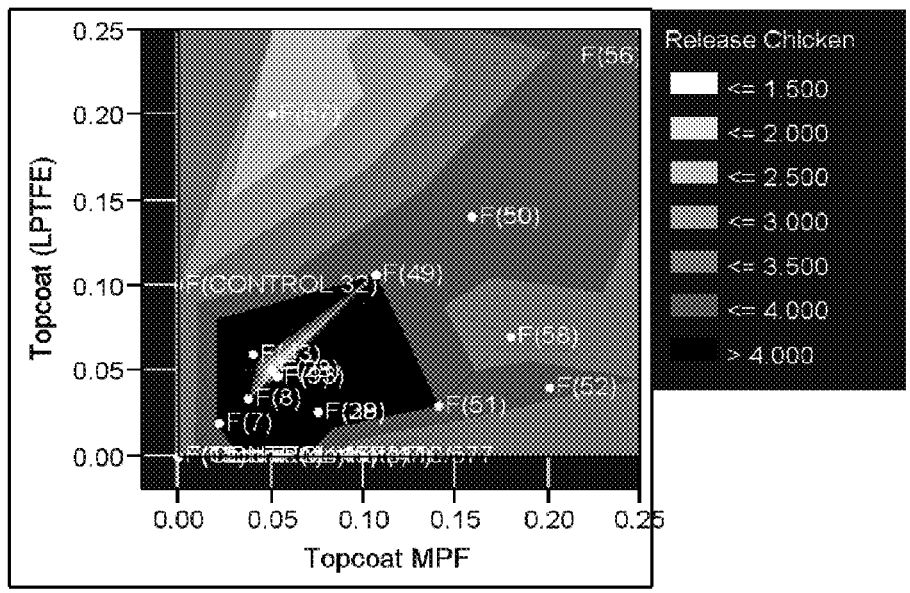
Figure 45:
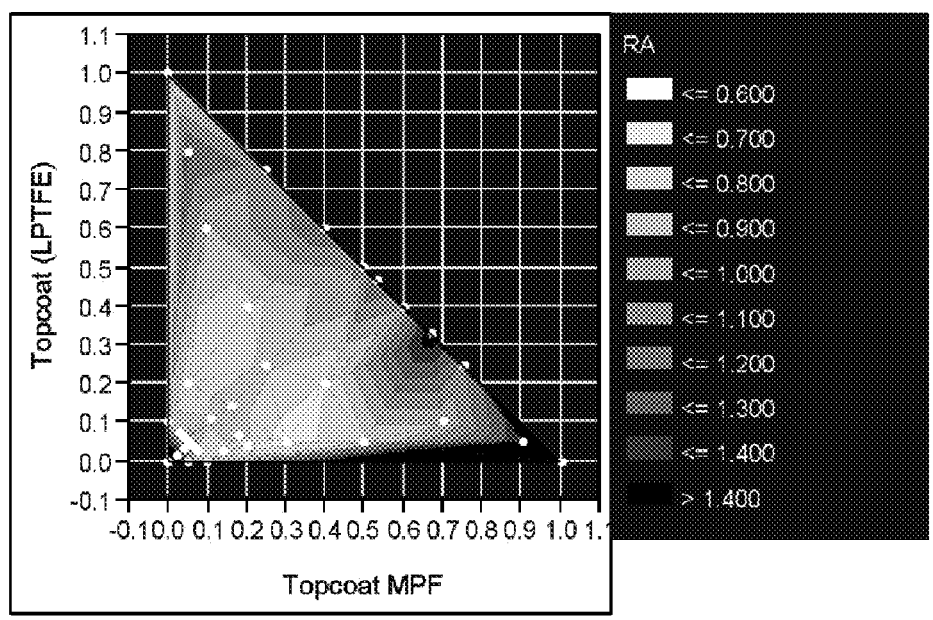
FIG. 45 shows a first contour plot of roughness (Example 2) plotted against MPF and LPTFE content for the topcoats in the Examples that include both PFA and FEP (MPF), together with a second plot of the HPTFE-rich area of the first plot.
Figure 45:
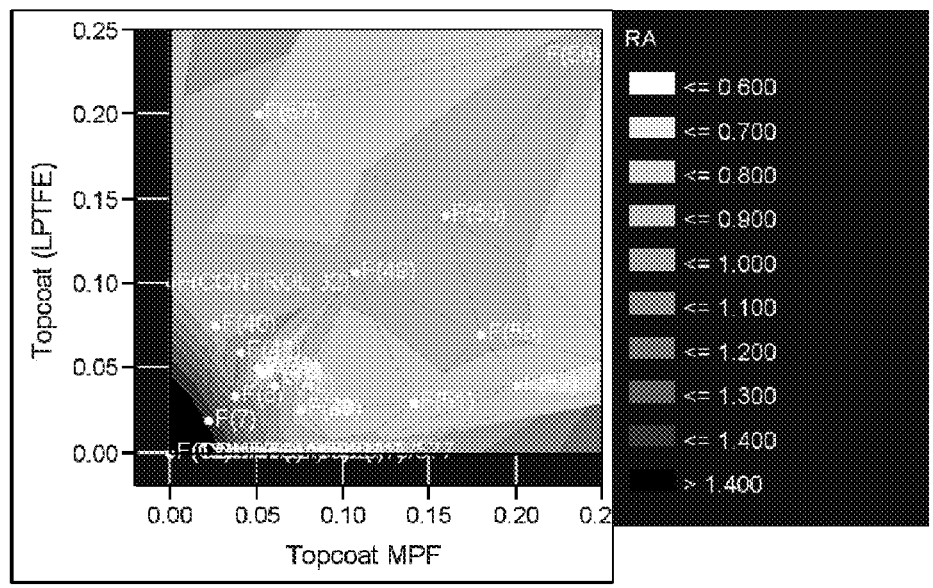
Figure 46:
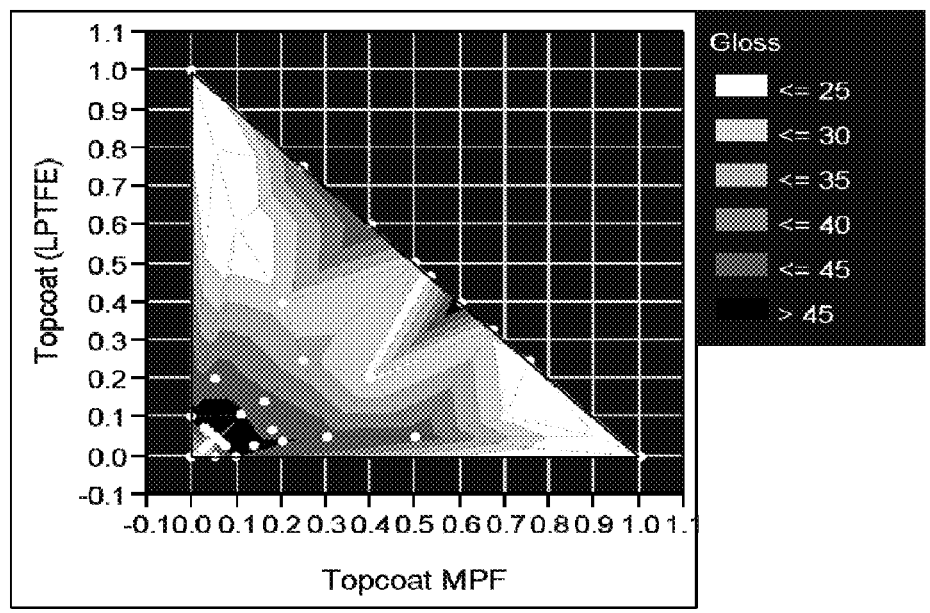
FIG. 46 shows a first contour plot of gloss (Example 2) plotted against MPF and LPTFE content for the topcoats in the Examples that include both PFA and FEP (MPF), together with a second plot of the HPTFE-rich area of the first plot.
Figure 46:
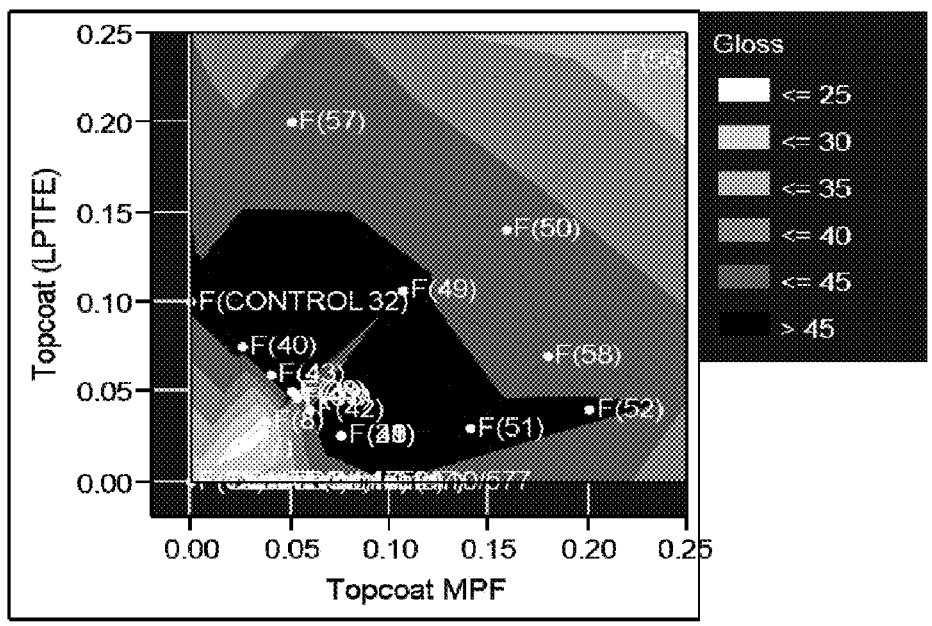
Figure 47:
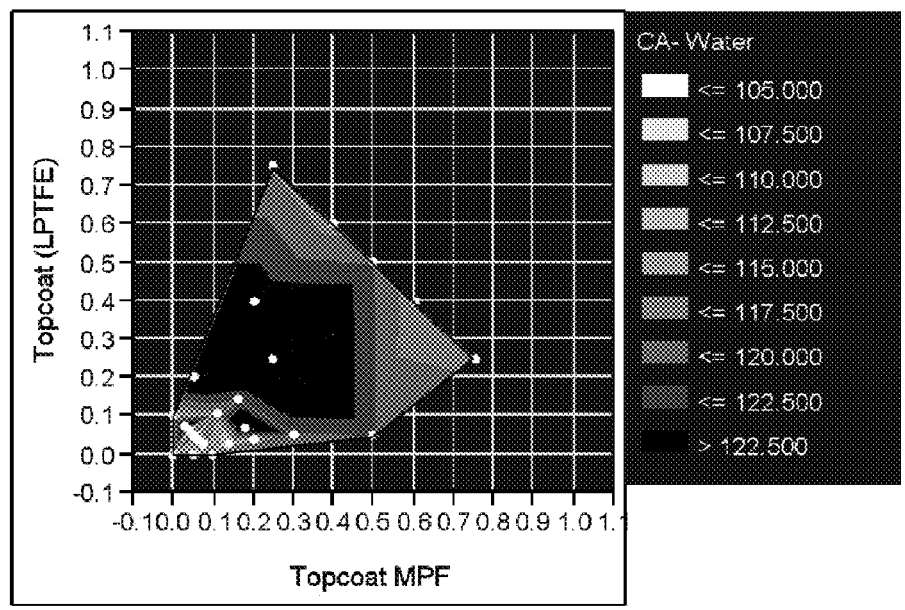
FIG. 47 shows a first contour plot of contact angle (Example 2) plotted against MPF and LPTFE content for the topcoats in the Examples that include both PFA and FEP (MPF), together with a second plot of the HPTFE-rich area of the first plot.
Figure 47:
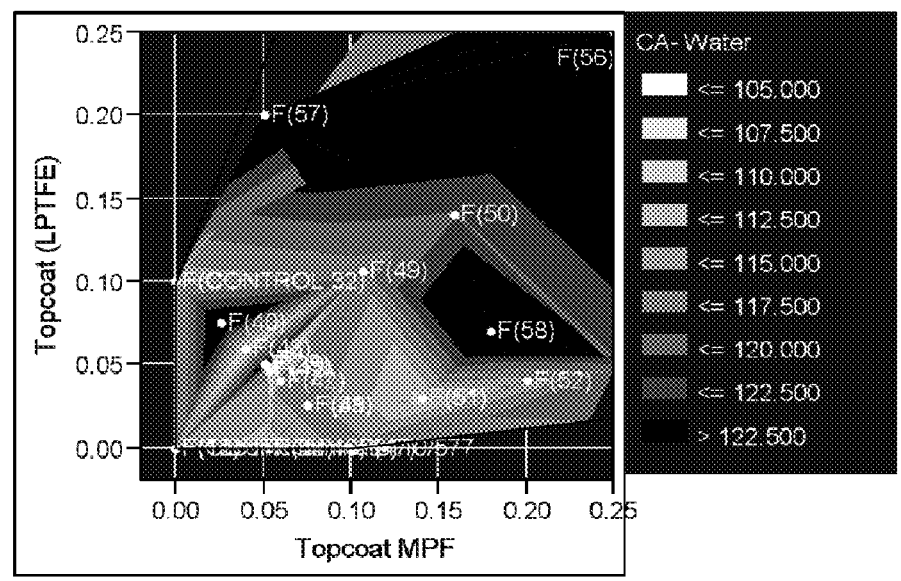
Figure 48:
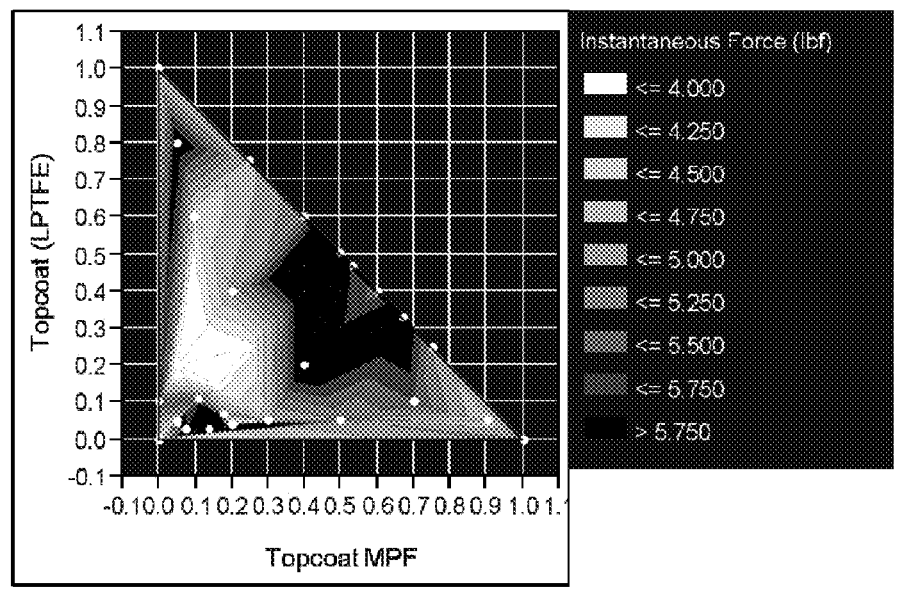
FIG. 48 shows a first contour plot of instantaneous force (Example 8) plotted against MPF and LPTFE content for the topcoats in the Examples that include both PFA and FEP (MPF), together with a second plot of the HPTFE-rich area of the first plot.
Figure 48:
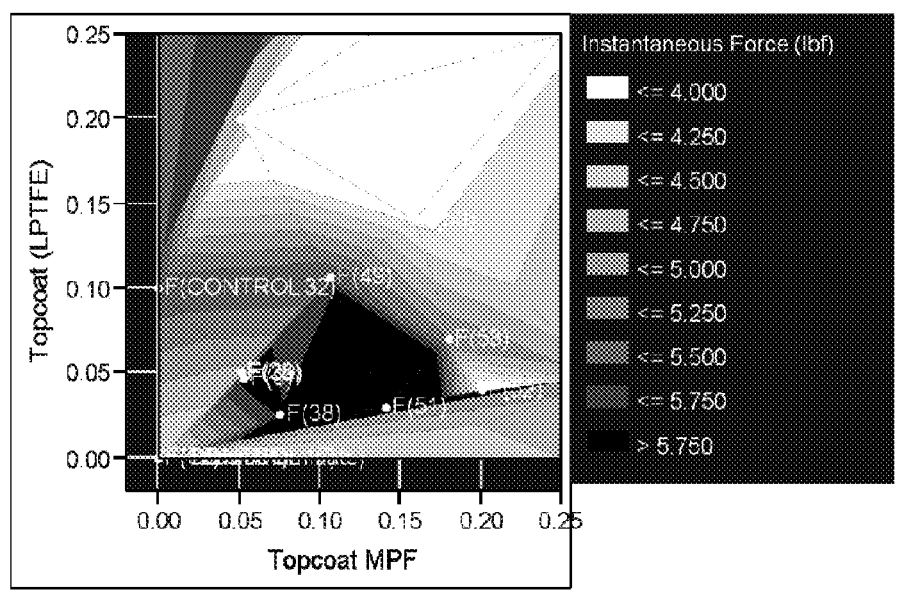
Figure 49:
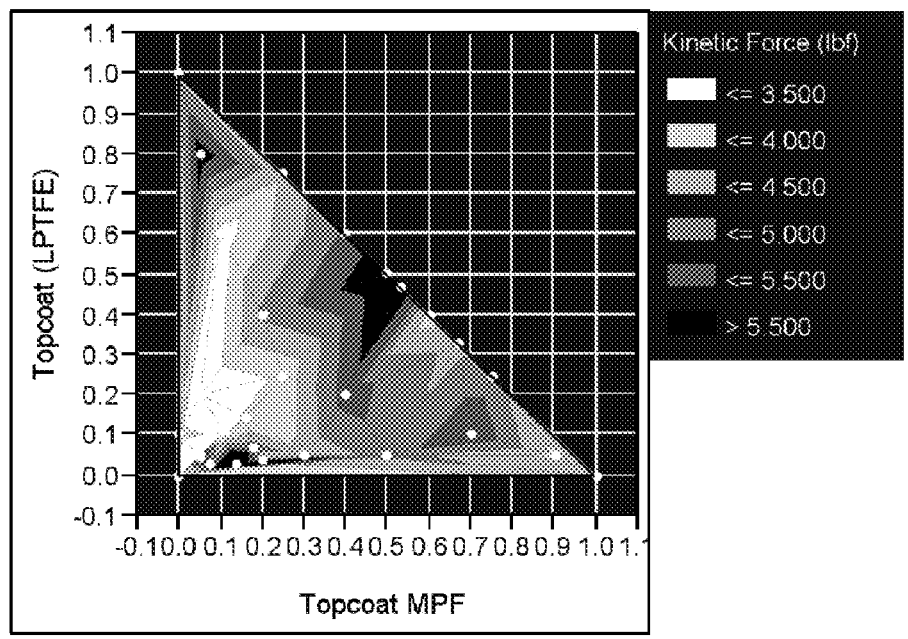
FIG. 49 shows a first contour plot of kinetic force (Example 8) plotted against MPF and LPTFE content for the topcoats in the Examples that include both PFA and FEP (MPF), together with a second plot of the HPTFE-rich area of the first plot.
Figure 49:
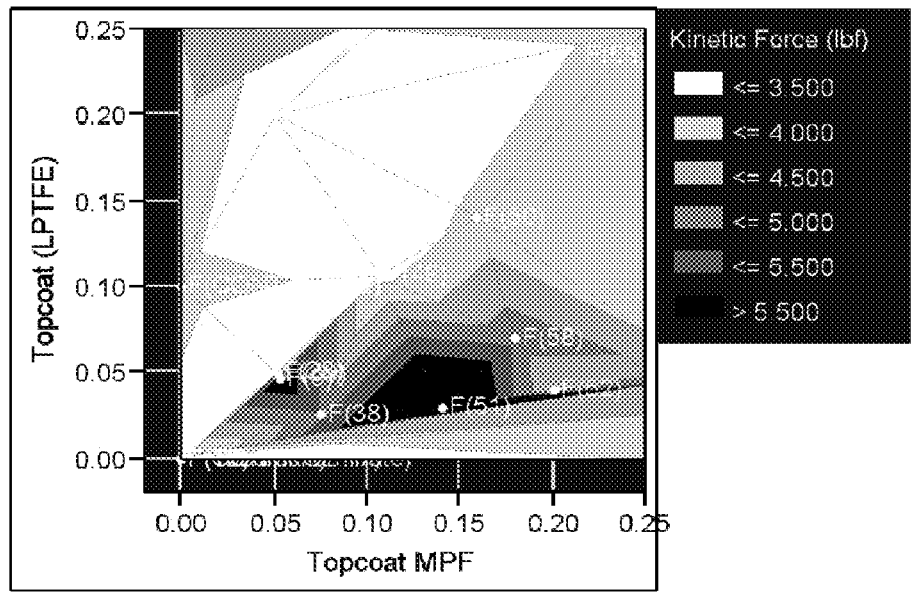
Figure 50:
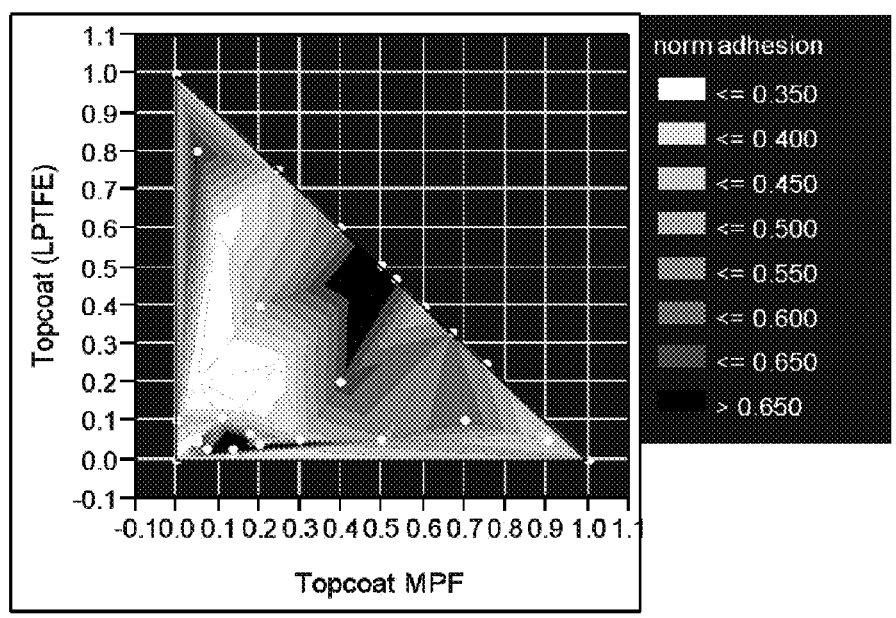
FIG. 50 shows a first contour plot of the normalized results of the adhesion tests (Example 8) plotted against MPF and LPTFE content for the topcoats in the Examples that include both PFA and FEP (MPF), together with a second plot of the HPTFE-rich area of the first plot.
Figure 50:
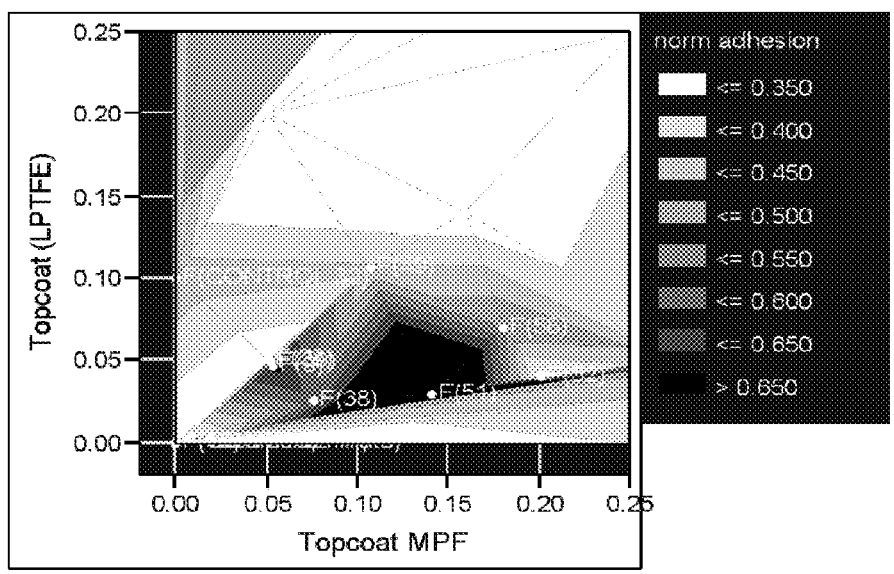
Figure 51:
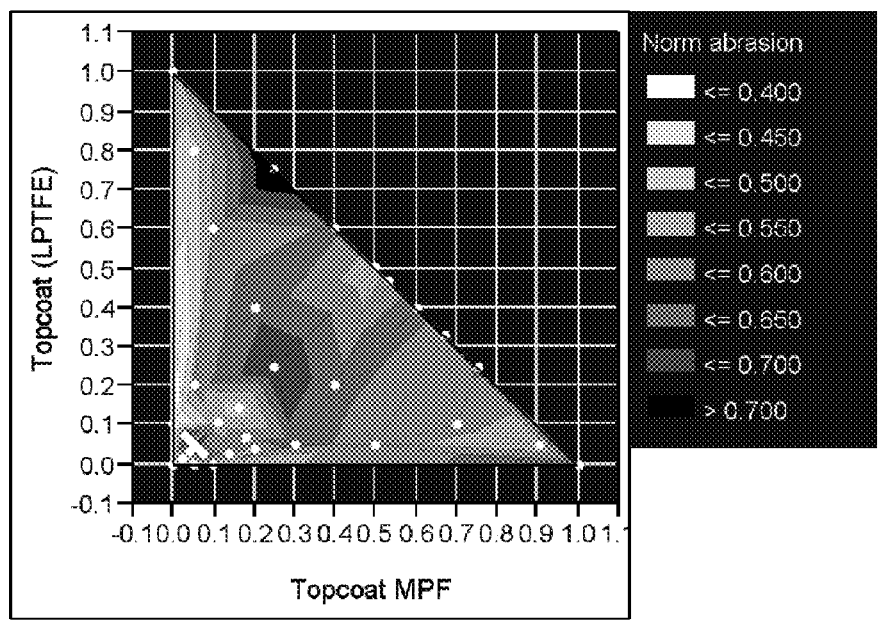
FIG. 51 shows a first contour plot of the normalized results of the RAT and TWI abrasion tests (Examples 3 and 4) plotted against MPF and LPTFE content for the topcoats in the Examples that include both PFA and FEP (MPF), together with a second plot of the HPTFE-rich area of the first plot.
Figure 51:
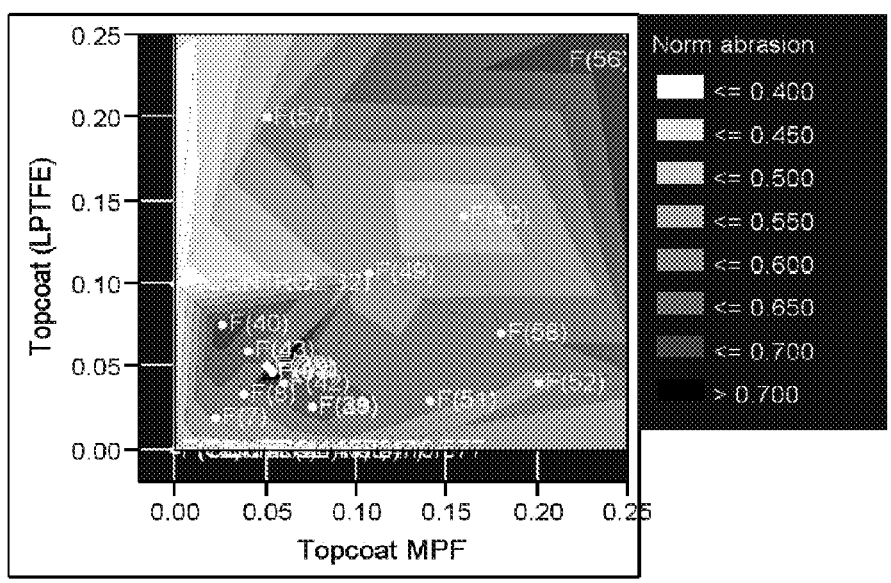
Figure 52:
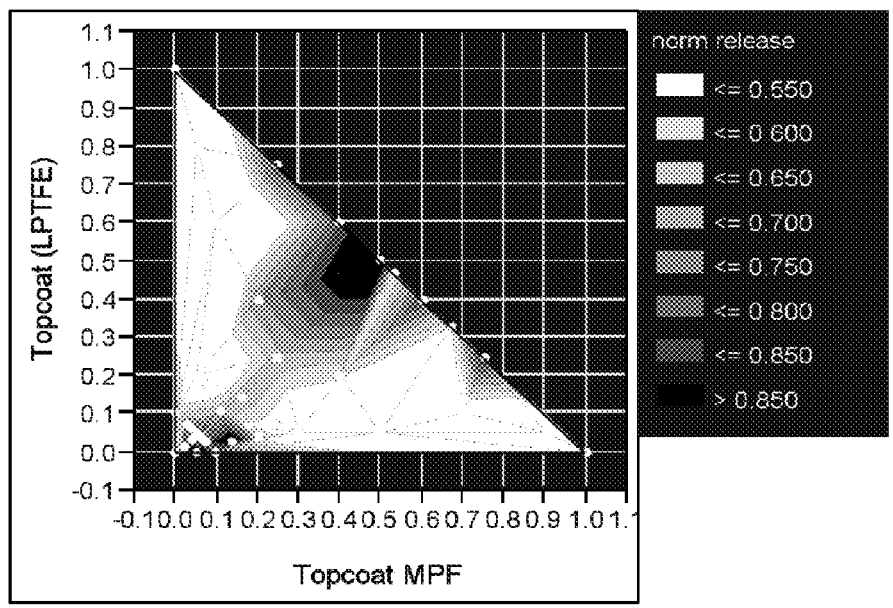
FIG. 52 shows a first contour plot of the normalized results of the cooking release tests (Example 5) plotted against MPF and LPTFE content for the topcoats in the Examples that include both PFA and FEP (MPF), together with a second plot of the HPTFE-rich area of the first plot.
Figure 52:
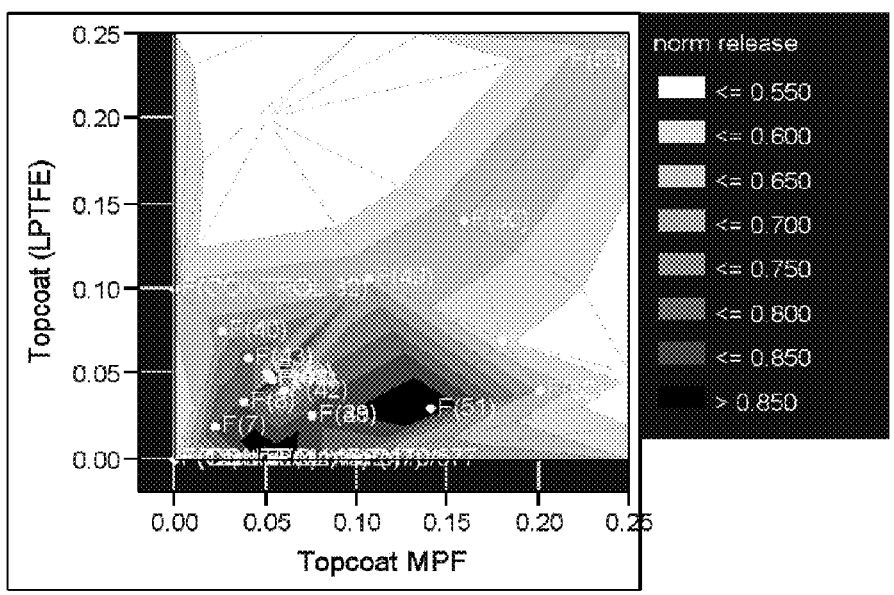
Figure 53:
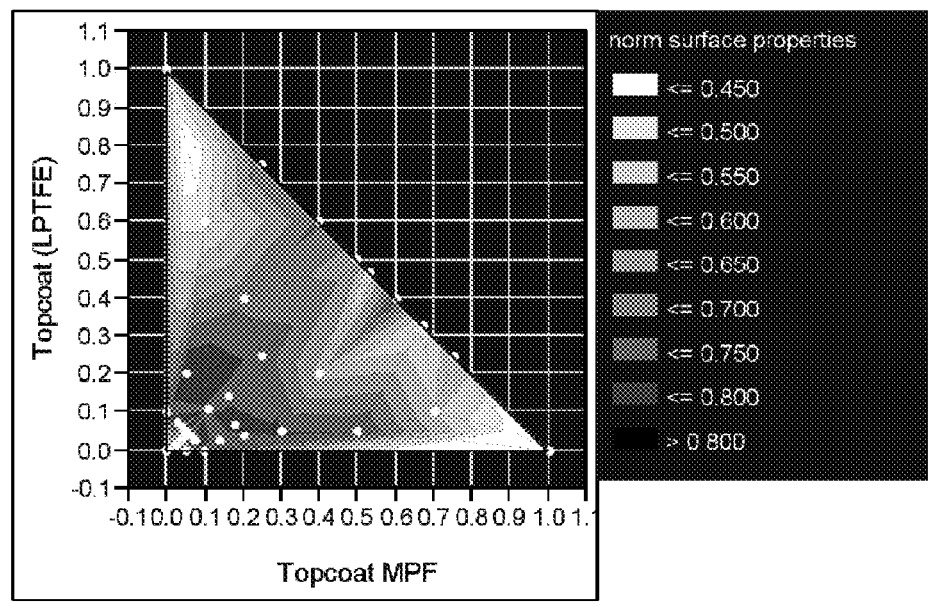
FIG. 53 shows a first contour plot of the normalized results of the roughness, gloss, and contact angle tests (Example 2) plotted against MPF and LPTFE content for the topcoats in the Examples that include both PFA and FEP (MPF), together with a second plot of the HPTFE-rich area of the first plot.
Figure 53:
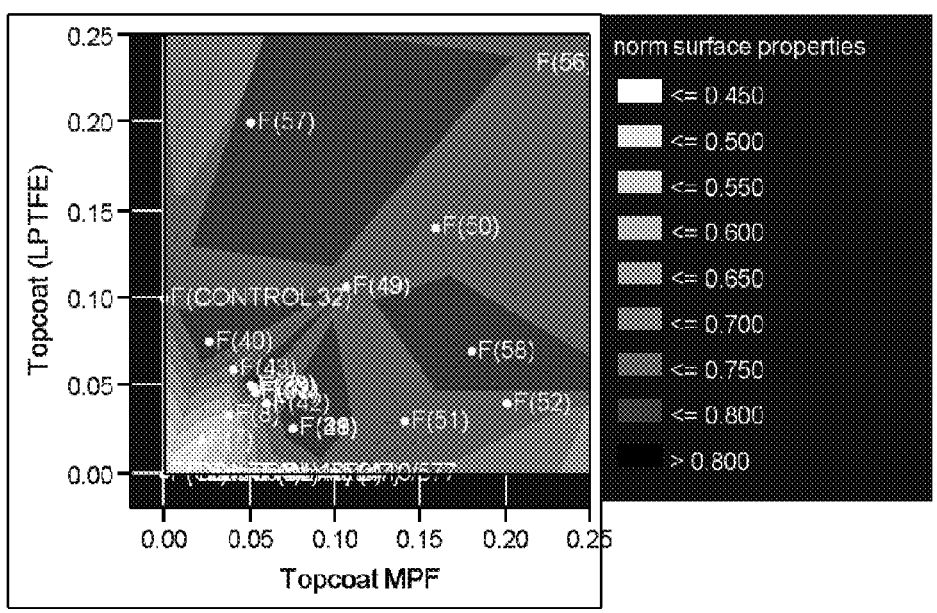
Figure 54:
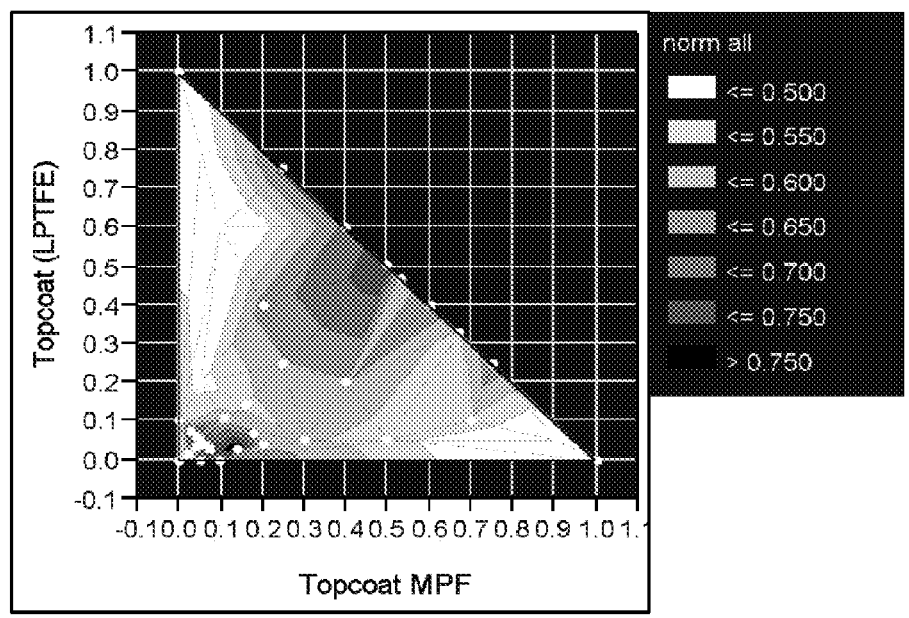
FIG. 54 shows a first contour plot of the normalized results of the RAT and TWI abrasion tests (Examples 3 and 4), the adhesion tests (Example 8), the cooking release tests (Example 5), and the roughness, gloss, and contact angle tests (Example 2) plotted against MPF and LPTFE content for the topcoats in the Examples that include both PFA and FEP (MPF), together with a second plot of the HPTFE-rich area of the first plot.
Figure 54:
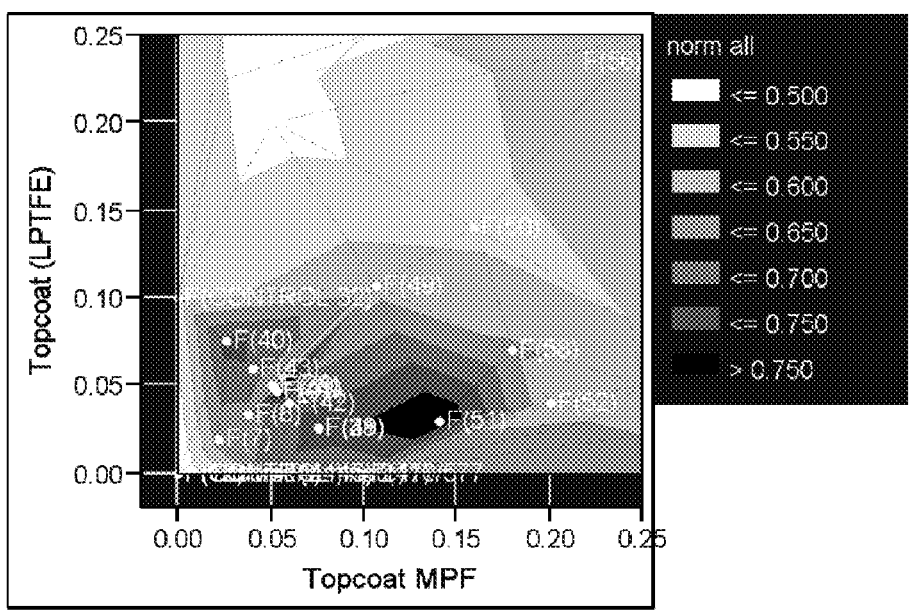

In FIGS. 15, 33, and 51, the results of the abrasion tests of Examples 3 and 4 are normalized. In FIGS. 16, 34, and 52, the results of the cooking release tests of Example 5 are normalized. In FIGS. 17, 35, and 53, the results of the surface property tests (Contact Angle Gloss and Roughness) of Example 2 are normalized. In FIGS. 18, 36, and 54, the results of the abrasion tests of Examples 3 and 4, the cooking release tests of Example 5, and the roughness, contact angle and gloss tests of Example 2 are normalized.

From an examination of FIG. 18 it can be seen that optimal properties overall are generally obtained for the HPTFE+HPTFE+HPTFE,PFA,LPTFE system. Particularly good properties are obtained when [PFA] is in the range 2-25 wt. % and [LPTFE] is in the range 2-14 wt. % i.e. the ratio of PFA:LPTFE is in the range 12.5:1 to 1:7. Superior overall properties being obtained in the region where [PFA]=4-18 wt. % and [LPTFE]=1-7 wt. %. This is also confirmed in the data of FIG. 54 which includes all FEP and PFA examples examined. From an examination of FIG. 36 it can be seen that optimal properties overall are generally obtained for the HPTFE+HPTFE+HPTFE,FEP,LPTFE system when [FEP] is in the range 1-6 wt. % and [LPTFE] is in the range 3-7 wt. %.

By examination of FIG. 54 which is the normalized plot of all of the data it is apparent that enhanced properties for the HPTFE, MPF, LPTFE topcoat can be obtained over a range of compositions and in particular with [LPTFE] ranging from 2-15 wt. % and [MPF] ranging from 2-30 wt. % or higher. Also a further region where [LPTFE] ranges from 15-90 wt. % or higher and [MPF] can range from 15-85 wt. % or higher shows enhanced properties compared to unblended HPTFE or LPTFE or MPF.

In general, as can be seen from an examination of FIGS. 1-54, blends of these three types of polymers (HPTFE, LPTFE and MPF) exhibit enhanced properties over a broad range of composition and optimum formulations will depend on the precise nature of the duty required of these blends.

For example, more detailed examination of the abrasion test data indicate that the best RAT performance is found for samples with [MPF] or [PFA] or [FEP] in the range 2-6 wt. % and [LPTFE]-4-8 wt. % however Taber wear testing yields a slightly different optimum range where [MPF] or [PFA] or [FEP] is 5-30 wt. % or higher and [LPTFE] is in the range 2-10 wt. % or higher. Such differences indicate that the nature of mechanical abuse given to the system will determine which formulation might be expected to perform best.

It will be clear to those skilled in the art that the precise formulation most suitable to the duty for which the blend is being utilized can be determined by consideration of the regions of optimal properties shown in FIGS. 1-54.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A coated flexible substrate, comprising:
   a flexible substrate;
   a coating on said flexible substrate, comprising:
      at least one fluoropolymer including high molecular weight polytetrafluoroethylene (HPTFE) having a number average molecular weight ($M_n$) of at least 500,000 and present in an amount of between 70 wt. % and 98 wt. % based on the total solids weight of all fluoropolymers in said coating;
      at least one low molecular weight polytetrafluoroethylene (LPTFE) having a number average molecular weight ($M_n$) of less than 500,000 and present in an amount of between 1 wt. % and 30 wt. % based on the total weight of all fluoropolymers in said coating; and
      at least one melt-processible fluoropolymer present in an amount of between 1 wt. % and 30 wt. % based on the total weight of all fluoropolymers in said coating;
   said at least one melt-processible fluoropolymer (MPF) comprises perfluoroalkoxy (PFA), said at least one low molecular weight polytetrafluoroethylene (LPTFE) is present in an amount between 45 wt. % and 55 wt. % and said PFA is present in an amount of between 45 wt. % and 55 wt. % based on the total solids weight of said at least one LPTFE and said PFA; and
   said at least one high molecular weight polytetrafluoroethylene (HPTFE) includes a modifying co-monomer in an amount less than 1 wt. % based on the weight of said high molecular weight polytetrafluoroethylene (HPTFE).

2. The coated flexible substrate of claim 1, wherein said at least one low molecular weight polytetrafluoroethylene (LPTFE) is present in an amount of between 5 wt. % and 15 wt. %, and said at least one melt-processible fluoropolymer present in an amount of between 5 wt. % and 15 wt. %, based on the total weight of all fluoropolymers in said coating.

3. The coated flexible substrate of claim 1, wherein said at least one high molecular weight polytetrafluoroethylene (HPTFE) is present in an amount of between 85 wt. % and 95 wt. %, and said at least one low molecular weight polytetrafluoroethylene (LPTFE) and said at least one melt-processible fluoropolymer (MPF) are together present in an amount of between 5 wt. % and 15 wt. %, based on the total solids weight of all fluoropolymers in said coating.

4. The coated flexible substrate of claim 3, wherein said at least one high molecular weight polytetrafluoroethylene (HPTFE) is present in an amount of between 90 wt. % and 95 wt. %, and said at least one low molecular weight polytetrafluoroethylene (LPTFE) and said at least one melt-processible fluoropolymer (MPF) are together present in an amount of between 5 wt. % and 10 wt. %, based on the total solids weight of all fluoropolymers in said coating.

5. The coated flexible substrate of claim 1, wherein said modifying co-monomer is perfluoropropylvinyl ether (PPVE).

6. The coated flexible substrate of claim 1, wherein said modifying co-monomer is a perfluoroalkylvinyl ether.

7. The coated flexible substrate of claim 1, wherein said coating has a contact angle of at least 110°.

8. The coated flexible substrate of claim 7, wherein said coating has a contact angle of at least 120°.

9. The coated flexible substrate of claim 1, wherein said coating has a measured gloss of at least 25% reflectance at 60°.

10. The coated flexible substrate of claim 1, wherein said coating has a surface roughness ($R_a$) of less than 100 nm.

11. The coated flexible substrate of claim 1, wherein said low molecular weight polytetrafluoroethylene (LPTFE) is obtained via emulsion polymerization without being subjected to agglomeration, thermal degradation, or irradiation.

* * * * *